(12) United States Patent
Ikeda et al.

(10) Patent No.: US 11,239,273 B2
(45) Date of Patent: Feb. 1, 2022

(54) IMAGING DEVICE AND ELECTRONIC DEVICE

(71) Applicant: SEMICONDUCTOR ENERGY LABORATORY CO., LTD., Atsugi (JP)

(72) Inventors: Takayuki Ikeda, Kanagawa (JP); Naoto Kusumoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/157,152

(22) Filed: Jan. 25, 2021

(65) Prior Publication Data

US 2021/0143203 A1    May 13, 2021

Related U.S. Application Data

(60) Continuation of application No. 16/541,292, filed on Aug. 15, 2019, now Pat. No. 10,910,427, which is a (Continued)

(30) Foreign Application Priority Data

Dec. 28, 2015 (JP) .................. 2015-256138
Sep. 2, 2016 (JP) .................. 2016-171454

(51) Int. Cl.
*H01L 27/146* (2006.01)
*H01L 27/12* (2006.01)
(Continued)

(52) U.S. Cl.
CPC .... *H01L 27/14634* (2013.01); *H01L 27/1207* (2013.01); *H01L 27/1225* (2013.01);
(Continued)

(58) Field of Classification Search
CPC . H01L 27/06; H01L 27/1207; H01L 27/1214; H01L 27/1222; H01L 27/1225; H01L 27/1229; H01L 27/14; H01L 27/142; H01L 27/146; H01L 27/14601; H01L 27/14603; H01L 27/14612; H01L 27/14616; H01L 27/14627;
(Continued)

(56) References Cited

U.S. PATENT DOCUMENTS 5,501,989 A   3/1996  Takayama et al.
5,589,694 A  12/1996  Takayama et al.
(Continued)

FOREIGN PATENT DOCUMENTS

EP   2518768 A  10/2012
EP   3128743 A   2/2017
(Continued)

*Primary Examiner* — Cheung Lee
(74) *Attorney, Agent, or Firm* — Fish & Richardson P.C.

(57) ABSTRACT

An imaging device having a three-dimensional integration structure is provided. A first structure including a transistor including silicon in an active layer or an active region and a second structure including an oxide semiconductor in an active layer are fabricated. After that, the first and second structures are bonded to each other so that metal layers included in the first and second structures are bonded to each other; thus, an imaging device having a three-dimensional integration structure is formed.

8 Claims, 47 Drawing Sheets

Related U.S. Application Data continuation of application No. 15/947,911, filed on Apr. 9, 2018, now Pat. No. 10,388,687, which is a division of application No. 15/383,327, filed on Dec. 19, 2016, now Pat. No. 10,020,336.

(51) Int. Cl.
  *H01L 29/786* (2006.01)
  *H01L 29/78* (2006.01)

(52) U.S. Cl.
  CPC ...... *H01L 27/1229* (2013.01); *H01L 27/1469* (2013.01); *H01L 27/14601* (2013.01); *H01L 27/14616* (2013.01); *H01L 27/14643* (2013.01); *H01L 27/14689* (2013.01); *H01L 27/14692* (2013.01); *H01L 29/78* (2013.01); *H01L 29/7869* (2013.01); *H01L 2224/80895* (2013.01); *H01L 2224/80896* (2013.01)

(58) Field of Classification Search
  CPC ......... H01L 27/14634; H01L 27/14641; H01L 27/14643; H01L 27/14665; H01L 27/14683; H01L 27/14689; H01L 27/1469; H01L 27/14692; H01L 29/772; H01L 29/78; H01L 29/786; H01L 29/78642; H01L 29/7869; H01L 31/04; H01L 31/12; H01L 31/14; H01L 31/36; H01L 31/18
  See application file for complete search history.

(56) References Cited

U.S. PATENT DOCUMENTS

| | | | |
|---|---|---|---|
| 5,744,822 | A | 4/1998 | Takayama et al. |
| 7,495,206 | B2 | 2/2009 | Park |
| 7,674,650 | B2 | 3/2010 | Akimoto et al. |
| 7,701,029 | B2 | 4/2010 | Mabuchi |
| 7,812,874 | B2 | 10/2010 | Iwabuchi et al. |
| 8,084,837 | B2 | 12/2011 | Mabuchi |
| 8,159,584 | B2 | 4/2012 | Iwabuchi et al. |
| 8,169,520 | B2 | 5/2012 | Iwabuchi et al. |
| 8,314,870 | B2 | 11/2012 | Itonaga et al. |
| 8,378,341 | B2 | 2/2013 | Hayashi et al. |
| 8,378,391 | B2 | 2/2013 | Koyama et al. |
| 8,384,178 | B2 | 2/2013 | Mabuchi |
| 8,440,954 | B2 | 5/2013 | Masaaki |
| 8,466,403 | B2 | 6/2013 | Endo et al. |
| 8,466,499 | B2 | 6/2013 | Mabuchi |
| 8,629,524 | B2 | 1/2014 | Wang et al. |
| 8,638,382 | B2 | 1/2014 | Itonaga et al. |
| 8,669,602 | B2 | 3/2014 | Hayashi |
| 8,735,263 | B2 | 5/2014 | Yamazaki et al. |
| 8,749,679 | B2 | 6/2014 | Shinohara |
| 8,772,130 | B2 | 7/2014 | Ohki |
| 8,928,795 | B2 | 1/2015 | Kusaka |
| 8,957,358 | B2 | 2/2015 | Wan et al. |
| 9,049,392 | B2 | 6/2015 | Itonaga et al. |
| 9,093,575 | B2 | 7/2015 | Yokoyama |
| 9,123,529 | B2 | 9/2015 | Hanaoka et al. |
| 9,129,937 | B2 | 9/2015 | Hayashi et al. |
| 9,136,141 | B2 | 9/2015 | Koezuka |
| 9,136,302 | B2 | 9/2015 | Wang et al. |
| 9,153,565 | B2 | 10/2015 | Chen et al. |
| 9,171,875 | B2 | 10/2015 | Hayashi |
| 9,178,081 | B2 | 11/2015 | Endo et al. |
| 9,179,082 | B2 | 11/2015 | Itonaga et al. |
| 9,184,197 | B2 | 11/2015 | Kusaka |
| 9,293,496 | B2 | 3/2016 | Kashihara |
| 9,312,394 | B2 | 4/2016 | Hayashi et al. |
| 9,337,230 | B2 | 5/2016 | Shinohara |
| 9,349,766 | B2 | 5/2016 | Sugiura |
| 9,357,148 | B2 | 5/2016 | Itonaga et al. |
| 9,443,836 | B2 | 9/2016 | Chen et al. |
| 9,443,895 | B2 | 9/2016 | Endo et al. |
| 9,450,010 | B2 | 9/2016 | Kashihara |
| 9,466,633 | B2 | 10/2016 | Kusaka |
| 9,473,714 | B2 | 10/2016 | Aoki et al. |
| 9,496,307 | B2 | 11/2016 | Hayashi |
| 9,502,450 | B2 | 11/2016 | Yanagita et al. |
| 9,543,341 | B2 | 1/2017 | Itonaga et al. |
| 9,553,120 | B2 | 1/2017 | Park et al. |
| 9,564,467 | B2 | 2/2017 | Shinohara |
| 9,577,005 | B2 | 2/2017 | Yokoyama |
| 9,577,006 | B2 | 2/2017 | Itonaga et al. |
| 9,595,557 | B2 | 3/2017 | Yanagita et al. |
| 9,673,235 | B2 | 6/2017 | Yanagita et al. |
| 9,704,902 | B2 | 7/2017 | Kusaka |
| 9,741,760 | B2 | 8/2017 | Shinohara |
| 9,748,291 | B2 | 8/2017 | Ikeda et al. |
| 9,754,816 | B2 | 9/2017 | Hayashi et al. |
| 9,881,958 | B2 | 1/2018 | Endo et al. |
| 9,905,598 | B2 | 2/2018 | Yamazaki et al. |
| 9,911,779 | B2 | 3/2018 | Hayashi |
| 9,923,010 | B2 | 3/2018 | Yanagita et al. |
| 9,947,710 | B2 | 4/2018 | Yokoyama |
| 10,026,768 | B2 | 7/2018 | Saruwatari et al. |
| 10,026,772 | B2 | 7/2018 | Shinohara |
| 10,090,349 | B2 | 10/2018 | Wan et al. |
| 10,121,814 | B2 | 11/2018 | Hayashi |
| 10,128,291 | B2 | 11/2018 | Yanagita et al. |
| 10,147,758 | B2 | 12/2018 | Itonaga et al. |
| 10,204,949 | B2 | 2/2019 | Kusaka |
| 10,283,552 | B2 | 5/2019 | Shinohara |
| 10,319,775 | B2 | 6/2019 | Yokoyama |
| 10,418,404 | B2 | 9/2019 | Yanagita et al. |
| 10,504,953 | B2 | 12/2019 | Yanagita et al. |
| 10,615,214 | B2 | 4/2020 | Yokoyama |
| 10,622,399 | B2 | 4/2020 | Hayashi |
| 10,680,029 | B2 | 6/2020 | Shinohara |
| 10,784,306 | B2 | 9/2020 | Itonaga et al. |
| 10,930,697 | B2 | 2/2021 | Yokoyama |
| 2011/0101333 | A1 | 5/2011 | Shionoiri et al. |
| 2011/0155893 | A1 | 6/2011 | Endo et al. |
| 2012/0104523 | A1 | 5/2012 | Ikeda |
| 2013/0285046 | A1 | 10/2013 | Yamazaki |
| 2015/0054110 | A1 | 2/2015 | Kashihara |
| 2015/0162371 | A1 | 6/2015 | Fujii et al. |
| 2015/0263053 | A1 | 9/2015 | Yamazaki et al. |
| 2015/0279884 | A1 | 10/2015 | Kusumoto |
| 2015/0311245 | A1 | 10/2015 | Yamazaki et al. |
| 2015/0349129 | A1 | 12/2015 | Ikeda |
| 2016/0118425 | A1 | 4/2016 | Kurokawa |
| 2016/0133660 | A1 | 5/2016 | Inoue et al. |
| 2016/0225808 | A1 | 8/2016 | Kurokawa |
| 2018/0114808 | A1 | 4/2018 | Endo et al. |
| 2018/0174891 | A1 | 6/2018 | Shionoiri et al. |
| 2019/0140009 | A1 | 5/2019 | Kusaka |
| 2020/0219924 | A1 | 7/2020 | Hayashi |

FOREIGN PATENT DOCUMENTS

| | | |
|---|---|---|
| EP | 3514831 A | 7/2019 |
| JP | 06-125084 A | 5/1994 |
| JP | 2000-294798 A | 10/2000 |
| JP | 2002-124469 A | 4/2002 |
| JP | 2003-338615 A | 11/2003 |
| JP | 2007-096055 A | 4/2007 |
| JP | 2007-115994 A | 5/2007 |
| JP | 2007-123861 A | 5/2007 |
| JP | 2008-235478 A | 10/2008 |
| JP | 2010-141230 A | 6/2010 |
| JP | 2010-165854 A | 7/2010 |
| JP | 2011-119671 A | 6/2011 |
| JP | 2011-119711 A | 6/2011 |
| JP | 2011-129633 | 6/2011 |
| JP | 2011-129633 A | 6/2011 |
| JP | 2011-176715 | 9/2011 |
| JP | 2011-176715 A | 9/2011 |
| JP | 2012-034354 A | 2/2012 |
| JP | 2012-038981 A | 2/2012 |
| JP | 2012-094719 | 5/2012 |
| JP | 2012-094719 A | 5/2012 |

(56) References Cited

FOREIGN PATENT DOCUMENTS

| | | |
|---|---|---|
| JP | 2012-164870 A | 8/2012 |
| JP | 2013-175494 A | 9/2013 |
| JP | 2013-243355 | 12/2013 |
| JP | 2013-243355 A | 12/2013 |
| JP | 2014-072418 A | 4/2014 |
| JP | 2014-143399 A | 8/2014 |
| JP | 2014-165417 A | 9/2014 |
| JP | 2015-041677 A | 3/2015 |
| JP | 2015-088759 | 5/2015 |
| JP | 2015-088759 A | 5/2015 |
| JP | 2015-170620 | 9/2015 |
| JP | 2015-170620 A | 9/2015 |
| JP | 2015-195378 | 11/2015 |
| JP | 2015-195378 A | 11/2015 |
| JP | 2015-216369 | 12/2015 |
| JP | 2015-216369 A | 12/2015 |
| KR | 10-1514119 | 4/2015 |
| WO | WO-2011/052386 | 5/2011 |
| WO | WO2011/077580 | 6/2011 |
| WO | WO-2011/077580 | 6/2011 |
| WO | WO-2015/145306 | 10/2015 |
| WO | WO-2015/152297 | 10/2015 |

FIG. 11A1
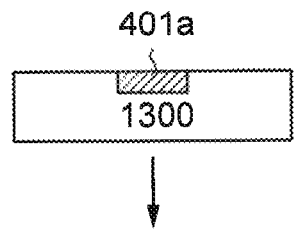
FIG. 11B1
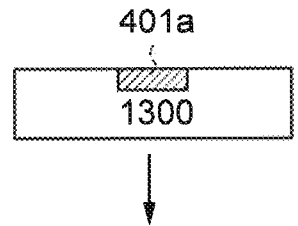
FIG. 11A2
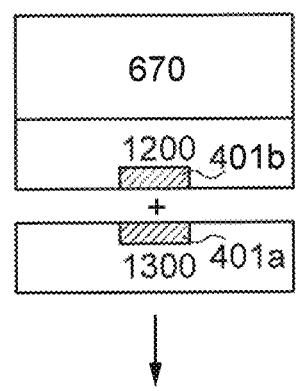
FIG. 11B2
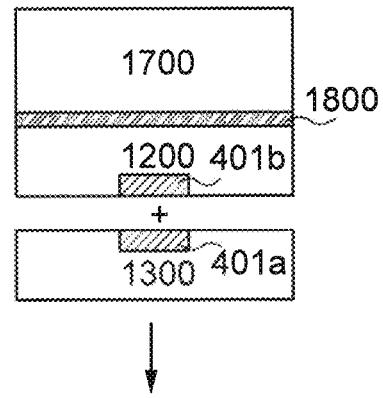
FIG. 11A3
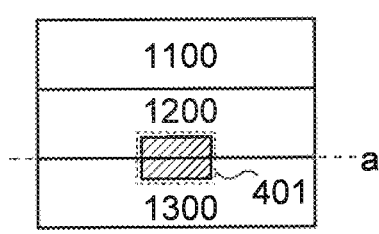
FIG. 11B3
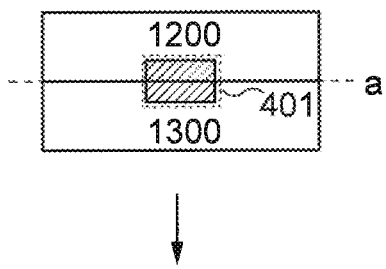
FIG. 11B4
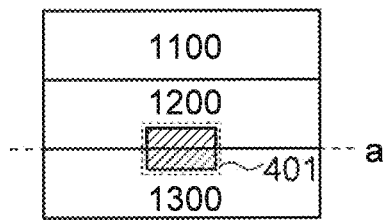

FIG. 12A1
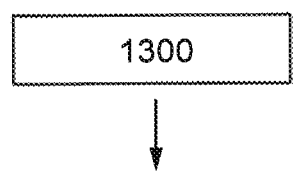
FIG. 12A2
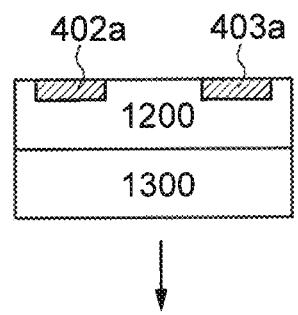
FIG. 12A3
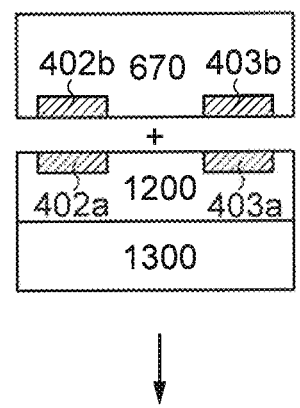
FIG. 12A4
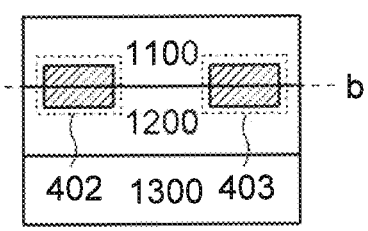
FIG. 12B1
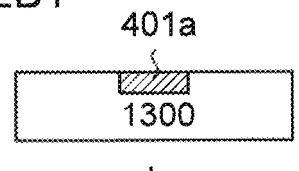
FIG. 12B2
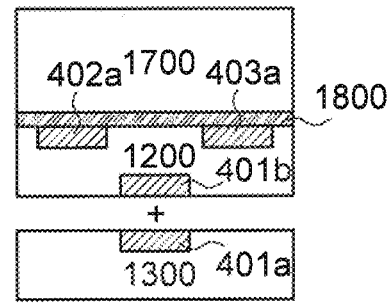
FIG. 12B3
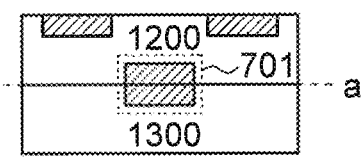
FIG. 12B4
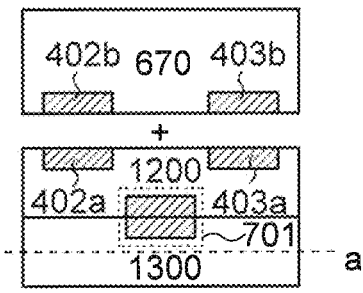
FIG. 12B5
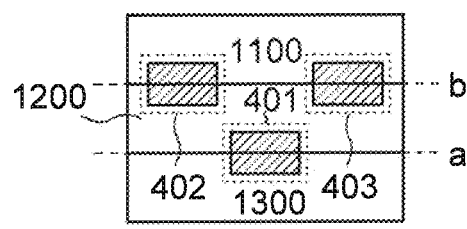

FIG. 16A
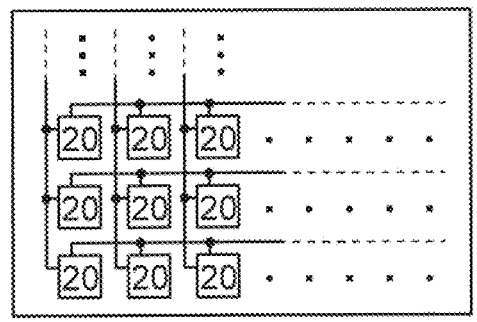
FIG. 16B1
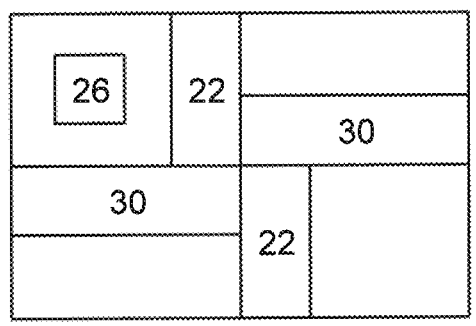
FIG. 16B2
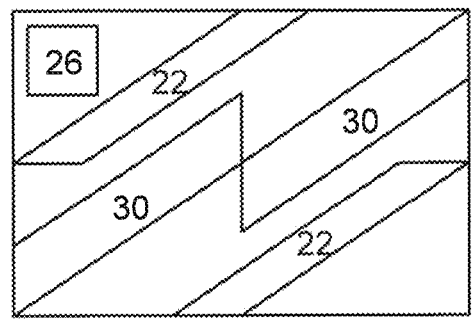
FIG. 16C
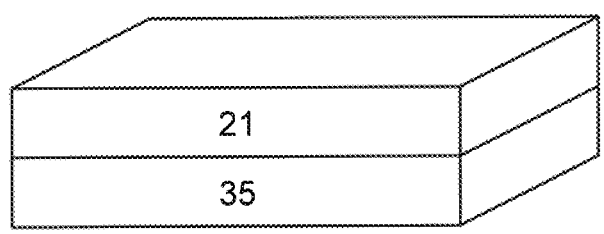

FIG. 24A1
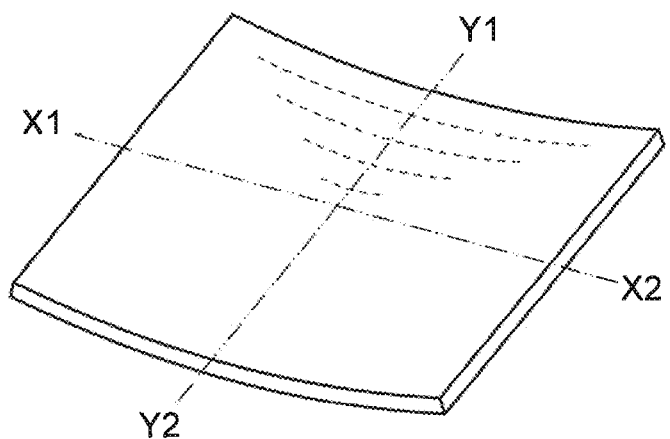
FIG. 24A2
FIG. 24A3
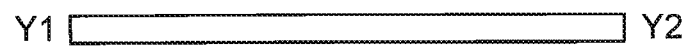
FIG. 24B1
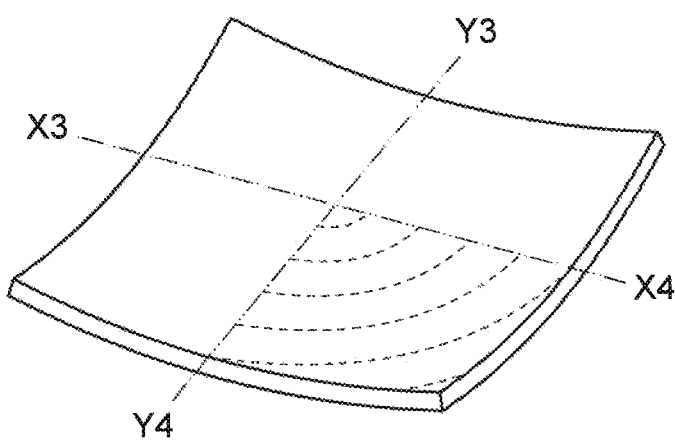
FIG. 24B2
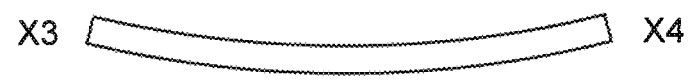
FIG. 24B3
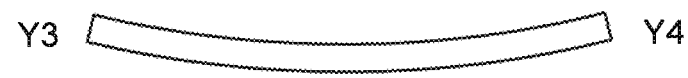

IMAGING DEVICE AND ELECTRONIC DEVICE

CROSS-REFERENCE TO RELATED APPLICATIONS

This application is a continuation of U.S. application Ser. No. 16/541,292, filed Aug. 15, 2019, now allowed, which is a continuation of U.S. application Ser. No. 15/947,911, filed Apr. 9, 2018, now U.S. Pat. No. 10,388,687, which is a divisional of U.S. application Ser. No. 15/383,327, filed Dec. 19, 2016, now U.S. Pat. No. 10,020,336, which claims the benefit of foreign priority applications filed in Japan as Serial No. 2015-256138 on Dec. 28, 2015, and Serial No. 2016-171454 on Sep. 2, 2016, all of which are incorporated by reference.

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

An oxide semiconductor has attracted attention as a semiconductor material applicable to the transistor. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor is used in part of a pixel circuit.

Patent Document 4 discloses an imaging device in which a transistor including silicon, a transistor including an oxide semiconductor, and a photodiode including a crystalline silicon layer are stacked.

REFERENCE

Patent Document 1: Japanese Published Patent Application No. 2007-123861
Patent Document 2: Japanese Published Patent Application No. 2007-096055
Patent Document 3: Japanese Published Patent Application No. 2011-119711
Patent Document 4: Japanese Published Patent Application No. 2013-243355

SUMMARY OF THE INVENTION

A semiconductor integrated circuit with high density and large capacity has been developed; meanwhile, miniaturization of the semiconductor integrated circuit is required. Thus, two-dimensional integration has been shifted actively to three-dimensional integration.

Although a manufacturing process of three-dimensional integration structure may be complicated, the degree of freedom of the materials and the design rule of layers can be increased. Therefore, a high-functional semiconductor integrated circuit which is difficult to be manufactured by two-dimensional integration can be manufactured.

In view of the above, an object of one embodiment of the present invention is to provide an imaging device having a three-dimensional integration structure. Another object is to provide an imaging device capable of division driving. Another object is to provide an imaging device that can be downsized. Another object is to provide an imaging device capable of taking an image with little noise. Another object is to provide an imaging device suitable for high-speed operation. Another object is to provide an imaging device with high resolution. Another object is to provide an imaging device capable of taking an image under a low illuminance condition. Another object is to provide an imaging device which can be used in a wide temperature range. Another object is to provide an imaging device with a high aperture ratio. Another object is to provide an imaging device with high reliability. Another object is to provide a novel imaging device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is related to an imaging device with a stacked structure.

One embodiment of the present invention is an imaging device including a first layer, a second layer, and a third layer. The first layer includes a photoelectric conversion element. The second layer includes a first transistor including an oxide semiconductor in an active layer, a first insulating layer, and a first metal layer. The third layer including a second transistor includes silicon in an active layer or an active region, a second insulating layer, and a second metal layer. The second layer is provided between the first layer and the third layer. The first metal layer and the second metal layer are formed using metal elements using the same main component. The first metal layer has a region embedded in the first insulating layer and a region bonded to the second metal layer. The second metal layer has a region embedded in the second insulating layer. The first insulating layer has a region bonded to the second insulating layer. The first transistor and the second transistor are arranged so that top surfaces of gate electrodes thereof face each other. The photoelectric conversion element is electrically connected to the first transistor. The first transistor and the second transistor are electrically connected to the first metal layer and the second metal layer, respectively.

The second layer can include an n-channel third transistor including an oxide semiconductor in an active layer and include a third metal layer. The third layer can include a p-channel fourth transistor including silicon in an active layer or an active region and include a fourth metal layer. The third metal layer and the fourth metal layer can be formed using metal elements using the same main component. The third metal layer can have a region embedded in the first insulating layer and a region bonded to the fourth metal layer. The fourth metal layer can have a region embedded in the second insulating layer. The third transistor and the fourth transistor can be arranged so that top surfaces of gate electrodes thereof face each other. The third transistor and the fourth transistor can be electrically connected to the third metal layer and the fourth metal layer, respectively.

Another embodiment of the present invention is an imaging device including a first layer, a second layer, and a third layer. The first layer includes a photoelectric conversion element, a third insulating layer, and a fifth metal layer. The second layer includes a first transistor including an oxide semiconductor in an active layer, a fourth insulating layer, and a sixth metal layer. The third layer includes a second transistor including silicon in an active layer or an active region. The second layer is provided between the first layer and the third layer. The fifth metal layer and the sixth metal layer are formed using metal elements using the same main component. The fifth metal layer has a region embedded in the third insulating layer and a region bonded to the sixth metal layer. The sixth metal layer has a region embedded in the fourth insulating layer. The third insulating layer has a region bonded to the fourth insulating layer. The photoelectric conversion element is electrically connected to the fifth metal layer. The first transistor and the second transistor are electrically connected to the fifth metal layer and the first transistor, respectively.

The metal element is preferably Cu, Al, W, or Au.

The oxide semiconductor preferably contains In, Zn, and M (M is Al, Ga, Y, or Sn).

One embodiment of the present invention can provide an imaging device having a three-dimensional integration structure. An imaging device capable of division driving can be provided. An imaging device that can be downsized can be provided. An imaging device capable of taking an image with little noise can be provided. An imaging device suitable for high-speed operation can be provided. An imaging device with high resolution can be provided. An imaging device capable of taking an image under a low illuminance condition can be provided. An imaging device which can be used in a wide temperature range can be provided. An imaging device with a high aperture ratio can be provided. An imaging device with high reliability can be provided. A novel imaging device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:

FIGS. 11A1, 11A2, 11A3, 11B1, 11B2, 11B3, and 11B4 illustrate a manufacturing process of an imaging device;

FIGS. 12A1, 12A2, 12A3, 12A4, 12B1, 12B2, 12B3, 12B4, and 12B5 illustrate a manufacturing process of an imaging device;

FIGS. 16A, 16B1, 16B2, and 16C are top views and a perspective view illustrating a structure of an imaging device;

FIGS. 24A1, 24A2, 24A3, 24B1, 24B2, and 24B3 illustrate bent imaging devices;

DETAILED DESCRIPTION OF THE INVENTION

Figure 1A:
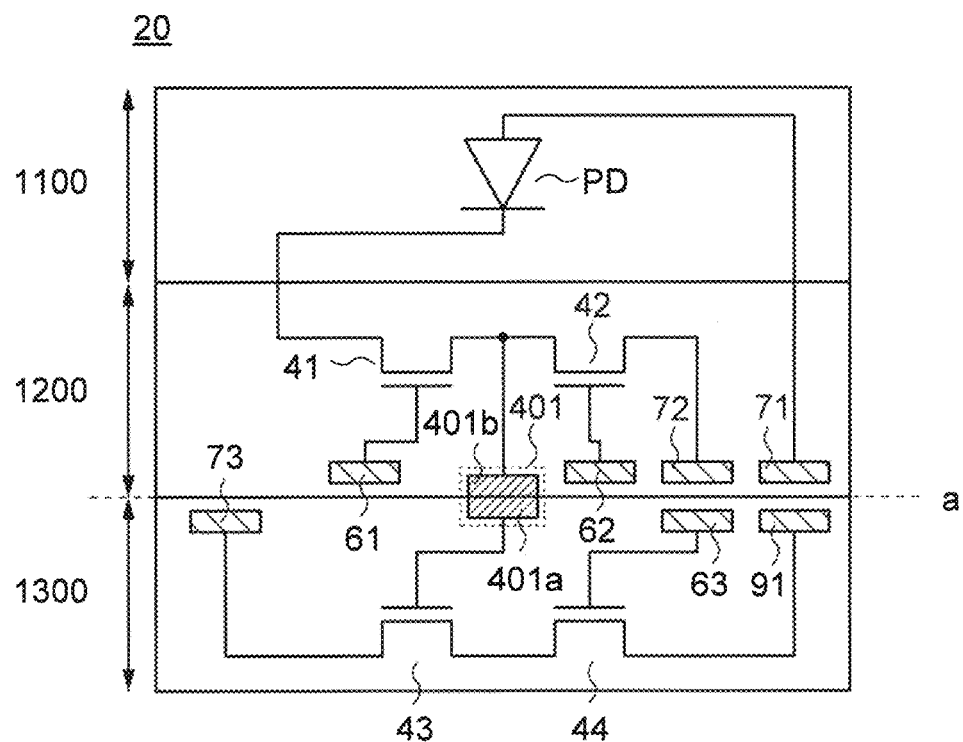
FIG. 1A illustrates a pixel of an imaging device.

Embodiments will be described in detail with reference to the drawings. Note that the present invention is not limited to the following description. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

Examples of the case where X and Y are electrically connected include the case where one or more elements that allow an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

Examples of the case where X and Y are functionally connected include the case where one or more circuits that allow functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up converter, or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expression include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X through at least a first connection path on which Z1 is provided, the first connection path does not include a second connection path, the second connection path includes a connection path on which the transistor is provided, a drain (or a second terminal or the like) of the transistor is electrically connected to Y through at least a third connection path on which Z2 is provided, and the third connection path does not include the second connection path". Another examples of the expression include "a source (or a first terminal or the like) of a transistor is electrically connected to X through at least a first connection path on which Z1 is provided, the first connection path does not include a second connection path, the second connection path is a path between the source (or the first terminal or the like) and a drain (or a second terminal or the like) of the transistor, the drain (or the second terminal or the like) of the transistor is electrically connected to Y through at least a third connection path on which Z2 is provided, the third connection path does not include a fourth connection path, and the fourth connection path is a path between the drain (or a second terminal or the like) and the source (or the first terminal or the like) of the transistor. When the connection order in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in general, a potential (a voltage) is relative and is determined depending on the amount relative to a reference potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, an imaging device that is one embodiment of the present invention will be described with reference to drawings.

Embodiments of the present invention are the structure and the manufacturing method of an imaging device having a three-dimensional integration structure formed by bonding a fabricated first structure and second structure to each other to bond metal layers included in the first and second structures to each other.

The first structure may include a transistor including silicon in an active layer or an active region, a first metal layer electrically connected to the transistor, and a first insulating layer.

The second structure may include a photoelectric conversion element, a transistor including an oxide semiconductor in an active layer, a second metal layer electrically connected to the transistor, and a second insulating layer.

Alternatively, the first structure may include a first transistor including silicon in an active layer or an active region, a second transistor including an oxide semiconductor in an active layer, a third metal layer electrically connected to the second transistor, and a third insulating layer, and the second structure may include a photoelectric conversion element, a fourth metal layer electrically connected to the photoelectric conversion element, and a fourth insulating layer.

Alternatively, the first structure, the second structure, and a third structure may be bonded to each other.

In this case, the first structure may include a transistor including silicon in an active layer or an active region, a first metal layer electrically connected to the transistor, and a first insulating layer. The second structure may include a transistor including an oxide semiconductor in an active layer, a second metal layer electrically connected to the transistor, a third metal layer, a second insulating layer, and a third insulating layer. The third structure may include a photoelectric conversion element, a fourth metal layer electrically connected to the photoelectric conversion element, and a fourth insulating layer.

The transistor including the oxide semiconductor in an active layer has a low off-state current and therefore facilitates construction of a memory for retaining data in the pixel of an imaging device.

Figure 1B:
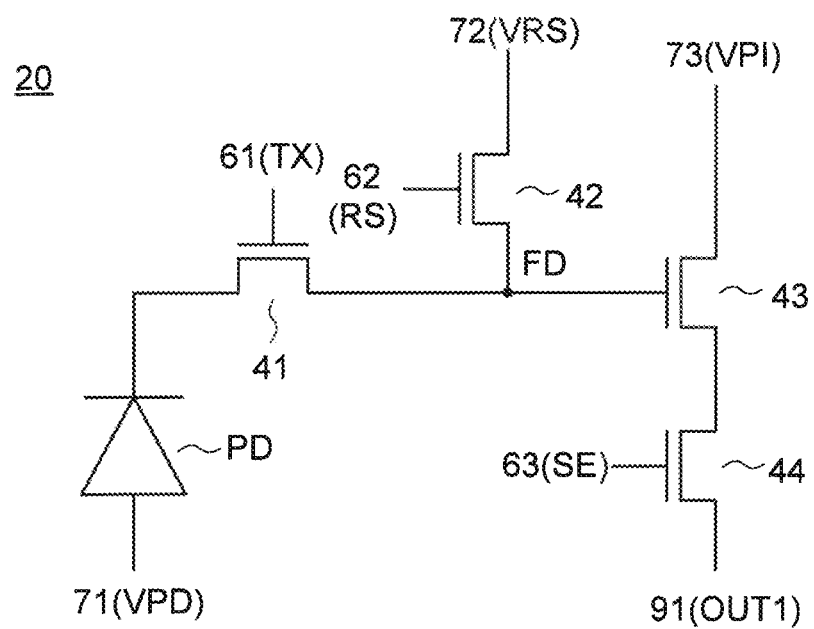
FIG. 1B is a circuit diagram thereof.

FIGS. 1A and 1B are a cross-sectional schematic view of a pixel 20 included in an imaging device of one embodiment of the present invention and a circuit diagram thereof, respectively. Note that an example in which transistors are n-channel transistors is illustrated in FIGS. 1A, 1B, and the like; however, one embodiment of the present invention is not limited to this, and some transistors may be replaced with p-channel transistors.

In the pixel 20, one electrode of a photoelectric conversion element PD is electrically connected to one of a source and a drain of a transistor 41. The other of the source and the drain of the transistor 41 is electrically connected to one of a source and a drain of a transistor 42. The other of the source and the drain of the transistor 41 is electrically connected to a gate of a transistor 43. One of a source and a drain of the transistor 43 is electrically connected to one of a source and a drain of a transistor 44.

Figure 20A:
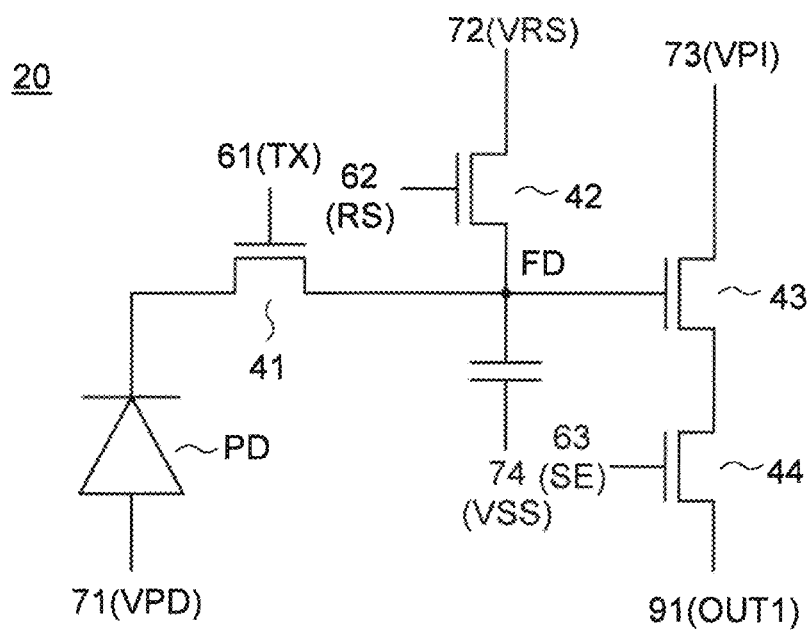
FIGS. 20A and 20B are circuit diagrams each illustrating a pixel.

Here, a node FD to which the other of the source and the drain of the transistor 41, one of the source and the drain of the transistor 42, and the gate of the transistor 43 are connected is a charge detection portion. Note that a capacitor may be connected to the node FD as illustrated in FIG. 20A.

In FIGS. 1A and 1B, the other electrode of the photoelectric conversion element PD is electrically connected to a wiring 71 (VPD). The other of the source and the drain of the transistor 42 is electrically connected to a wiring 72 (VRS). The other of the source and the drain of the transistor 43 is electrically connected to a wiring 73 (VPI). The other of the source and the drain of the transistor 44 is electrically connected to a wiring 91 (OUT1).

Note that connection configuration between a component (e.g., a transistor, a photoelectric conversion element, or the like) and a wiring in FIGS. 1A and 1B is an example Components might be electrically connected to different wirings, or a plurality of components might be electrically connected to the same wiring.

The wiring 71 (VPD), the wiring 72 (VRS), and the wiring 73 (VPI) can function as power supply lines. For example, the wiring 71 (VPD) can function as a low potential power supply line. The wiring 72 (VRS) and the wiring 73 (VPI) can function as high potential power supply lines.

A gate of the transistor 41 is electrically connected to a wiring 61 (TX). A gate of the transistor 42 is electrically connected to a wiring 62 (RS). A gate of the transistor 44 is electrically connected to a wiring 63 (SE).

The wirings 61 (TX), 62 (RS), and 63 (SE) can function as signal lines for controlling the conduction states of the transistors to which the respective wirings are connected.

The transistor 41 can function as a transistor for transferring the potential of a cathode of the photoelectric conversion element PD. The transistor 42 can function as a transistor for resetting the potential of the node FD. The transistor 43 can function as a transistor for outputting a signal corresponding to the potential of the node FD. The transistor 44 can function as a transistor for selecting the pixel 20.

Note that the above structure of the pixel 20 is just an example, and some of the circuits, some of the transistors, some of the capacitors, some of the wirings, or the like are not included in some cases. Alternatively, a circuit, a transistor, a capacitor, a wiring, or the like that is not included in the above structure might be included. Alternatively, a connection configuration of some wirings might be different from the above configuration.

An imaging device of one embodiment of the present invention includes a layer 1100, a layer 1200, and a layer 1300 as illustrated in FIG. 1A.

The layer 1100 may include the photoelectric conversion element PD. A photodiode with two terminals can be used for the photoelectric conversion element PD, for example. As the photodiode, a PN photodiode using a single crystal silicon substrate, a PIN photodiode using an amorphous silicon thin film, a micro crystal silicon thin film, or a polycrystalline silicon thin film, selenium or a compound thereof, or a photodiode using an organic compound can be used.

The layer 1200 may include the transistors 41 and 42. As the transistors 41 and 42, a transistor including an oxide semiconductor in an active layer (hereinafter, referred to as an OS transistor) is preferably used. In addition, the layer 1200 includes a metal layer 401b electrically connected to one of the source and the drain of the transistor 41 and one of the source and the drain of the transistor 42.

An OS transistor has an extremely low off-state current. A period during which charge can be held in the node FD can be extremely long owing to the low off-state current of the transistors 41 and 42. Therefore, a global shutter system in which charge accumulation operation is performed in all the pixels at the same time can be used without a complicated circuit configuration and an operation method. Note that the imaging device of one embodiment of the present invention can also be operated in a rolling shutter system.

The OS transistor has lower temperature dependence of change in electrical characteristics than a transistor including silicon in an active region or an active layer (hereinafter, referred to as a Si transistor), and thus can be used in an extremely wide range of temperatures. Therefore, an imaging device and a semiconductor device which include the OS transistors are suitable for use in automobiles, aircrafts, and spacecrafts.

Moreover, the OS transistor has higher drain withstand voltage than the Si transistor. To utilize avalanche multiplication, a photoelectric conversion element including a selenium-based material in a photoelectric conversion layer is preferably operated while a relatively high voltage (e.g., 10 V or more) is applied. Therefore, by combination of the OS transistor and the photoelectric conversion element in which the selenium-based material is used for the photoelectric conversion layer, a highly reliable imaging device can be obtained.

The layer 1300 may include the transistors 43 and 44. As the transistors 43 and 44, a transistor including silicon in an active layer or an active region is preferably used. Such a transistor has a high on-state current and efficiently amplifies the potential of the node FD. Moreover, the layer 1200 includes a metal layer 401a electrically connected to the gate of the transistor 44.

As illustrated in FIG. 1A, the metal layers 401a and 401b are provided in a position to be in contact with each other directly and include a connection portion 401 at which the metal layers 401a and 401b are electrically connected to each other.

Figure 2A:
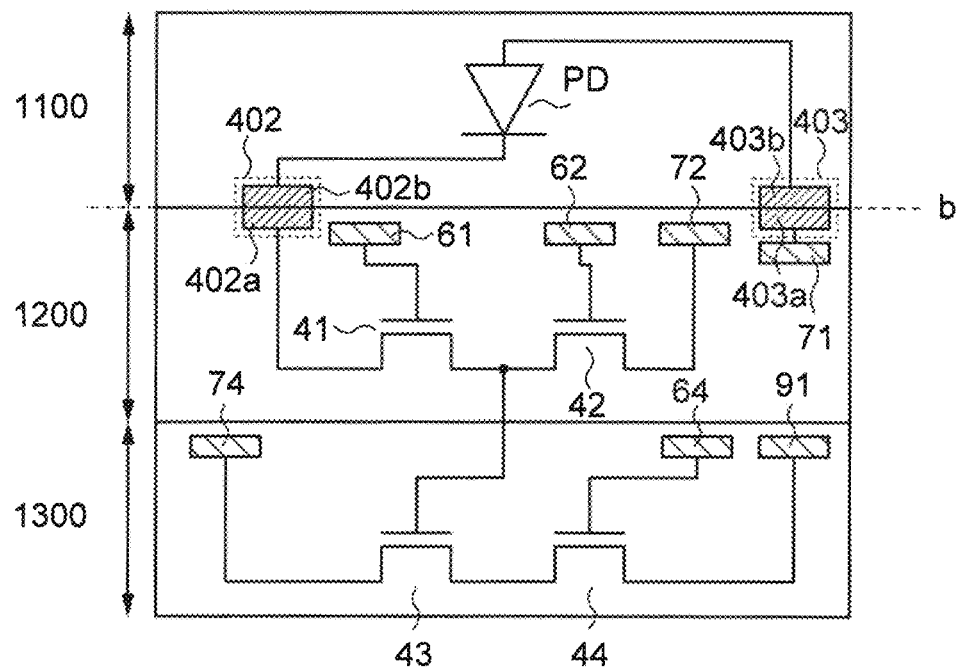
FIGS. 2A and 2B each illustrate a pixel of an imaging device.

Alternatively, the imaging device of one embodiment of the present invention may have a structure illustrated in FIG. 2A.

In a structure illustrated in FIG. 2A, the layer 1100 includes the photoelectric conversion element PD, a metal layer 402b electrically connected to one electrode of the photoelectric conversion element PD, and a metal layer 403b electrically connected to the other electrode of the photoelectric conversion element PD. Note that the metal layer 403b is not necessarily provided in the layer 1100.

The layer 1200 includes the transistor 41, the transistor 42, a metal layer 402a electrically connected to one of the source and the drain of the transistor 41, and a metal layer 403a electrically connected to the wiring 71. Note that the wiring 71 and the metal layer 403a are not necessarily provided in the layer 1200.

The layer 1300 includes the transistors 43 and 44.

As illustrated in FIG. 2A, the metal layers 402a and 402b are provided in a position to be in contact with each other directly and include a connection portion 402 at which the metal layers 402a and 402b are electrically connected to each other. Furthermore, the metal layers 403a and 403b are provided in a position to be in contact with each other directly and include a connection portion 403 at which the metal layers 403a and 403b are electrically connected to each other.

Figure 2B:
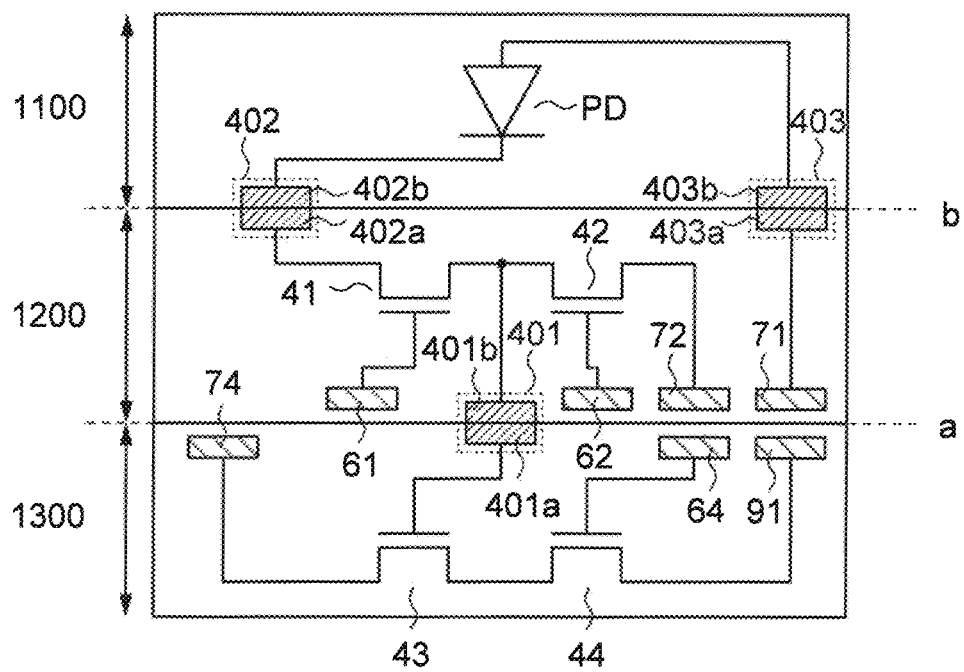

An imaging device of one embodiment of the present invention may have a structure illustrated in FIG. 2B.

In a structure illustrated in FIG. 2B, the layer 1100 includes the photoelectric conversion element PD, a metal layer 402b electrically connected to one electrode of the photoelectric conversion element PD, and a metal layer 403b electrically connected to the other electrode of the photoelectric conversion element PD. Note that the metal layer 403b is not necessarily provided in the layer 1100.

The layer 1200 includes the transistor 41, the transistor 42, the metal layer 402a electrically connected to one of the source and the drain of the transistor 41, the metal layer 403a electrically connected to the wiring 71, and the metal layer 401b electrically connected to one of the source and the drain of each of the transistors 41 and 42. Note that the wiring 71 and the metal layer 403a is not necessarily provided in the layer 1200.

The layer 1300 includes the transistors 43 and 44 and the metal layer 401a electrically connected to the gate of the transistor 43.

As illustrated in FIG. 2B, the metal layers 402a and 402b are provided in a position to be in contact with each other directly and include the connection portion 402 at which the metal layers 402a and 402b are electrically connected to each other. Furthermore, the metal layers 403a and 403b are provided in a position to be in contact with each other directly and include the connection portion 403 at which the metal layers 403a and 403b are electrically connected to each other. Moreover, the metal layers 401a and 401b are provided in a position to be in contact with each other directly and include the connection portion 401 at which the metal layers 401a and 401b are electrically connected to each other.

Figure 3A:
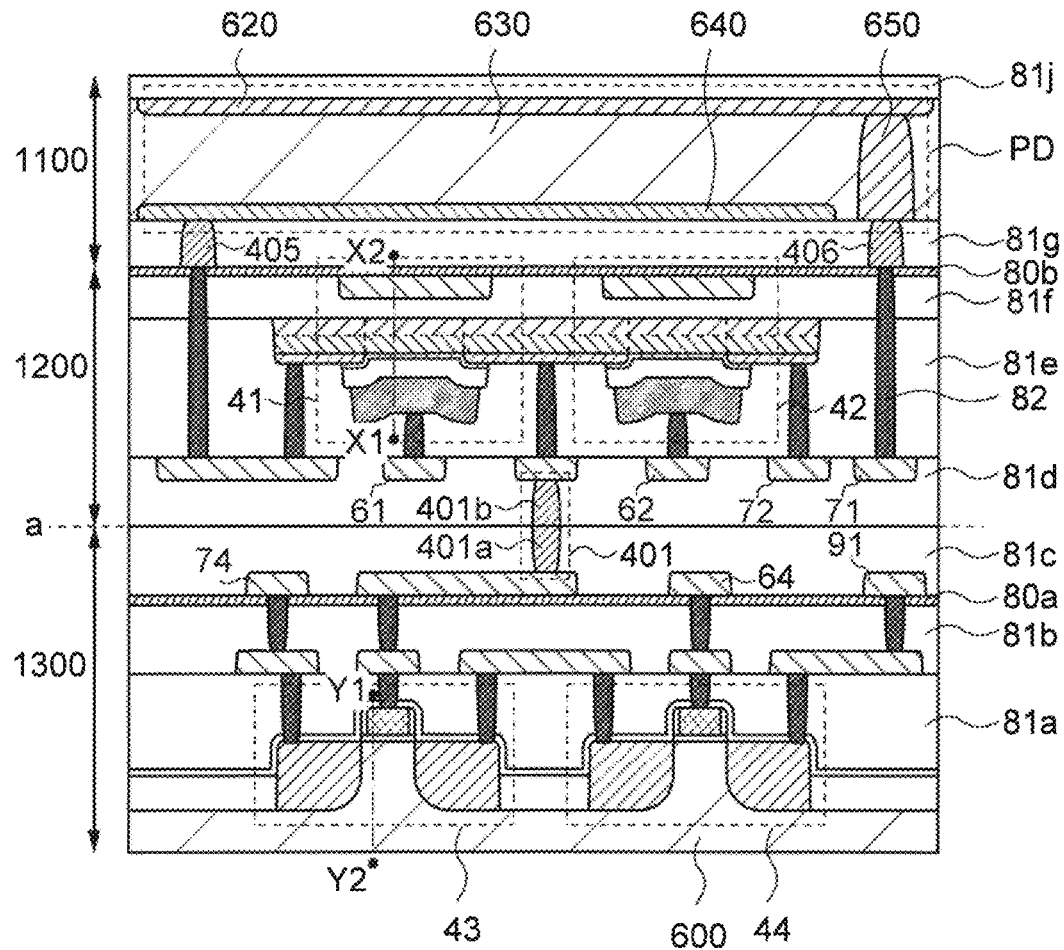
FIGS. 3A to 3C are cross-sectional views illustrating a structure of an imaging device.
Figure 3B:
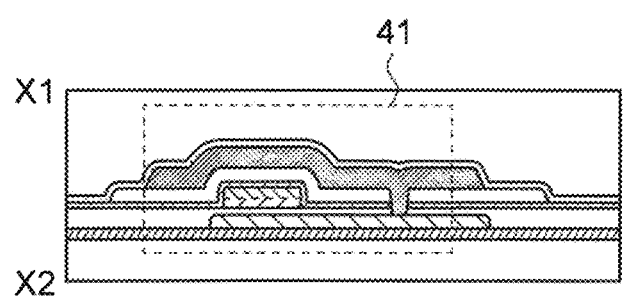
Figure 3C:
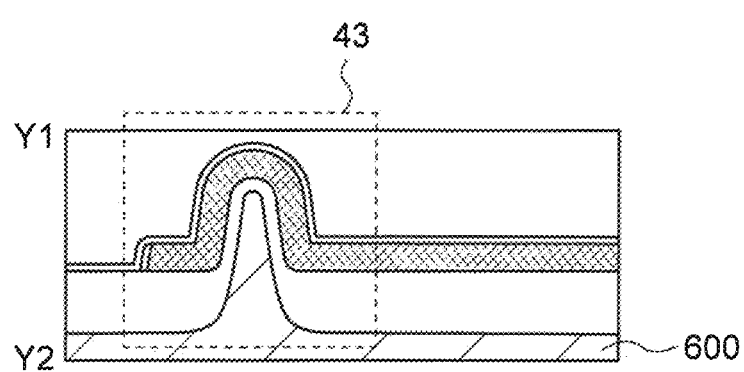

FIGS. 3A, 3B, and 3C each illustrate a specific structure of the pixel 20 corresponding to FIG. 1A. FIG. 3A is a cross-sectional view of the transistors 41 to 44 in the channel length direction. FIG. 3B is a cross-sectional view which is taken along dashed-dotted line X1-X2 in FIG. 3A and which illustrates a cross section of the transistor 41 in the channel width direction. FIG. 3C is a cross-sectional view which is taken along dashed-dotted line Y1-Y2 in FIG. 3A and which illustrates a cross section of the transistor 42 in the channel width direction.

Although the wirings, the electrodes, the metal layers, and contact plugs (conductors 82) are illustrated as independent components in the cross-sectional views in this embodiment, some of them are provided as one component in some cases when they are electrically connected to each other. In addition, a structure in which the components such as wirings, electrodes, and metal layers are connected to each other through the conductors 82 is only an example, and the components may be directly connected to each other not through the conductor 82.

Insulating layers 81a to 81j each functioning as a protective film, an interlayer insulating film, or a planarization film are provided over the components such as transistors. For example, an inorganic insulating film such as a silicon oxide film or a silicon oxynitride film can be used as the insulating layers 81a to 81j. Alternatively, an organic insulating film such as an acrylic resin film or a polyimide resin film may be used. Top surfaces of the insulating layers 81a to 81j are preferably subjected to planarization treatment as necessary by chemical mechanical polishing (CMP) or the like.

In some cases, one or more of the wirings and the like illustrated in the drawing are not provided, or a wiring, a transistor, or the like that is not illustrated in the drawing is included in each layer. In some cases, a layer that is not illustrated in the drawing is included. Furthermore, one or more of the layers illustrated in the drawing are not included in some cases.

Insulating layers 80a and 80b are provided between a region including an OS transistor and a region including a Si device (a Si transistor or a Si photodiode).

Dangling bonds of silicon are terminated with hydrogen in insulating layers provided in the vicinities of the active regions of the transistors 43 and 44. Therefore, the hydrogen has an effect of improving the reliability of the transistors 43 and 44. Meanwhile, hydrogen in insulating layers which are provided in the vicinity of the oxide semiconductor layer that is the active layer of the transistors 41 and 42 causes generation of carriers in the oxide semiconductor layer. Therefore, the hydrogen might reduce the reliability of the transistors 41 and 42. For this reason, the insulating layer 80b that has a function of preventing diffusion of hydrogen is preferably provided between one layer including the Si transistor and another layer stacked thereover that includes the OS transistor. Hydrogen is confined in one layer by the insulating layer 80b, so that the reliability of the transistors 43 and 44 can be improved. Furthermore, diffusion of hydrogen from the one layer to the other layer is inhibited, so that the reliability of the transistors 41 and 42 can also be improved. For this reason, the insulating layer 80a that has a function of preventing diffusion of hydrogen is preferably provided between one layer including the Si photodiode and another layer including the OS transistor.

The insulating layers 80a and 80b can be, for example, formed using, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

In FIG. 3A, the photoelectric conversion element PD included in the layer 1100 is a PN photodiode using a single crystal silicon substrate. The photoelectric conversion element PD may include a $p^+$ region 620, a $p^-$ region 630, an n-type region 640, and a $p^+$ region 650.

The n-type region 640 is electrically connected to a metal layer 405. The $p^+$ region 650 is electrically connected to a metal layer 406. The metal layers 405 and 406 are provided to penetrate an insulating layer 81g.

The transistors 41 and 42 which are OS transistors are provided in the layer 1200. Although each of the transistors 41 and 42 includes a back gate, only the transistor 41 may include a back gate, for example. As illustrated in FIG. 3B, the back gate might be electrically connected to a front gate of the transistor, which is provided to face the back gate. Alternatively, different fixed potentials might be supplied to the back gate and the front gate.

The metal layer 401b includes a region embedded in an insulating layer 81d and the metal layer 401b is electrically connected to the other of the source and the drain of the transistor 41 and one of the source and the drain of the transistor 42 through a conductive layer, the conductor 82, or the like. One of the source and the drain of the transistor 41 is electrically connected to the metal layer 405 through the conductive layer, the conductor 82, or the like. In addition, the wiring 71 is electrically connected to the metal layer 406 through the conductor 82.

Figure 4A:
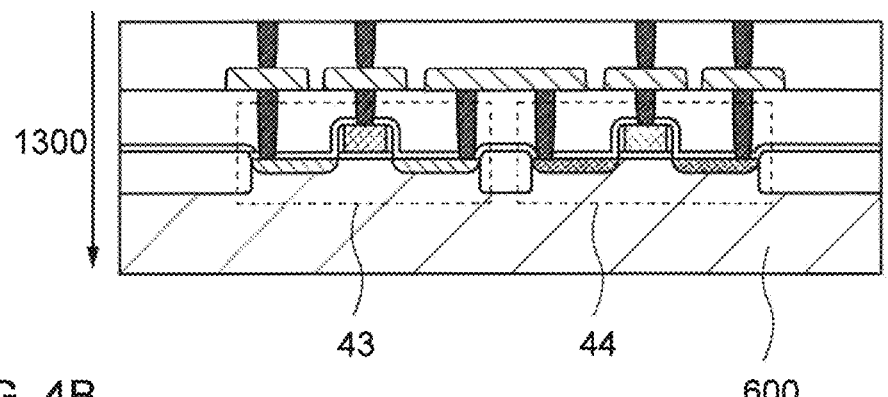
FIGS. 4A and 4B are cross-sectional views each illustrating a structure of an imaging device.
Figure 4B:
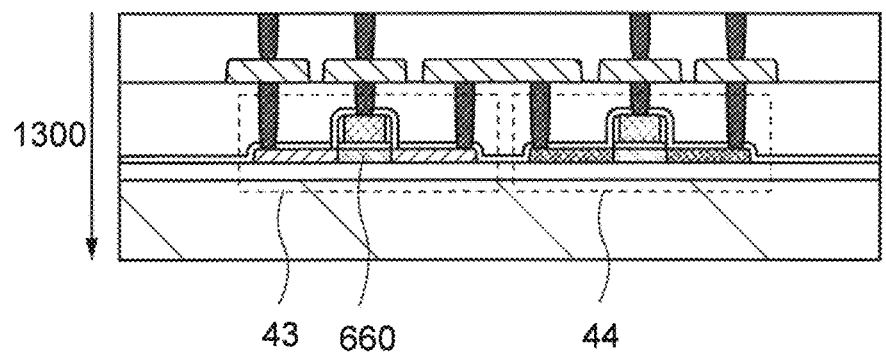

The transistors 43 and 44 which are Si transistors are provided in the layer 1300. Although FIG. 3A shows the transistors 43 and 44 of a fin type, the transistors may be of a planar type as illustrated in FIG. 4A. Alternatively, as illustrated in FIG. 4B, transistors each including an active layer 660 formed using a silicon thin film may be used. The active layer 660 can be formed using polycrystalline silicon or single crystal silicon of a silicon-on-insulator (SOI) structure.

The metal layer 401a includes a region embedded in an insulating layer 81c and the metal layer 401a is electrically connected to the gate of the transistor 43 through the conductive layer, the conductor 82, or the like.

The metal layers 401a and 401b are preferably formed using metal elements using the same main component. Moreover, the insulating layers 81c and 81d are preferably formed using the same component.

For example, Cu, Al, Sn, Zn, W, Ag, Pt, Au, or the like can be used for the metal layers 401a and 401b. Preferably, Cu, Al, W, or Au is used for easy bonding. In addition, silicon oxide, silicon oxynitride, silicon nitride oxide, silicon nitride, titanium nitride, or the like can be used for the insulating layers 81c and 81d.

When the above same metal materials and the above insulating materials are used for the metal layers 401a and 401b and the insulating layers 81c and 81d, respectively, a bonding step can be performed at a bonding portion a in FIG. 3. The metal layers 401a and 401b can be electrically connected to each other through the bonding step. Furthermore, the connection between the insulating layers 81c and 81d can obtain mechanical strength.

For bonding the metal layers to each other, surface activated bonding and diffusion bonding can be used. Surface activated bonding is a method in which an oxide film and a layer adsorbing impurities over the surface of the metal layer are removed by sputtering treatment and the cleaned and activated surfaces of the metal layers are made to be in contact with each other to be bonded to each other. Diffusion bonding is a method in which the surfaces of the metal layers are bonded to each other by using temperature and pressure together. Both methods can cause bonding at an atomic level, thereby obtaining not only electric but also mechanical strength.

For bonding the insulating layers to each other, hydrophilic bonding or the like can be used after obtaining high planarity by polishing or the like. Hydrophilic bonding is the following method: the surfaces of the metal layers are subjected to hydrophilicity treatment by oxygen plasma or the like, made to be in contact with each other to be bonded to each other temporarily, and then dehydrated by heat treatment so that final bonding is performed. Also the hydrophilic bonding can cause bonding at an atomic level; thus, the connection can obtain mechanical strength.

The insulating layers and the metal layers are mixed on the bonding surfaces of the layers 1300 and 1200; therefore, surface activated bonding and hydrophilic bonding are preferably performed together when the layers 1300 and 1200 are bonded to each other.

For example, the following method can be used: the surfaces of the layers 1300 and 1200 are made clean after polishing, the surfaces of the metal layers are subjected to antioxidant treatment and hydrophilicity treatment, and then bonding is performed. Alternatively, hydrophilicity treatment may be performed on the surfaces of the metal layers with the use of hardly oxidizable metal such as Au. Note that a bonding method other than the above method may be used.

Bonding is performed after the devices are completed, so that OS transistors and Si transistors can be fabricated using an optimal process for each of them. Therefore, the electric characteristics and reliability of the transistors can be improved. Moreover, bonding is performed after top-gate transistors are completed, so that front gate electrodes of the OS transistors and gate electrodes of the Si transistors are provided so that top surfaces thereof face each other.

Figure 5:
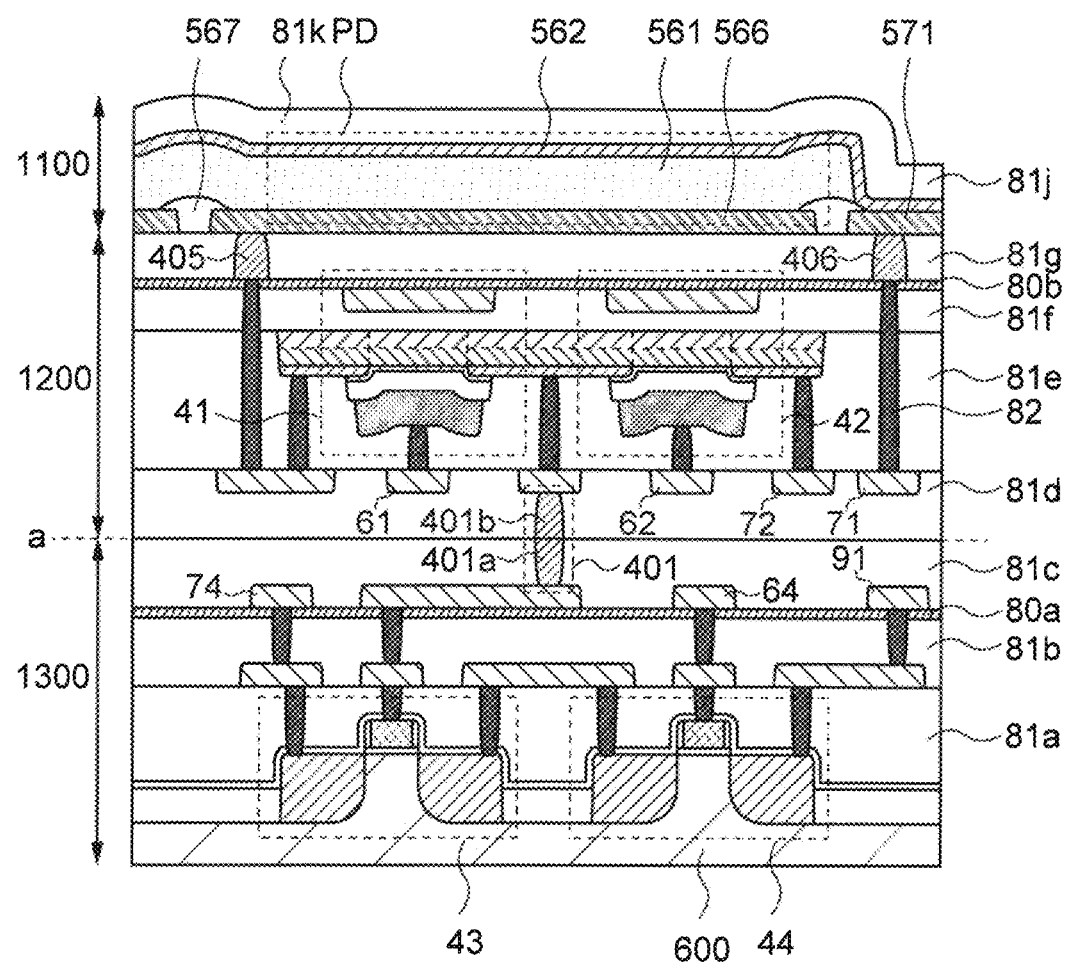
FIG. 5 is a cross-sectional view illustrating a structure of an imaging device.

Alternatively, the pixel 20 may have a stacked structure illustrated in FIG. 5. The pixel 20 in FIG. 5 is different from that in FIG. 3A only in the structure of the layer 1100 and the other structures are the same.

In FIG. 5, the photoelectric conversion element PD included in the layer 1100 is a photodiode using selenium for a photoelectric conversion layer. The photoelectric conversion element PD may include a photoelectric conversion layer 561, a light-transmitting conductive layer 562, an electrode 566, a partition wall 567, and a wiring 571.

The electrode 566 is electrically connected to the metal layer 405. The light-transmitting conductive layer 562 is electrically connected to the metal layer 406 through the wiring 571. The metal layers 405 and 406 are provided to penetrate the insulating layer 81g.

FIG. 5 illustrates the photoelectric conversion element PD including a selenium-based material for the photoelectric conversion layer 561. The photoelectric conversion element PD including a selenium-based material has high external quantum efficiency with respect to visible light. Furthermore, the selenium-based material has a high light-absorption coefficient, making the photoelectric conversion layer 561 thin easily. The photoelectric conversion element PD including a selenium-based material can be a highly sensitive sensor in which the amount of amplification of electrons is large because of avalanche multiplication. In other words, the use of a selenium-based material for the photoelectric conversion layer 561 allows a sufficient amount of photocurrent to be obtained even when the pixel area is reduced. Thus, the photoelectric conversion element PD including a selenium-based material is also suitable for imaging in a low-illuminance environment.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to visible light and light-absorption coefficient for visible light than those of amorphous selenium.

Figure 6A:
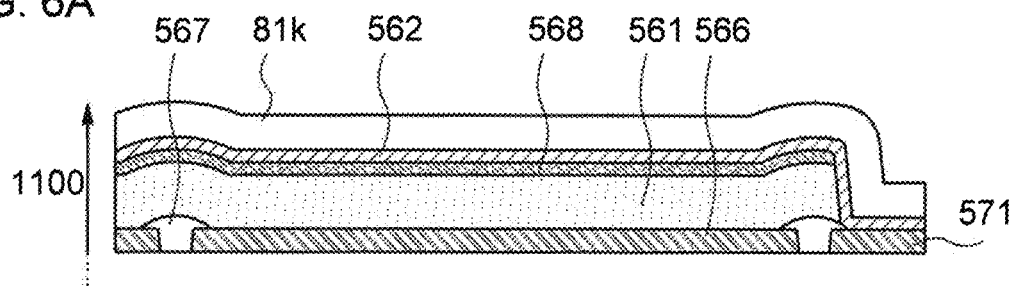
FIGS. 6A to 6E are cross-sectional views each illustrating a connection configuration of a photoelectric conversion element.
Figure 6B:
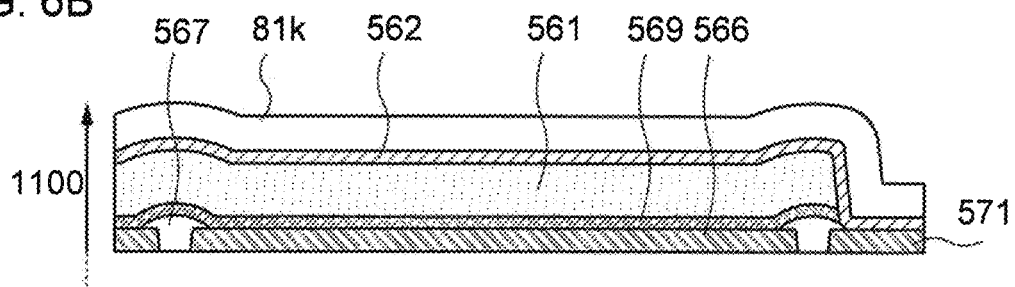
Figure 6C:
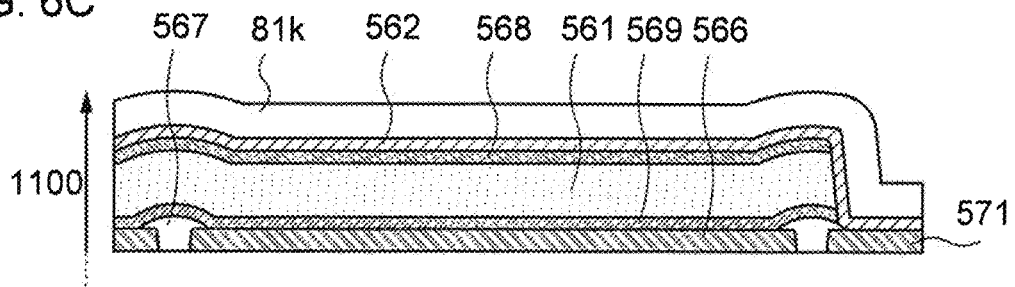

Although the photoelectric conversion layer 561 is a single layer in FIG. 5, gallium oxide, cerium oxide, an In—Ga—Zn oxide, or the like may be provided as a hole-blocking layer 568 on a light-receiving surface side as illustrated in FIG. 6A. Alternatively, as illustrated in FIG. 6B, nickel oxide, antimony sulfide, or the like may be provided as an electron injection blocking layer 569 on the electrode 566 side. Alternatively, as illustrated in FIG. 6C, the hole-blocking layer 568 and the electron injection blocking layer 569 may be provided.

The photoelectric conversion layer 561 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize avalanche multiplication like the photoelectric conversion element including a layer of selenium alone.

In the photoelectric conversion element PD using the selenium-based material, for example, the photoelectric conversion layer 561 can be provided between the electrode 566 formed using a metal material or the like and the light-transmitting conductive layer 562. Furthermore, CIS and CIGS are p-type semiconductors, and an n-type semiconductor such as cadmium sulfide or zinc sulfide may be provided in contact with the p-type semiconductor in order to form a junction.

Figure 6D:
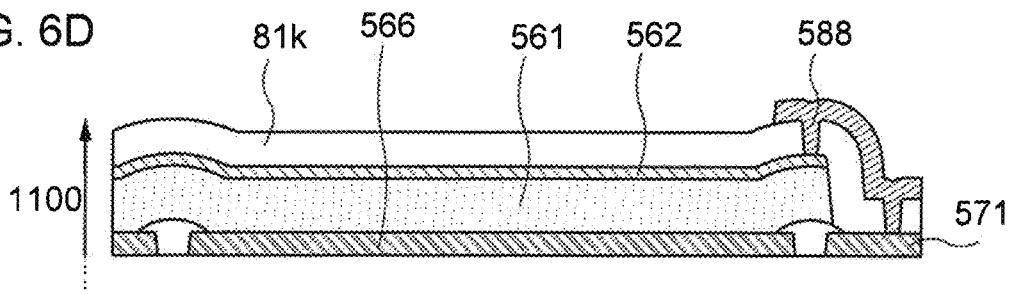
Figure 6E:
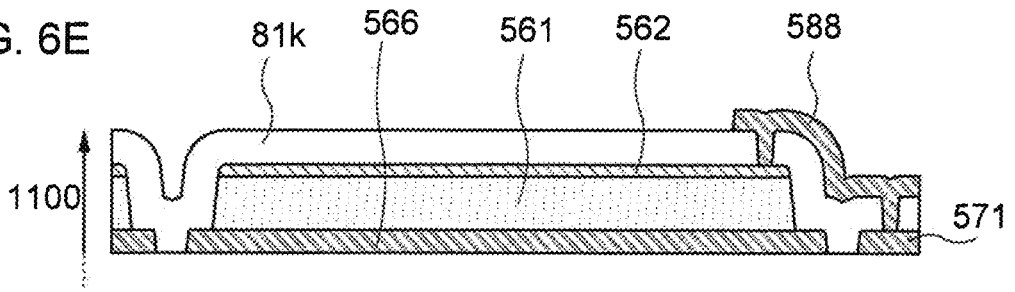
Figure 7A:
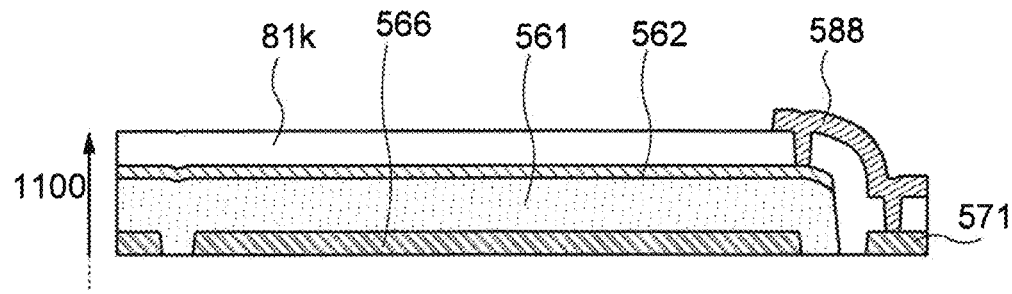
FIGS. 7A to 7D are cross-sectional views each illustrating a connection configuration of a photoelectric conversion element.
Figure 7B:
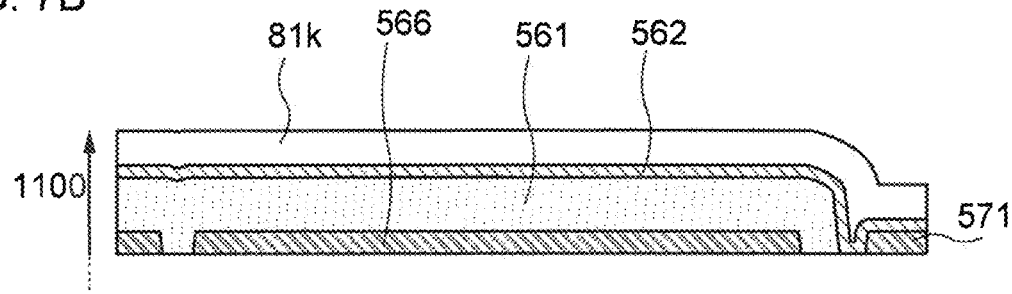

Although the light-transmitting conductive layer 562 is directly in contact with the wiring 571 in FIG. 5, they may be in contact with each other through a wiring 588 as illustrated in FIG. 6D. Although the photoelectric conversion layer 561 and the light-transmitting conductive layer 562 are not divided between pixel circuits in FIG. 5, they may be divided between circuits as illustrated in FIG. 6E. In a region between pixels where the electrode 566 is not provided, the partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIGS. 7A and 7B.

Figure 7C:
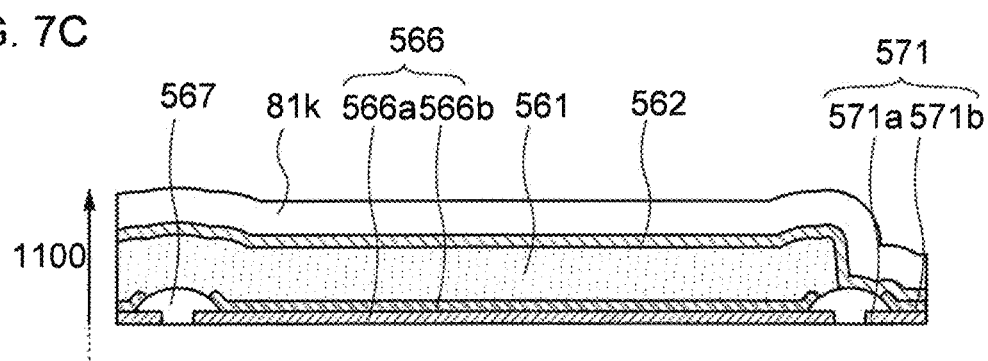

The electrode 566, the wiring 571, and the like may be a multilayer. For example, as illustrated in FIG. 7C, the electrode 566 can include two conductive layers 566a and 566b and the wiring 571 can include two conductive layers 571a and 571b. In the structure in FIG. 7C, for example, the conductive layers 566a and 571a may be made of a low-resistance metal or the like, and the conductive layers 566b and 571b may be made of a metal or the like that exhibits an excellent contact property with the photoelectric conversion layer 561. Such a structure improves the electrical properties of the photoelectric conversion element PD. Note that some kinds of metal may cause electrochemical corrosion by being in contact with the light-transmitting conductive layer 562. Even when such a metal is used in the conductive layer 571a, electrochemical corrosion can be prevented by the conductive layer 571b.

The conductive layers 566b and 571b can be formed using, for example, molybdenum, tungsten, or the like. The conductive layers 566a and 571a can be formed using, for example, aluminum, titanium, or a stack of titanium, aluminum, and titanium that are stacked in that order.

Figure 7D:
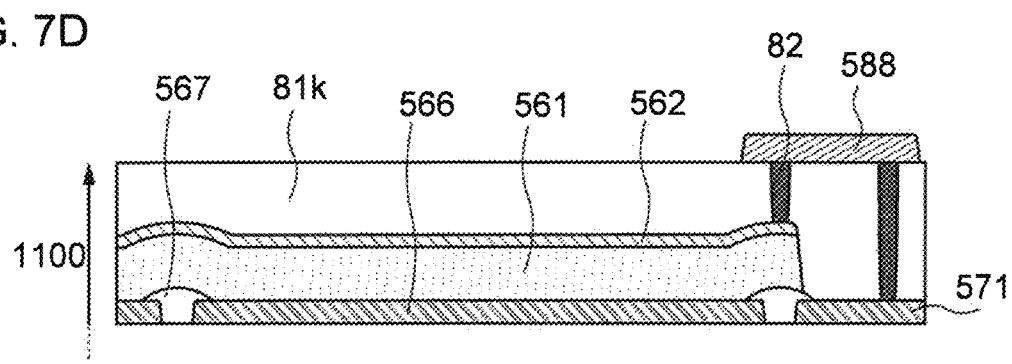

As illustrated in FIG. 7D, the light-transmitting conductive layer 562 may be connected to the wiring 571 through the conductor 82 and the wiring 588.

The partition wall 567 can be formed using an inorganic insulator, an insulating organic resin, or the like. The partition wall 567 may be colored black or the like in order to shield the transistors and the like from light and/or to determine the area of a light-receiving portion in each pixel.

Figure 8A:
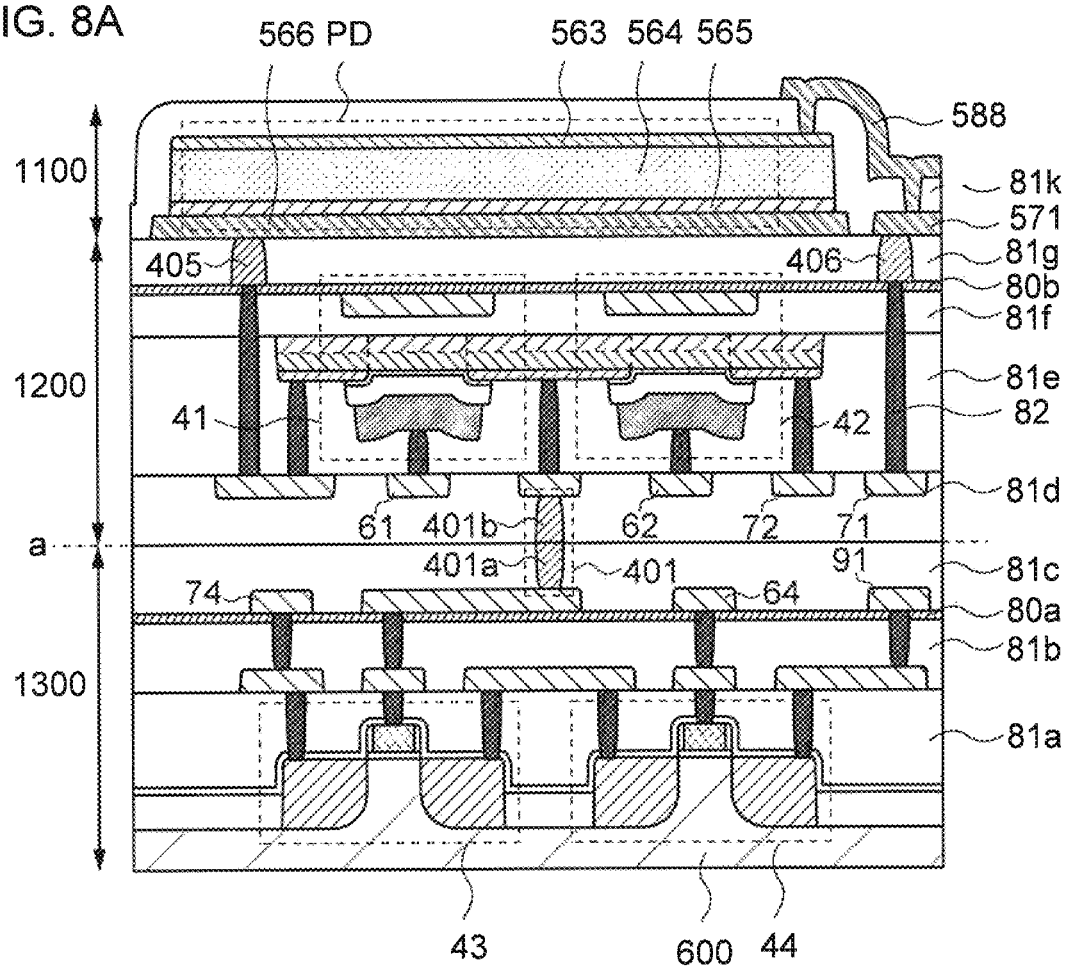
FIGS. 8A to 8D are a cross-sectional view illustrating a structure of an imaging device and cross-sectional views each illustrating a connection configuration of a photoelectric conversion element.

Alternatively, the pixel 20 may have a stacked structure illustrated in FIG. 8A. The pixel 20 in FIG. 8A is different from the pixel 20 in FIG. 3A only in the structure of the layer 1100 and the other structures are the same.

In FIG. 8A, the photoelectric conversion element PD included in the layer 1100 is a PIN photodiode using an amorphous silicon film or a microcrystalline silicon film in a photoelectric conversion layer. The photoelectric conversion element PD may include an n-type semiconductor layer 565, an i-type semiconductor layer 564, a p-type semiconductor layer 563, the electrode 566, the wiring 571, and the wiring 588.

The electrode 566 is electrically connected to the metal layer 405. The p-type semiconductor layer 563 is electrically connected to the metal layer 406 through the wirings 588 and 571. The metal layers 405 and 406 are provided to penetrate the insulating layer 81g.

The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

Figure 8B:
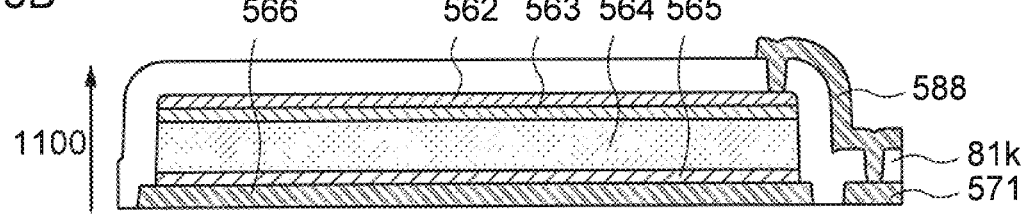
Figure 8C:
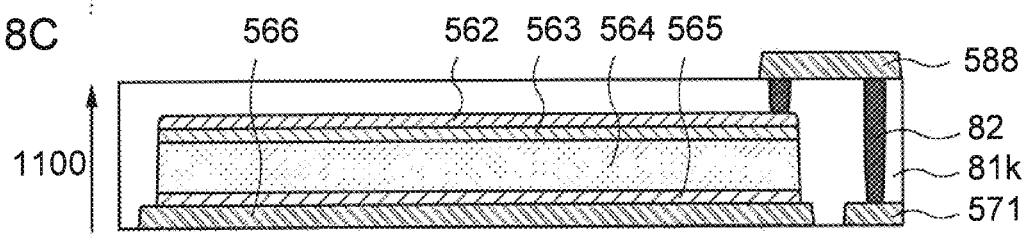
Figure 8D:
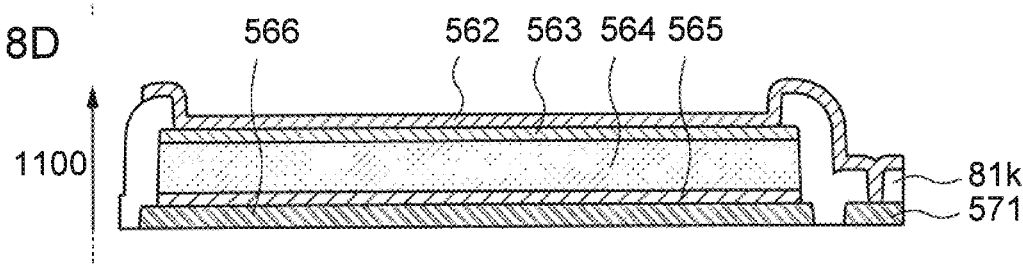

FIGS. 8B to 8D show other examples of the structure of the photoelectric conversion element PD having a structure of a PIN thin film photodiode and the connection configuration between the photoelectric conversion element PD and the wirings. Note that the structure and the connection configuration are not limited to the above examples, and other configurations may be applied.

FIG. 8B illustrates a structure of the photoelectric conversion element PD that includes the light-transmitting conductive layer 562 in contact with the p-type semiconductor layer 563. The light-transmitting conductive layer 562 serves as an electrode and can increase the output current of the photoelectric conversion element PD.

For the light-transmitting conductive layer 562, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; graphene oxide; or the like. The light-transmitting conductive layer 562 is not limited to a single layer, and may be a stacked layer of different films.

In the structure of FIG. 8C, the light-transmitting conductive layer 562 and the wiring 571 are connected to each other through the conductor 82 and the wiring 588. Note that the p-type semiconductor layer 563 of the photoelectric conversion element PD and the wiring 571 may be connected to each other through the conductor 82 and the wiring 588. In the structure of FIG. 8C, the light-transmitting conductive layer 562 is not necessarily provided.

FIG. 8D illustrates a structure in which an opening exposing the p-type semiconductor layer 563 is provided in an insulating layer 81k covering the photoelectric conversion element PD, and the light-transmitting conductive layer 562 covering the opening is electrically connected to the wiring 571.

The photoelectric conversion element PD including the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 561 does not need to be divided between circuits as illustrated in FIG. 5. Therefore, the imaging device in one embodiment of the present invention can be manufactured with a high yield at low cost.

Note that the photoelectric conversion element PD included in the pixel 20 in FIG. 5 and FIG. 8A is a stack of thin films; thus, the photoelectric conversion element PD is preferably formed after the bonding step.

Figure 9:
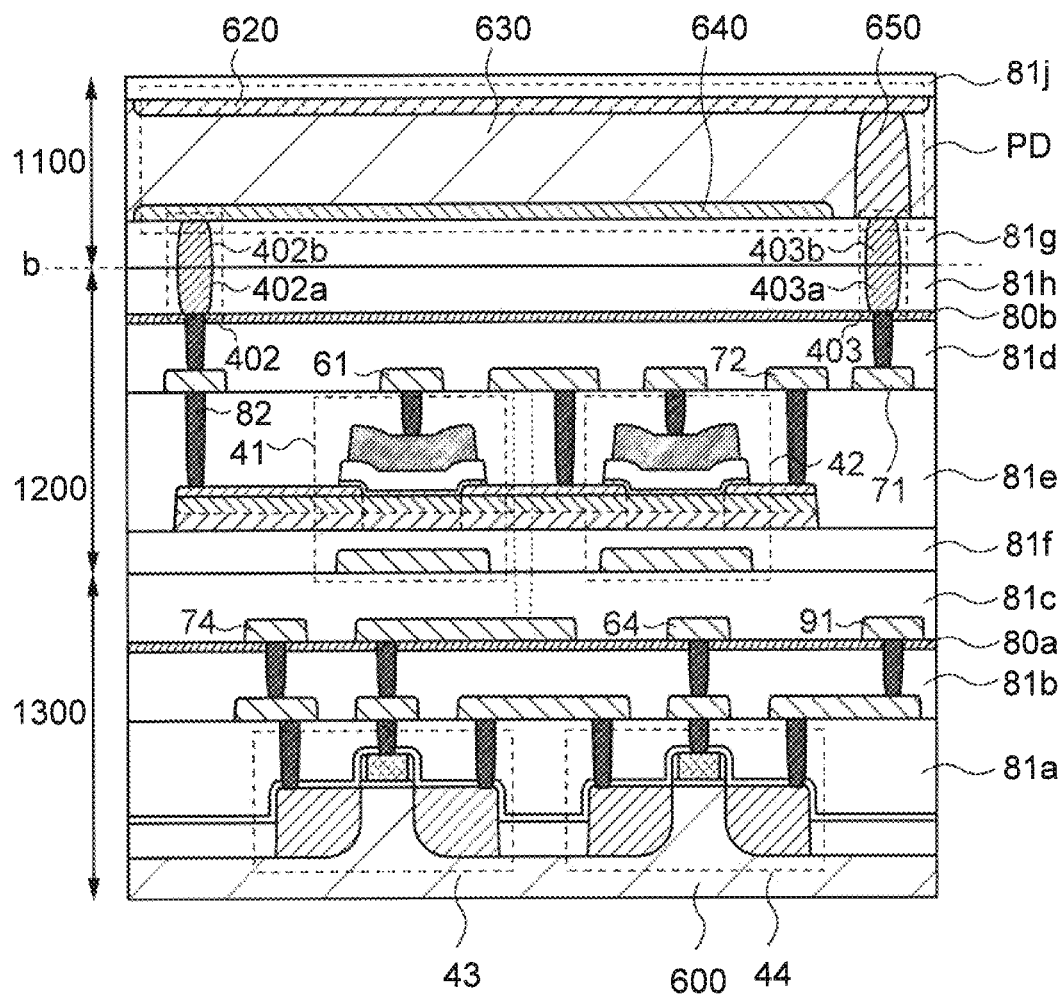
FIG. 9 is a cross-sectional view illustrating a structure of an imaging device.

Alternatively, the pixel 20 may have a stacked structure illustrated in FIG. 9. In the pixel 20 in FIG. 9, the layer 1200 is formed over the layer 1300 and the layer 1200 and the layer 1100 which are formed separately are bonded to each other at a bonding portion b. That is, a bonding portion of metal layers is provided between the layers 1300 and 1200 in a stacked structure in FIG. 3A and between the layers 1200 and 1100 in a stacked structure in FIG. 9.

In FIG. 9, the photoelectric conversion element PD included in the layer 1100 is a PN photodiode using a single crystal silicon substrate. The photoelectric conversion element PD may include the p⁺ region 620, the p⁻ region 630, the n-type region 640, and the p⁺ region 650.

The n-type region 640 is electrically connected to the metal layer 402b. The p⁺ region 650 is electrically connected to the metal layer 403b. The metal layers 405 and 406 are provided to penetrate an insulating layer 81g.

The metal layers 402a and 403a are provided in the layer 1200. The metal layer 402a includes a region embedded in an insulating layer 81h and the metal layer 402a is electrically connected to one of the source and the drain of the transistor 41 through the conductive layer, the conductor 82, or the like. The metal layer 403a includes a region embedded in an insulating layer 81h and the metal layer 403a is electrically connected to the wiring 71 through the conductor 82.

The transistors 43 and 44 which are Si transistors are provided in the layer 1300. The gate of the transistor 43 is electrically connected to the other of the source and the drain of the transistor 41 and one of the source and the drain of the transistor 42 through the conductive layer, the conductor 82, or the like.

Figure 10:
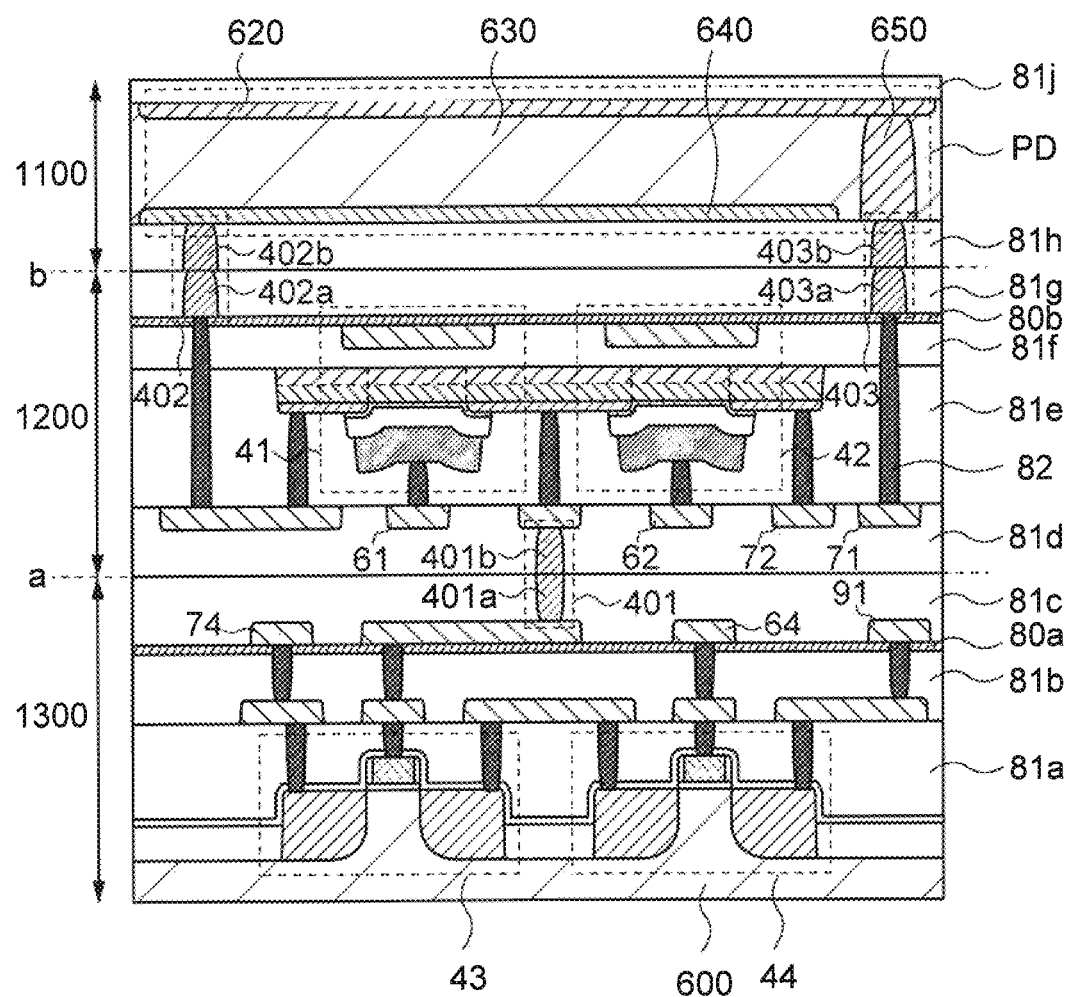
FIG. 10 is a cross-sectional view illustrating a structure of an imaging device.

Alternatively, the pixel 20 may have a structure illustrated in FIG. 10. In the pixel in FIG. 10, the layers 1300, 1200 and 1100 are formed separately and the layers 1300 and 1200 are bonded to each other at the bonding portion a and the layers 1200 and 1100 are bonded to each other at the bonding portion b. That is, bonding portions of metal layers are provided between the layers 1300 and 1200 and between the layers 1200 and 1100.

In FIG. 10, the photoelectric conversion element PD included in the layer 1100 is a PN photodiode using a single crystal silicon substrate. The photoelectric conversion element PD may include the p⁺ region 620, the p⁻ region 630, the n-type region 640, and the p⁺ region 650.

The n-type region 640 is electrically connected to a metal layer 402b. The p⁺ region 650 is electrically connected to a metal layer 403b. The metal layers 402a and 403b are provided penetrating an insulating layer 81g.

The metal layers 401b, 402a, and 403a are provided in the layer 1200. The metal layer 401b includes a region embedded in the insulating layer 81d and the metal layer 401b is electrically connected to the other of the source and the drain of the transistor 41 and one of the source and the drain of the transistor 42 through the conductive layer, the conductor 82, or the like. The metal layer 402a includes a region embedded in an insulating layer 81g and the metal layer 402a is electrically connected to one of the source and the drain of the transistor 41 through the conductive layer, the conductor 82, or the like. The metal layer 403a includes a region embedded in an insulating layer 81g and the metal layer 403a is electrically connected to the wiring 71 through the conductor 82.

The metal layer 401a is provided in the layer 1300. The metal layer 401a includes a region embedded in an insulating layer 81c and the metal layer 401a is electrically connected to one of the source and the drain of the transistor 41 through the conductive layer, the conductor 82, or the like.

An example of the method for fabricating the stacked structure in FIG. 3A will be described with reference to FIGS. 11A1, 11A2, and 11A3.

First, the layer 1300 including the insulating layer 81c and the metal layer 401a in the uppermost layer is formed (see FIG. 11A1). The metal layer 401a may be formed using the following method, for example: a through-hole reaching a wiring layer electrically connected to the gate electrode of the transistor 43 is formed in the insulating layer 81c, a metal layer is provided by a CVD method, a plating method, or the like so as to fill the through-hole, and an surplus metal layer is removed by polishing surface thereof. Alternatively, the following method may be used: the metal layer 401a is formed in advance by a CVD method, a sputtering method, or the like, the insulating layer 81c is formed to cover the metal layer 401a, and the top surface of the metal layer 401a is exposed by polishing the surface of the insulating layer 81c. In any of the methods, a level difference between the metal layer 401a and the insulating layer 81c is preferably reduced as much as possible by flattening the entire surface of each layer by a CMP method or the like.

Next, the photoelectric conversion element PD is formed and the layer 1200 including the insulating layer 81d and the metal layer 401b in the uppermost layer is formed over the photoelectric conversion element PD.

The photoelectric conversion element PD is formed by, for example, forming an impurity region in a single crystal silicon substrate 670 by a diffusion method, a doping method, or the like. Then, components such as an OS transistor are electrically connected to each other to be formed and the insulating layer 81d and the metal layer 401b are formed in the uppermost layer of the photoelectric conversion element PD. The metal layer 401b can be formed in a manner similar to that of the metal layer 401a and the surfaces of the insulating layer 81d and the metal layer 401b are planarized by a CMP method or the like.

Then, the aforementioned treatment before bonding is performed on the planarized surfaces of the layers 1300 and 1200. Subsequently, bonding is performed after positioning so that the metal layers 401a and 401b are in contact with each other and the metal layers 401a and 401b and the insulating layers 81c and 81d are bonded to each other by an appropriate process (see FIG. 11A2).

After bonding, an unnecessary region of the single crystal silicon substrate 670 is polished to expose a light-receiving surface of the photoelectric conversion element PD and a protective film such as an insulating layer is formed as necessary (see FIG. 11A3). Through the above steps, the stacked structure in FIG. 3A is completed.

Note that polishing of the single crystal silicon substrate 670 may be performed before the bonding step or forming an OS transistor. In this case, polishing is preferably performed using a peelable adhesive or the like and a support substrate as appropriate.

An example of the method for fabricating the stacked structure in FIG. 5 and FIG. 8A will be described with reference to FIGS. 11B1, 11B2, 11B3, and 11B4. Note that the aforementioned fabricating method of the pixel 20 in FIG. 3A can be referred to for the fabricating method of the layer 1300 and the bonding step of the layers 1300 and 1200.

First, the layer 1300 including the insulating layer 81c and the metal layer 401a is formed in the uppermost layer (see FIG. 11B1).

Next, a separation layer 1800 is provided over a flat support substrate 1700 such as a glass substrate or a semiconductor substrate, and the layer 1200 including the insulating layer 81d and the metal layer 401b in the uppermost layer is formed over the separation layer 1800.

The separation layer 1800 can be formed using a stack of a tungsten film and a silicon oxide film, for example. The stack is thermally stable; therefore, separation can be performed in the vicinity of the interface between the tungsten film and the silicon oxide film by applying a physical force after the manufacturing process of the transistors. Alternatively, a polyimide film may be used as the separation layer 1800. In the case of using a polyimide film, a light-transmitting substrate is preferably used. Accordingly, the polyimide film is made to be fragile by a light such as laser light emitted from a light-transmitting substrate side and separation can be performed after the manufacturing process of the transistors. Alternatively, a thermally stable peelable adhesive or the like may be used as the separation layer 1800.

Then, bonding of the layers 1300 and 1200 is performed (see FIG. 11B2).

After bonding, a stack of the layers 1300 and 1200 is separated from the support substrate 1700. When part of the separation layer remains over the surface of the layer 1200, part of the separation layer is removed by washing, etching, or the like to expose the surfaces of the metal layers 405 and 406 (see FIG. 11B3 and FIG. 3A).

Subsequently, the layer 1100 including the photoelectric conversion element PD is formed over the layer 1200 (see FIG. 11B4). Through the above steps, the stacked structure in FIG. 5 or FIG. 8A is completed.

An example of the method for fabricating the stacked structure in FIG. 9 will be described with reference to FIGS. 12A1, 12A2, 12A3, and 12A4. Note that the fabricating method of the stacked structure in FIG. 3A can be referred to for the fabricating method of the metal layers at a bonding portion and the bonding method thereof.

First, the layer 1300 is formed (see FIG. 12A1) and the layer 1200 including the insulating layer 81h and the metal layers 402a and 403a in the uppermost layer is formed over the layer 1300 (see FIG. 12A2). Then, the components included in the layers 1300 and 1200 are electrically connected to each other as necessary.

Next, the layer 1200 and the single crystal silicon substrate 670 in which the photoelectric conversion element PD is provided are bonded to each other and the metal layers 402a and 402b, the metal layers 403a and 403b, and the insulating layers 81h and 81g are bonded to each other (see FIG. 12A3).

After bonding, an unnecessary region of the single crystal silicon substrate 670 is polished to expose the light-receiving surface of the photoelectric conversion element PD and a protective film such as an insulating layer is formed as necessary (see FIG. 12A4). Through the above steps, the layer 1100 can be formed and the stacked structure in FIG. 9 is completed.

Note that polishing of the single crystal silicon substrate 670 may be performed before the bonding step. In this case, polishing is preferably performed using a peelable adhesive or the like and a support substrate as appropriate.

An example of the method for fabricating the stacked structure in FIG. 10 will be described with reference to FIGS. 12B1, 12B2, 12B3, 12B4 and 12B5. Note that the fabricating method of the stacked structure in FIG. 3A can be referred to for the fabricating method and the bonding method of the metal layers at a bonding portion.

First, the layer 1300 including the insulating layer 81c and the metal layer 401a in the uppermost layer is formed (see FIG. 12B1).

Next, the separation layer 1800 is provided over the flat support substrate 1700 such as a glass substrate or a semiconductor substrate, and the layer 1200 including the insulating layer 81g and the metal layers 402a and 403a in the lowermost layer and including the insulating layer 81d and the metal layer 401b in the uppermost layer is formed over the separation layer 1800.

Then, bonding of the layers 1300 and 1200 will be performed (see FIG. 12B2).

After bonding, a stack of the layers 1300 and 1200 is separated from the support substrate 1700. When part of the separation layer remains over the surface of the layer 1200, part of the separation layer is removed by washing, etching, or the like to expose the surfaces of the metal layers 402a and 403a (see FIG. 12B3).

Next, the layer 1200 and the single crystal silicon substrate 670 in which the photoelectric conversion element PD is provided are bonded to each other and the metal layers 402a and 402b, the metal layers 403a and 403b, and the insulating layers 81h and 81g are bonded to each other (see FIG. 12B4).

After bonding, an unnecessary region of the single crystal silicon substrate 670 is polished to expose the light-receiving surface of the photoelectric conversion element PD and a protective film such as an insulating layer is formed as necessary (see FIG. 12B5). Through the above steps, the layer 1100 can be formed and the stacked structure in FIG. 10 is completed.

Note that polishing of the single crystal silicon substrate 670 may be performed before the bonding step. In this case, polishing is preferably performed using a peelable adhesive or the like and a support substrate as appropriate.

Alternatively, in an imaging device of one embodiment of the present invention, a circuit different from a pixel circuit can be provided by Si transistors formed in the layer 1300. Examples of the circuit include a driver circuit such as a column driver and a row driver, a data converter circuit such as an A/D converter, a noise reduction circuit such as a CDS circuit, and a control circuit of a whole imaging device.

Figure 13:
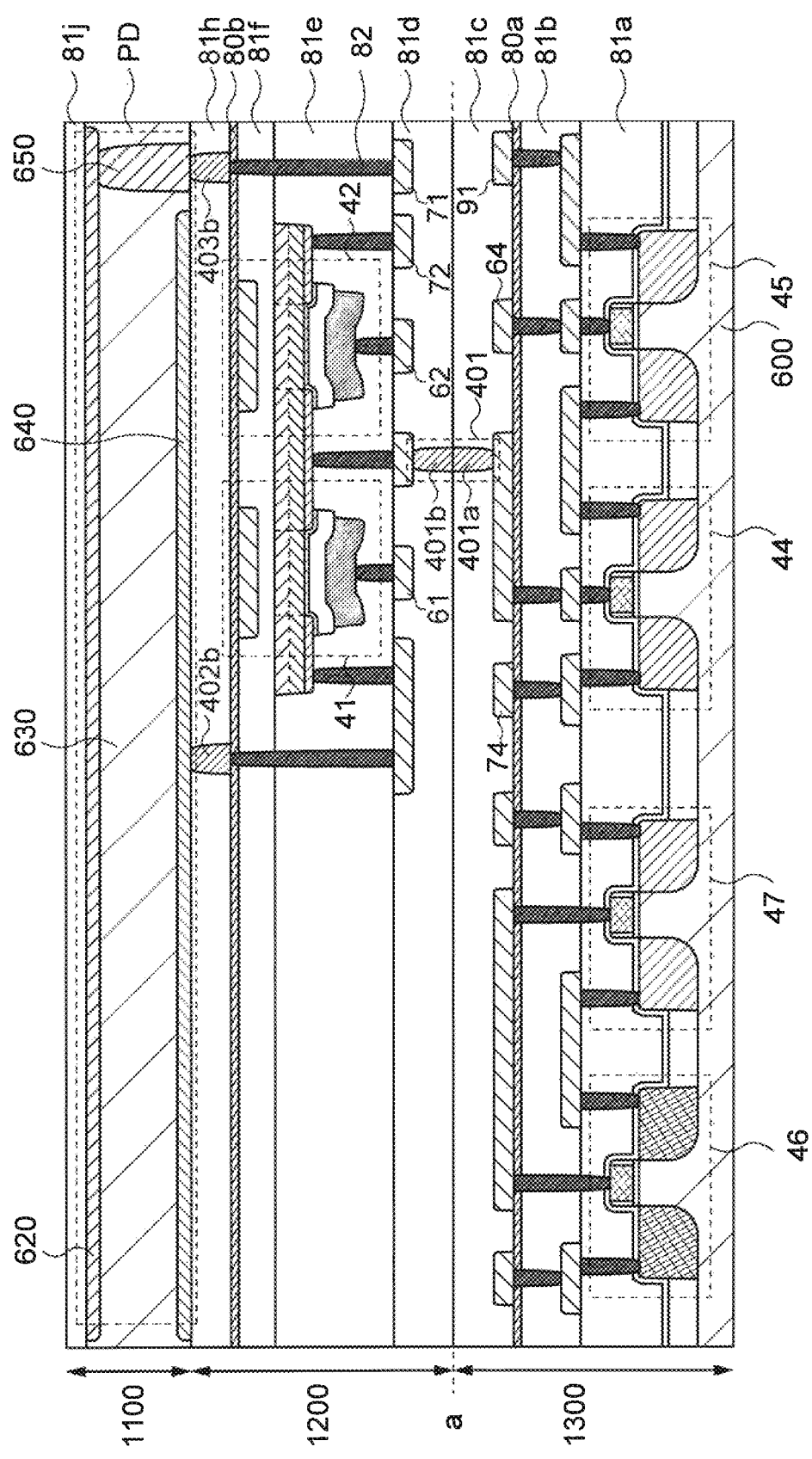
FIG. 13 is a cross-sectional view illustrating a structure of an imaging device.

A transistor 46 and a transistor 47 included in any of the above circuits are illustrated in FIG. 13. The transistors 46 and 47 can be formed in a region overlapping with the photoelectric conversion element PD. Alternatively, one or both of the transistors 46 and 47 may be formed in a region overlapping with one or both of the transistors 41 and 42. That is, the above circuit is formed in a region overlapping with the pixel 20. Note that although a structure example of a CMOS inverter where the transistor 46 is a p-channel transistor and the transistor 47 is an n-channel transistor is illustrated in FIG. 13, another circuit configuration may also be employed.

Figure 14:
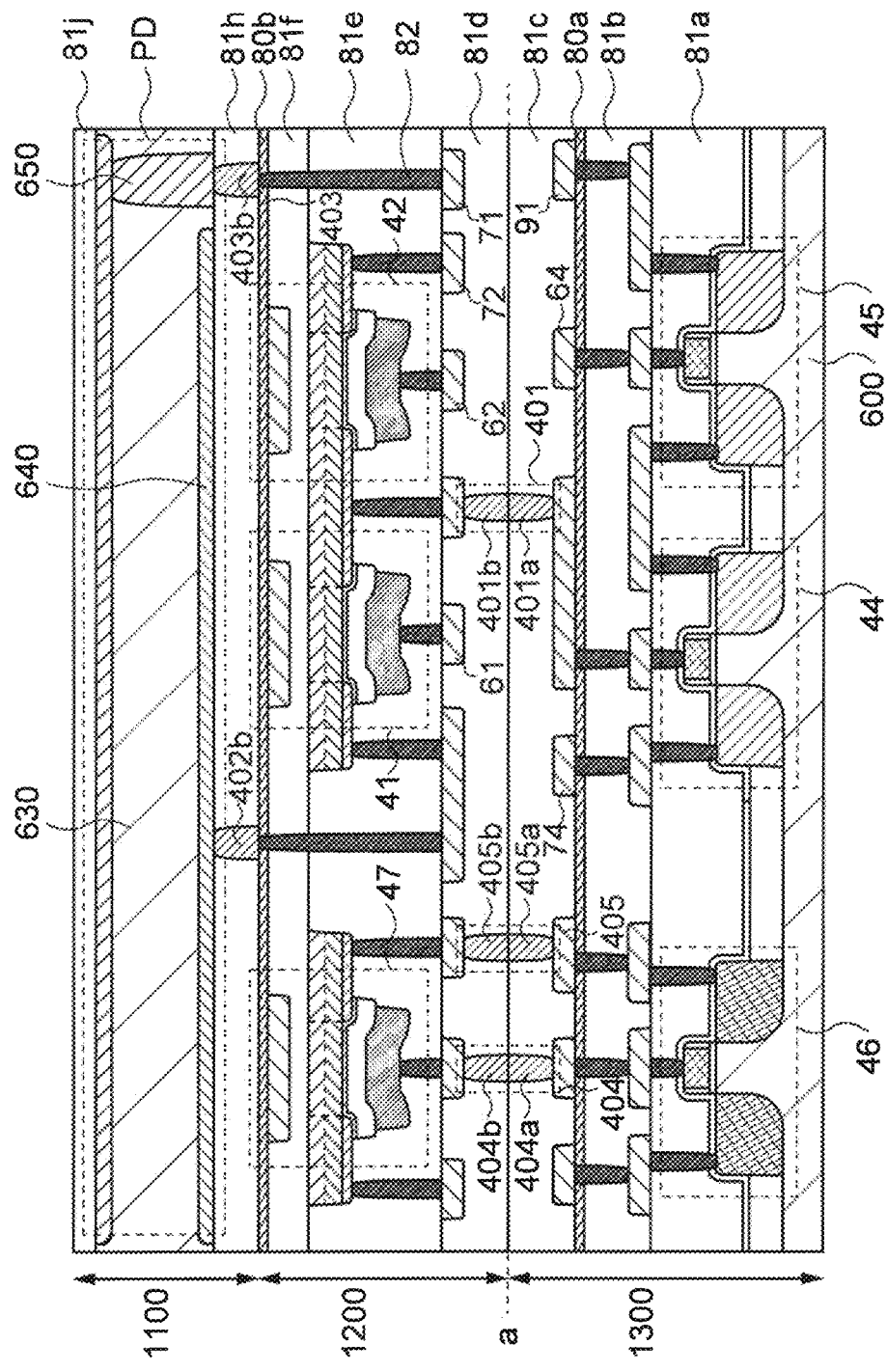
FIG. 14 is a cross-sectional view illustrating a structure of an imaging device.

Alternatively, as illustrated in FIG. 14, the transistor 47 may be an OS transistor provided in the layer 1200. In the configuration illustrated in FIG. 14, the transistors 46 and 47 can be provided in a region overlapping with each other in a bonding step, so that the area of the circuit can be reduced. In addition, when p-channel transistors are formed as the transistors 44 and 45 included in the pixel 20, all the transistors provided over a single-crystal silicon substrate 600 can be p-channel transistors; thus, forming of n-channel Si transistors can be omitted.

Note that although FIG. 13 and FIG. 14 each illustrate the stacked structure in which the transistors 46 and 47 are added to the pixel 20 in FIG. 3A, the transistors 46 and 47 can also be added to the pixel 20 in FIG. 5, FIG. 9, or FIG. 10.

Figure 15A:
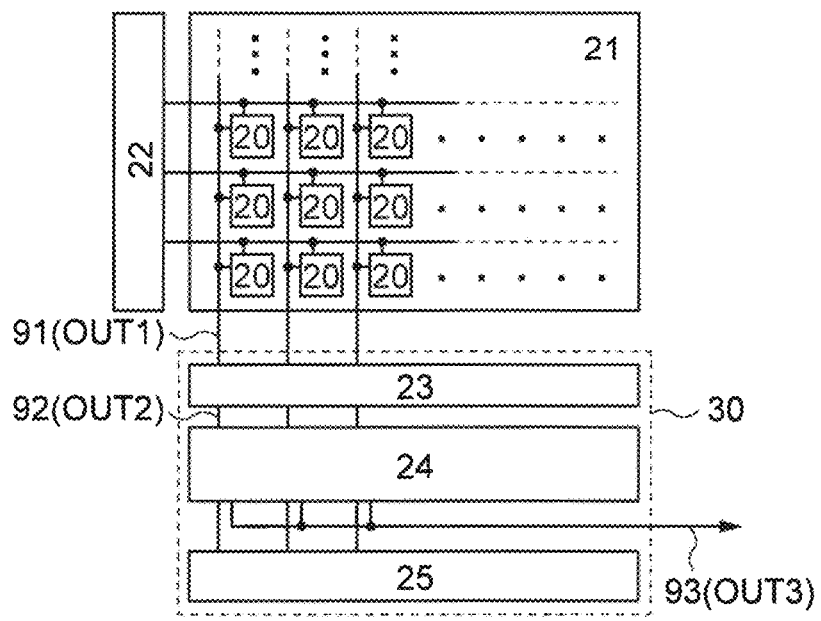
FIGS. 15A and 15B are a block diagram illustrating an imaging device, a circuit diagram of a CDS circuit, and a block diagram of an A/D converter circuit.

FIG. 15A is a block diagram illustrating a circuit configuration of an imaging device of one embodiment of the present invention. The imaging device includes a pixel array 21 including the pixels 20 arranged in a matrix, a circuit 22 (row driver) having a function of selecting a row of the pixel array 21, a circuit 23 (CDS circuit) for performing correlated double sampling (CDS) on an output signal of the pixel 20, a circuit 24 (A/D converter circuit or the like) having a function of converting analog data output from the circuit 23 to digital data, and a circuit 25 (column driver) having a function of selecting and reading data converted in the circuit 24. Note that a configuration not including the circuit 23 can be employed. Furthermore, the circuits 23 to 25 are collectively referred to as a circuit 30.

Figure 15B:
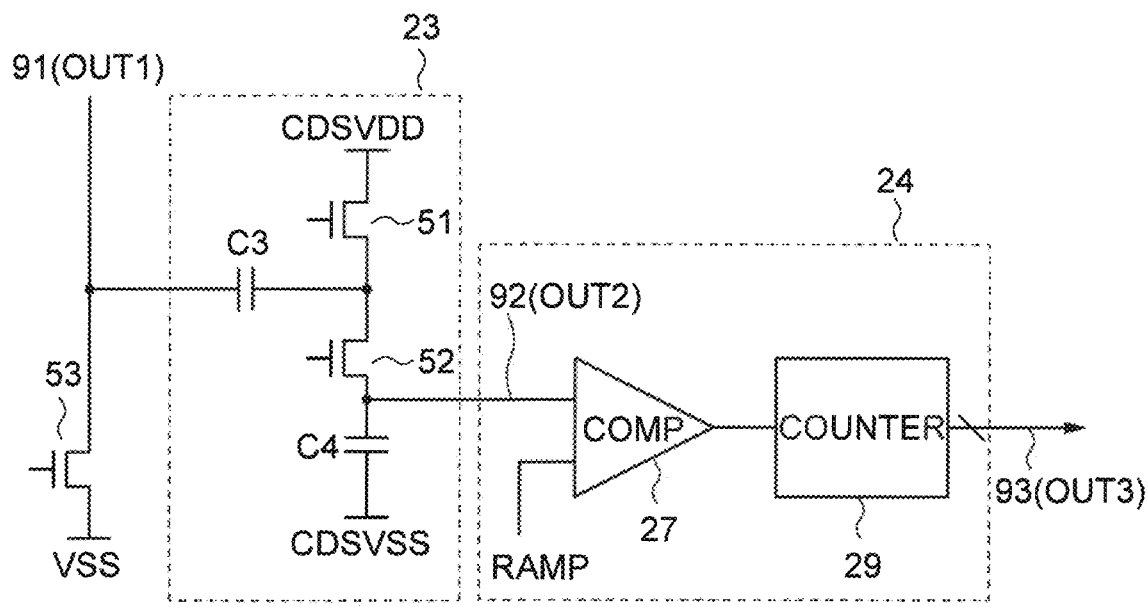

FIG. 15B illustrates a circuit diagram of the circuit 23 and a block diagram of the circuit 24; the circuit 23 and the circuit 24 are connected to one column of the pixel array 21. The circuit 23 can include a transistor 51, a transistor 52, a capacitor C3, and a capacitor C4. Furthermore, the circuit 24 can include a comparator circuit 27 and a counter circuit 29.

A transistor 53 serves as a current supply circuit. The wiring 91 (OUT1) is electrically connected to one of a source and a drain of the transistor 53, and a power supply line is connected to the other of the source and the drain of the transistor 53. As the power supply line, a low potential power supply line (VSS) can be used, for example. Bias voltage is always applied to a gate of the transistor 53.

In the circuit 23, one of a source and a drain of the transistor 51 is electrically connected to one of a source and a drain of the transistor 52. One of the source and the drain of the transistor 51 is electrically connected to one electrode of the capacitor C3. The other of the source and the drain of the transistor 52 is electrically connected to one electrode of the capacitor C4. The other of the source and the drain of the transistor 52 is electrically connected to a wiring 92 (OUT2). The other of the source and the drain of the transistor 51 is electrically connected to a high potential power supply line (CDSVDD) through which a reference potential is supplied, for example. The other electrode of the capacitor C4 is electrically connected to a low potential power supply line (CDSVSS), for example.

An operation example of the circuit 23 when the circuit 23 is connected to the pixel in FIG. 1B will be described. First, the transistors 51 and 52 are turned on. Next, the potential of imaging data is output from the pixel 20 to the wiring 91 (OUT1), and the reference potential (CDSVDD) is held in the wiring 92 (OUT2). Then, the transistor 51 is turned off and a reset potential (here, a potential higher than the potential of the imaging data, for example, a VDD potential) is output from the pixel 20 to the wiring 91 (OUT1). At this time, the potential of the wiring 92 (OUT2) is a value obtained by adding the absolute value of a difference between the potential of the imaging data and the reset potential to the reference potential (CDSVDD). Thus, a potential signal with little noise that is obtained by adding the net potential of the imaging data to the reference potential (CDSVDD) can be supplied to the circuit 24.

In the case where the reset potential is lower than the potential of the imaging data (for example, in the case where the reset potential is a potential GND or the like), the potential of the wiring 92 (OUT2) is a value obtained by subtracting the absolute value of the difference between the potential of the imaging data and the reset potential from the reference potential (CDSVDD).

In the circuit 24, a signal potential that is input from the circuit 23 to the comparator circuit 27 and a reference potential (RAMP) that is swept to be increased or decreased are compared. Then, in accordance with the output of the comparator circuit 27, the counter circuit 29 operates to output a digital signal to a wiring 93 (OUT3).

In an imaging device of one embodiment of the present invention, a stacked structure of the pixel array 21 and a circuit portion 35 including the circuit 30 can be employed. For example, a stacked structure as illustrated in the perspective view in FIG. 16C, which includes the pixel array 21 having the top view in FIG. 16A and the circuit portion 35 having the top view in FIGS. 16B1 and 16B2 can be obtained. With such a structure, transistors suitable for respective elements can be used, and the area of the imaging device can be reduced. Note that the layouts of the circuit in FIGS. 16B1 and 16B2 are examples, and another layout may be used. Although a control circuit 26 is provided in the circuit portion 35, the control circuit 26 may be provided outside the circuit portion 35.

FIG. 16B1 illustrates a structure where the circuits 22 and 30 are divided into two parts and placed not at the edge portion but near the center. Shift register circuits included in the circuits 22 and 30 may be operated independently in divided portions or operated as one shift register circuit.

The circuits 22 and 30 in FIG. 16B2 are divided into two parts in a manner similar to that in FIG. 16B1 but placed obliquely.

With the structure illustrated in FIG. 16B1 or 16B2, loads of the wirings connected to the pixel 20 can be reduced as compared with the case where the circuits 22 and 30 are placed at the edge portion. Although the loads of the wirings are not uniform, it does not matter when wiring capacity and wiring resistance are small.

To achieve both a high-speed operation and the configuration of a CMOS circuit, the circuits 22 and 30 are preferably formed using transistors including silicon (hereinafter, referred to as Si transistors). For example, the circuit portion 35 can be formed over a silicon substrate. The pixel array 21 is preferably formed using transistors including an oxide semiconductor (hereinafter, referred to as OS transistors). Note that some transistors included in the circuits 22 and 30 may be formed using OS transistors.

Figure 17A:
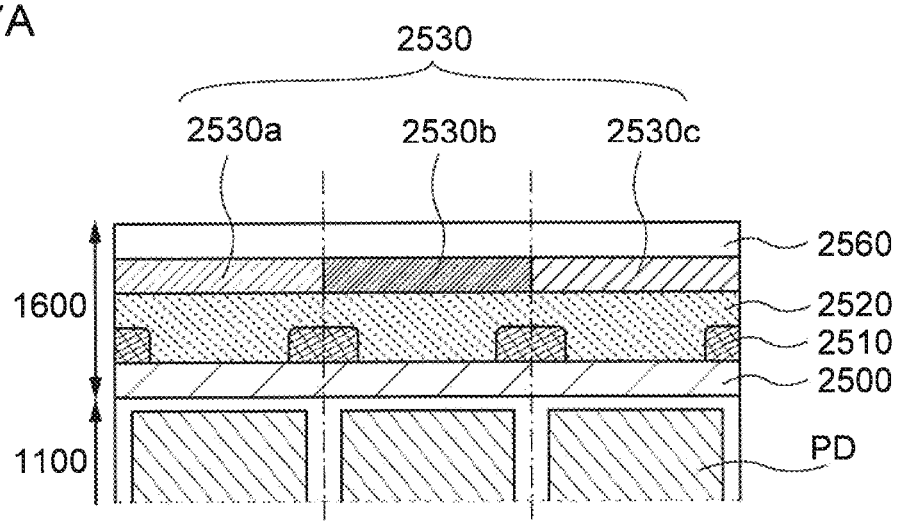
FIGS. 17A to 17D are cross-sectional views each illustrating a structure of an imaging device.

FIG. 17A is a cross-sectional view of an example of a mode in which a color filter and the like are added to an imaging device. The cross-sectional view illustrates part of a region including pixel circuits for three pixels. An insulating layer 2500 is formed over the layer 1100 where the photoelectric conversion element PD is formed. As the insulating layer 2500, a silicon oxide film or the like with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through an upper color filter. The light-blocking layer 2510 can be formed of a metal layer of aluminum, tungsten, or the like, or a stack of the metal layer and a dielectric film functioning as an anti-reflection film.

An organic resin layer 2520 can be provided as a planarization film over the insulating layer 2500 and the light-blocking layer 2510. A color filter 2530 (a color filter 2530a, a color filter 2530b, and a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 17B:
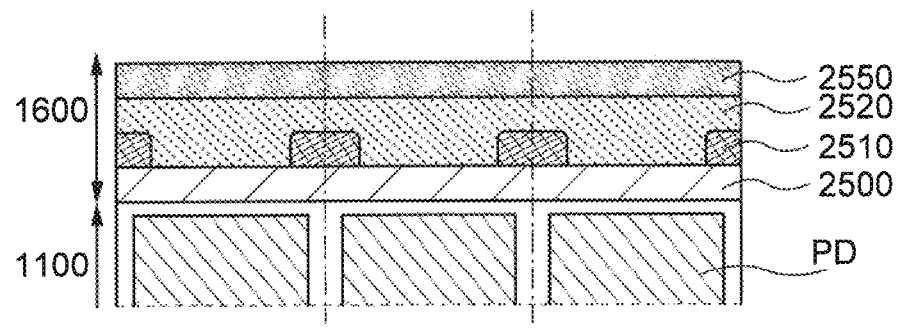

As illustrated in FIG. 17B, an optical conversion layer 2550 may be used instead of the color filter 2530. Such a structure enables an imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far-infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that takes an image visualizing the intensity of radiations and is used for an X-ray imaging device or the like can be obtained. Radiation such as X-rays passes through an object to enter a scintillator, and then is converted into light (fluorescence) such as visible light or ultraviolet light owing to a phenomenon known as photoluminescence. Then, the photoelectric conversion element PD detects the light to obtain image data. Furthermore, the imaging device having the structure may be used in a radiation detector or the like.

A scintillator is formed of a substance that, when irradiated with radiation such as X-rays or gamma-rays, absorbs energy of the radiation to emit visible light or ultraviolet light. For example, a resin or ceramics in which any of $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, and $ZnO$ is dispersed can be used.

Figure 47A:
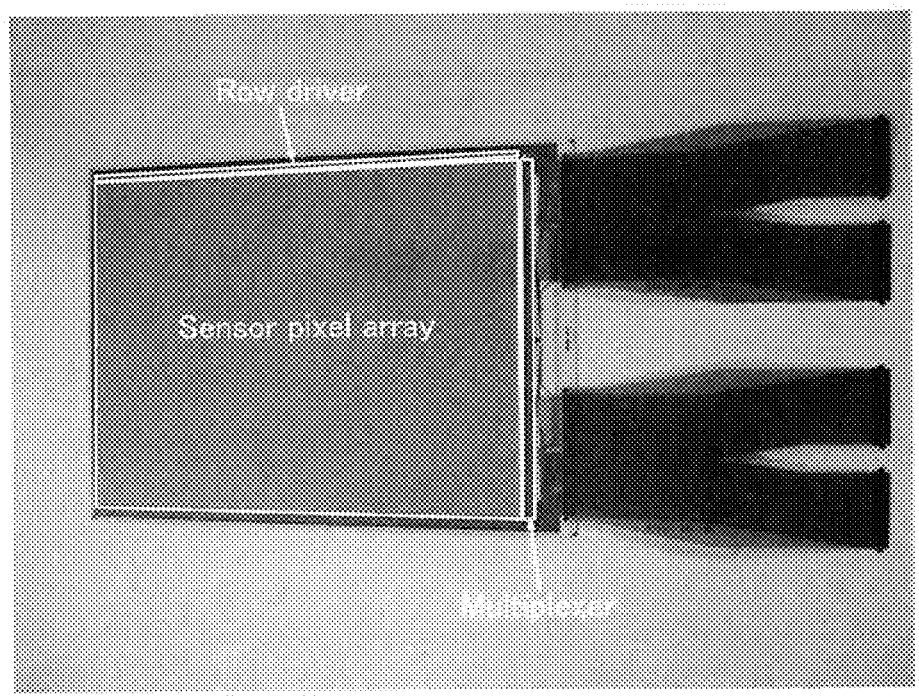
FIGS. 47A and 47B are a photograph showing the appearance of an X-ray imaging panel and a photograph obtained by X-ray imaging.

FIG. 47A is a photograph of an X-ray imaging panel fabricated using an OS transistor. The panel size is 100.5 mm×139 mm, the number of pixels is 384×512, the pixel size is 120 μm×120 μm, the resolution is 106 ppi, and amorphous silicon is used for a photodiode. In addition, a row driver for selecting a pixel and a multiplexer for controlling an output signal are incorporated in the panel.

Figure 47B:
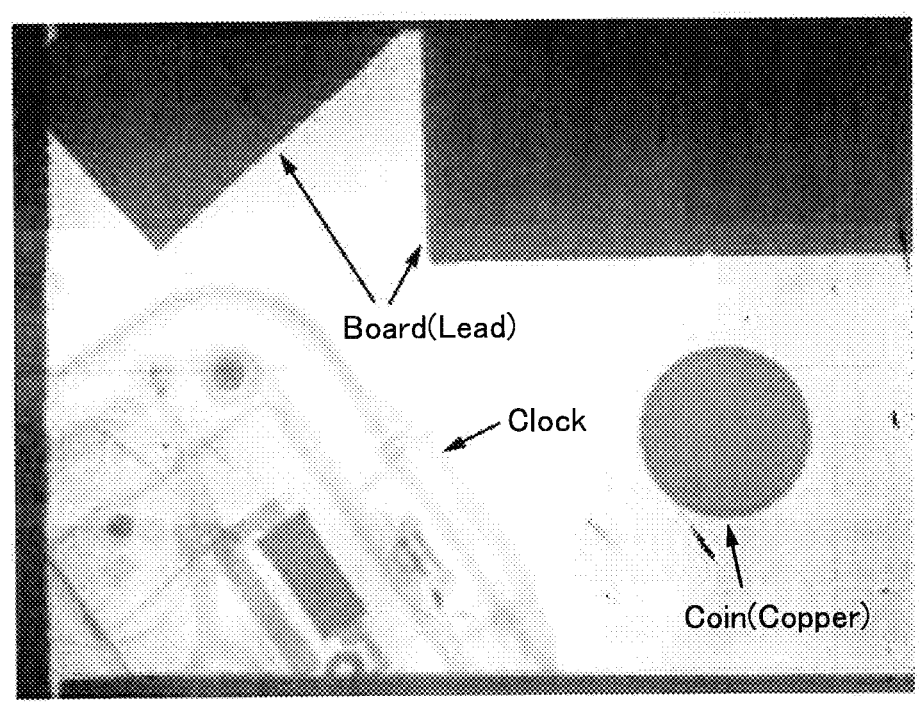

FIG. 47B is a photograph obtained by X-ray imaging captured with the X-ray imaging panel to which a scintillator ($Gd_2O_2S:Tb$) is added. A lead board, a coin of copper, and a clock whose exterior is a resin are placed on the panel and irradiated with X-rays from above to obtain an image. The scintillator does not emit light under the lead board which blocks X-rays, so that the photograph is black. The photograph under the coin of copper which transmits X-rays more easily than lead is gray. In addition, the clock whose exterior is a resin transmits X-rays; therefore, an image of inside metal components is taken.

In the photoelectric conversion element PD using a selenium-based material, radiation such as X-rays can be directly converted into charge; thus, the scintillator is not necessarily used.

Figure 17C:
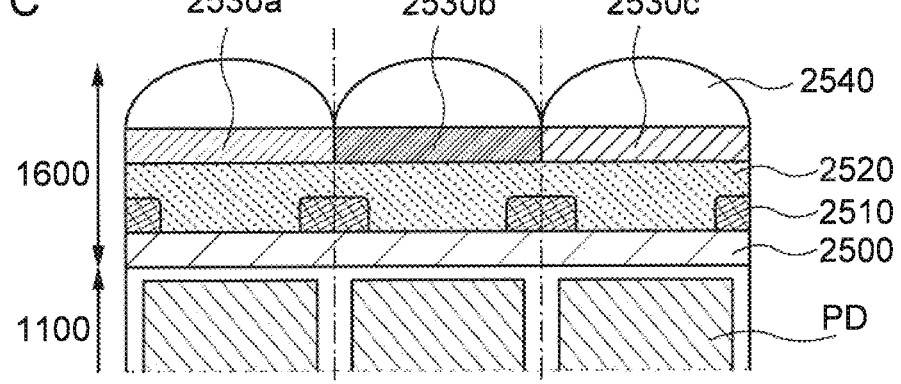
Figure 17D:
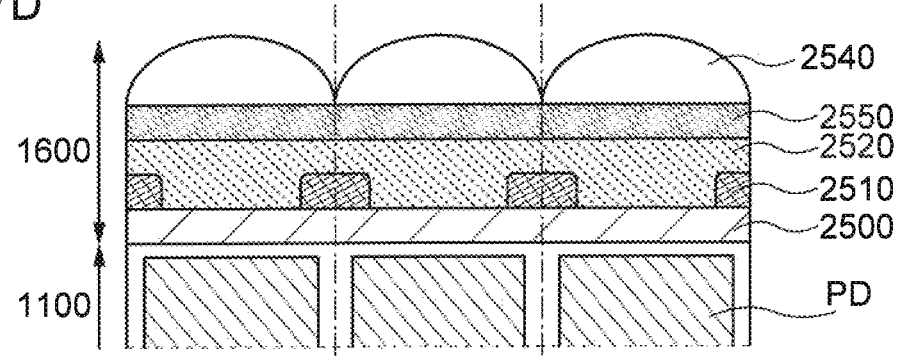

Alternatively, as illustrated in FIG. 17C, a microlens array 2540 may be provided over the color filters 2530a, 2530b, and 2530c. Light penetrating lenses included in the microlens array 2540 goes through the color filters positioned thereunder to reach the photoelectric conversion element PD. Alternatively, as illustrated in FIG. 17D, the microlens array 2540 may be provided over the optical conversion layer 2550. Note that a region other than the layer 1100 in FIGS. 17A to 17D is referred to as a layer 1600.

Figure 18:
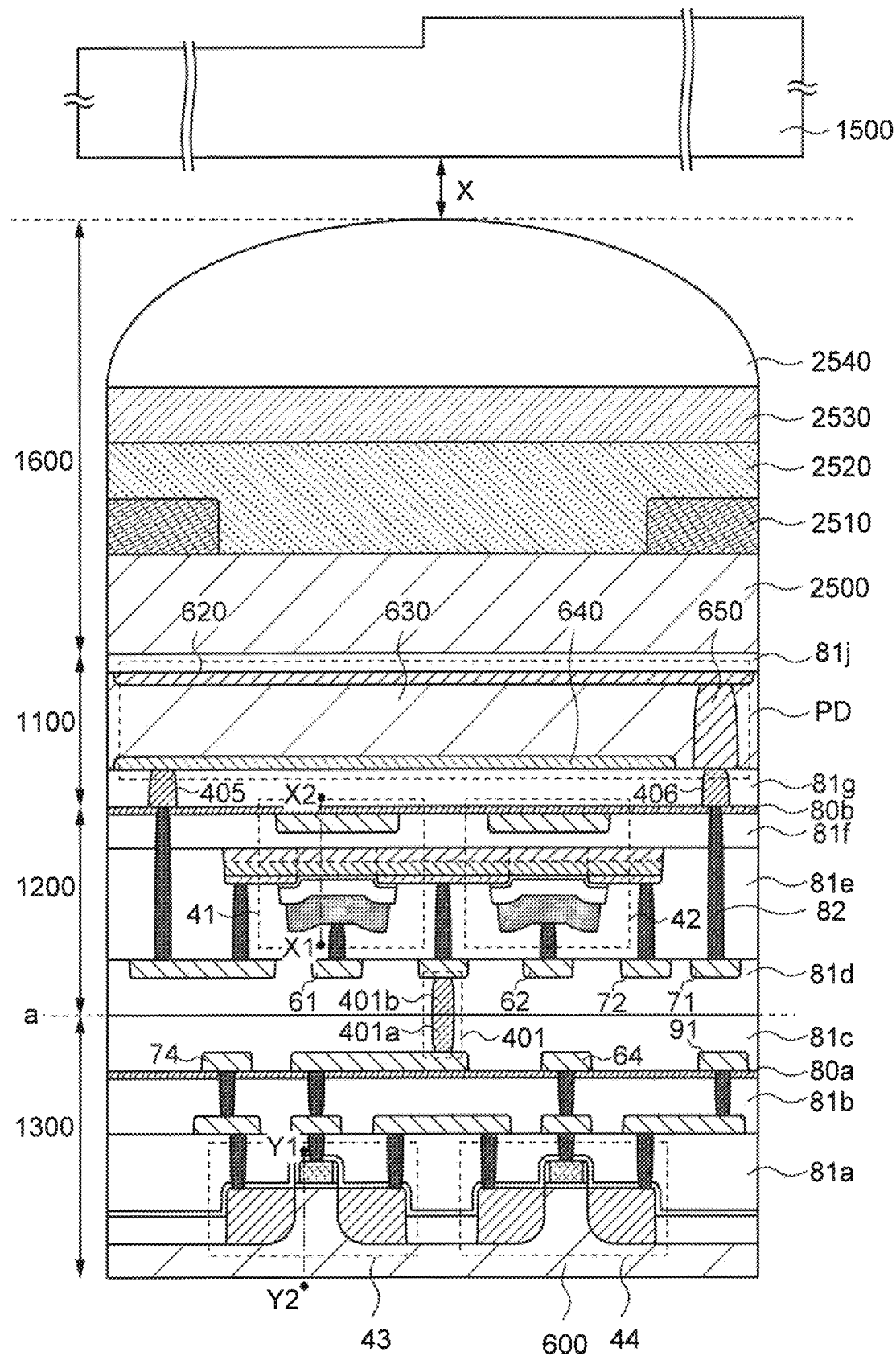
FIG. 18 is a cross-sectional view illustrating a structure of an imaging device.

FIG. 18 illustrates a specific example of a stacked structure of the pixel 20 of one embodiment of the present invention, the microlens array 2540 illustrated in FIG. 17C, and the like. In the example illustrated in FIG. 18, the structure of the pixel 20 illustrated in FIG. 3A is used. In the example illustrated in FIG. 19, the structure of the pixel illustrated in FIG. 9 is used.

The photoelectric conversion element PD and the circuit of the pixel 20 can be positioned so as to overlap with each other in this manner, leading to a reduction in the size of the imaging device.

Figure 19:
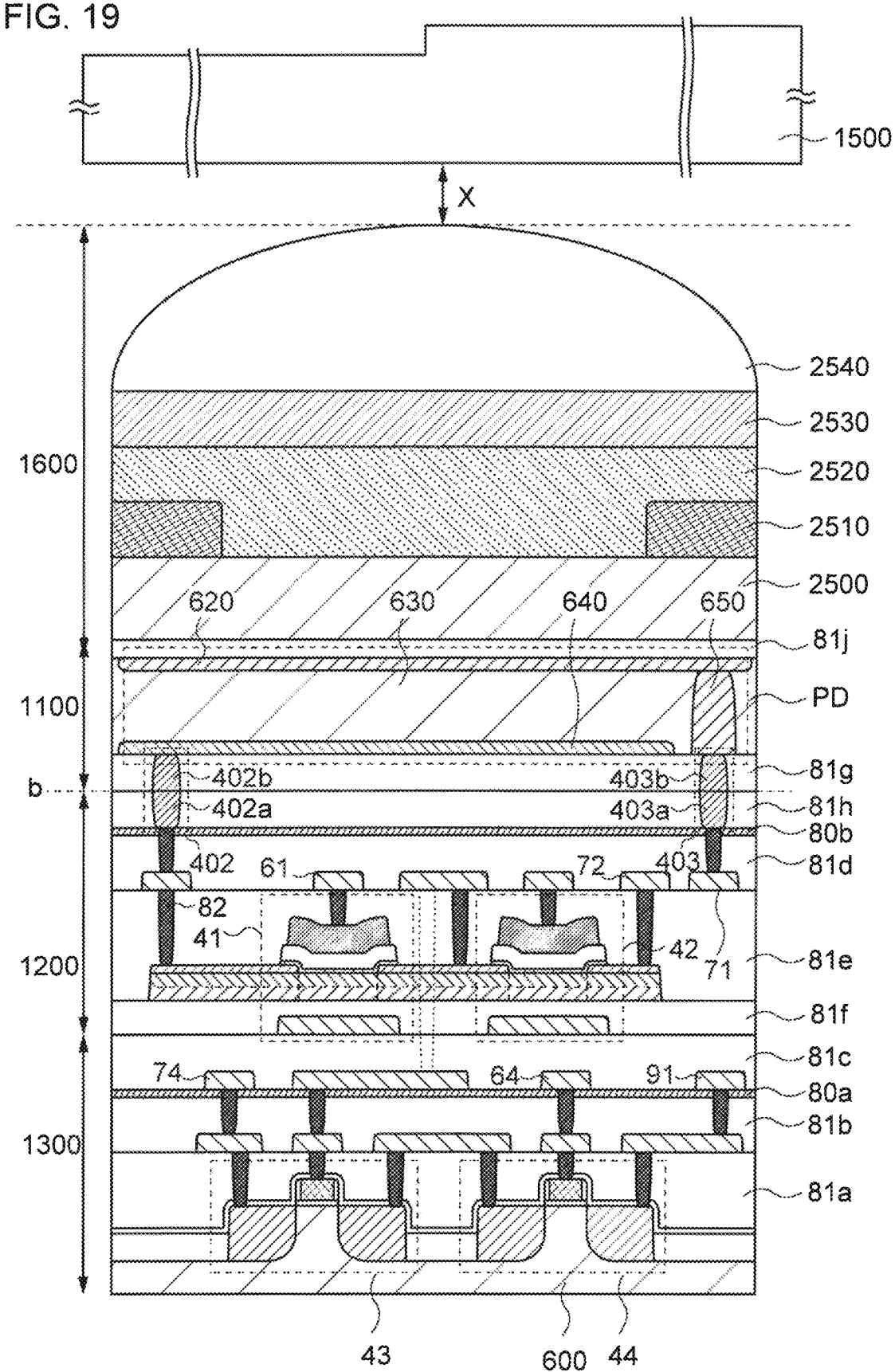
FIG. 19 is a cross-sectional view illustrating a structure of an imaging device.

As illustrated in FIG. 18 and FIG. 19, a diffraction grating 1500 may be provided above the microlens array 2540. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of electronic devices or the like including the imaging device.

The diffraction grating 1500 can be formed using a light-transmitting material. For example, an inorganic insulating film such as a silicon oxide film or a silicon oxynitride film can be used. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

A space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

Figure 20B:
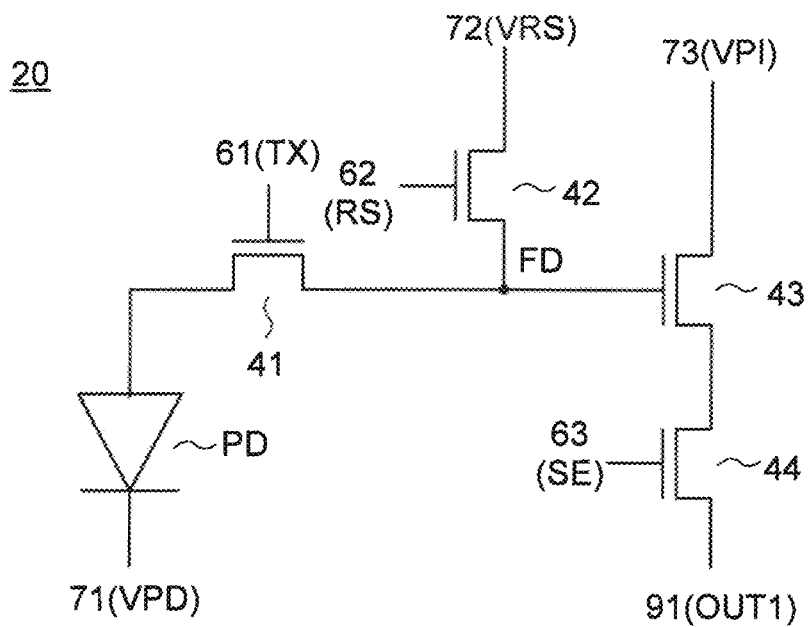

The pixel 20 may have a circuit configuration illustrated in FIG. 20B. The connection direction of the photoelectric conversion element PD in the pixel 20 in FIG. 20B is different from that in the pixel 20 in FIG. 1A. In this case, the pixel 20 can be operated when the potentials of the wiring 71 (VPD) and the wiring 72 (VRS) in the description of the circuit in FIG. 1B are reversed.

Figure 21A:
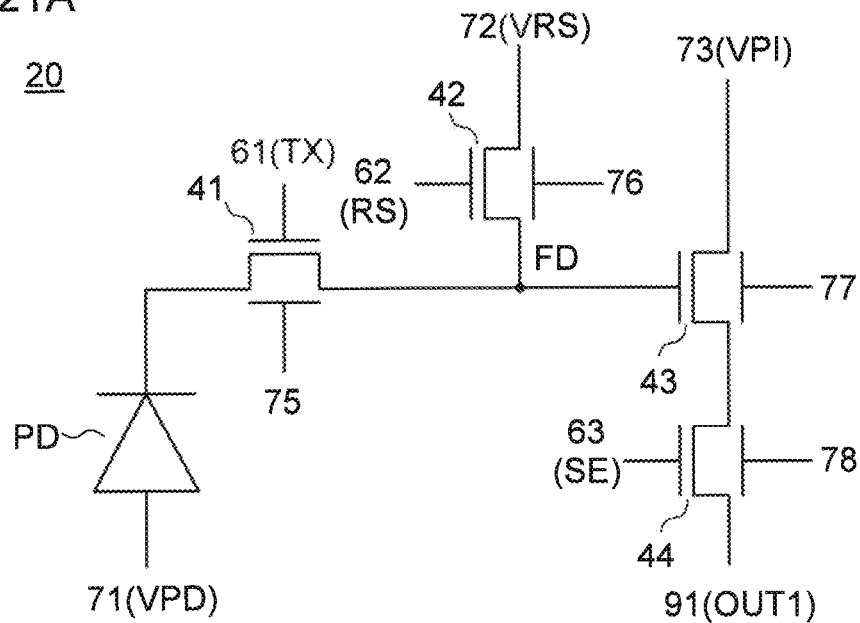
FIGS. 21A to 21C are circuit diagrams each illustrating a pixel.

The transistors 41 to 44 in the pixel 20 may each have a back gate as illustrated in FIG. 21A. FIG. 21A illustrates a configuration of applying a constant potential to the back gates, which enables control of the threshold voltages.

Figure 21B:
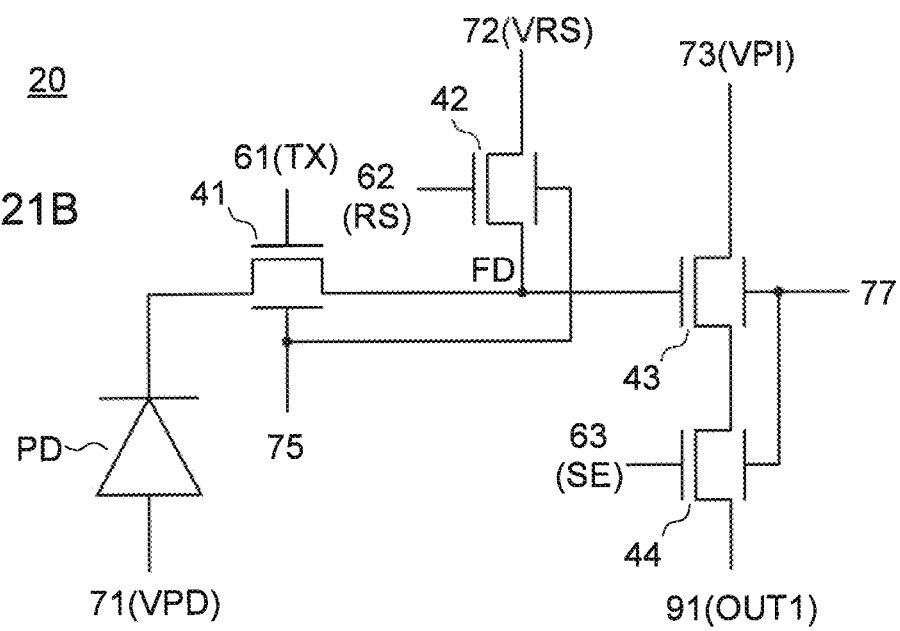

Wirings 75 to 78 connected to the respective back gates can be supplied with a different potential separately. Alternatively, as illustrated in FIG. 21B, the wirings connected to the respective back gates of the transistors 41 and 42 may be electrically connected to each other. The wirings connected to the back gates of the transistors 43 and 44 may be electrically connected to each other.

In n-channel transistors, the threshold voltage is shifted in a positive direction when a potential lower than a source potential is applied to a back gate. In contrast, the threshold voltage is shifted in a negative direction when a potential higher than a source potential is applied to a back gate. Therefore, in the case where on/off of each of the transistors is controlled by the predetermined gate voltage, the off-state current can be reduced when a potential lower than a source potential is applied to a back gate and the on-state current can be reduced when a potential higher than a source potential is applied to a back gate.

The node FD is desired to have high potential retention capability in the circuits in FIG. 1, FIGS. 20A and 20B, and FIGS. 21A and 21B, so that OS transistors with a low off-state current are preferably used for the transistors 41 and 42 as described above. The off-state current can be reduced when a potential lower than a source potential is applied to the back gates of the transistors 41 and 42. Therefore, the node FD can have high potential retention capability.

As described above, Si transistors with a high on-state current are preferably used for the transistors 43 and 44. The on-state current can be increased when a potential higher than a source potential is applied to the back gates of the transistors 43 and 44. Therefore, a reading potential output to the wiring 91 (OUT1) can be defined immediately, that is, the transistors 43 and 44 can be operated at high frequency.

Figure 21C:
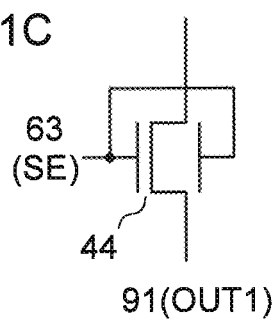

Note that the same potential may be applied to a front gate and the back gate of the transistor 44 as illustrated in FIG. 21C. Alternatively, the transistors 43 and 44 may not be Si transistors but OS transistors. Although the on-state current of the OS transistor is relatively low, the on-state current can be increased by providing a back gate, so that the OS transistor can be operated at high frequency.

A plurality of potentials such as a signal potential and a potential applied to the back gate are used inside an imaging device besides power supply potentials. Supply of a plurality of potentials from the outside of an imaging device increases the number of terminals; thus, an imaging device preferably has a power supply circuit generating a plurality of potentials inside the imaging device.

Figure 22:
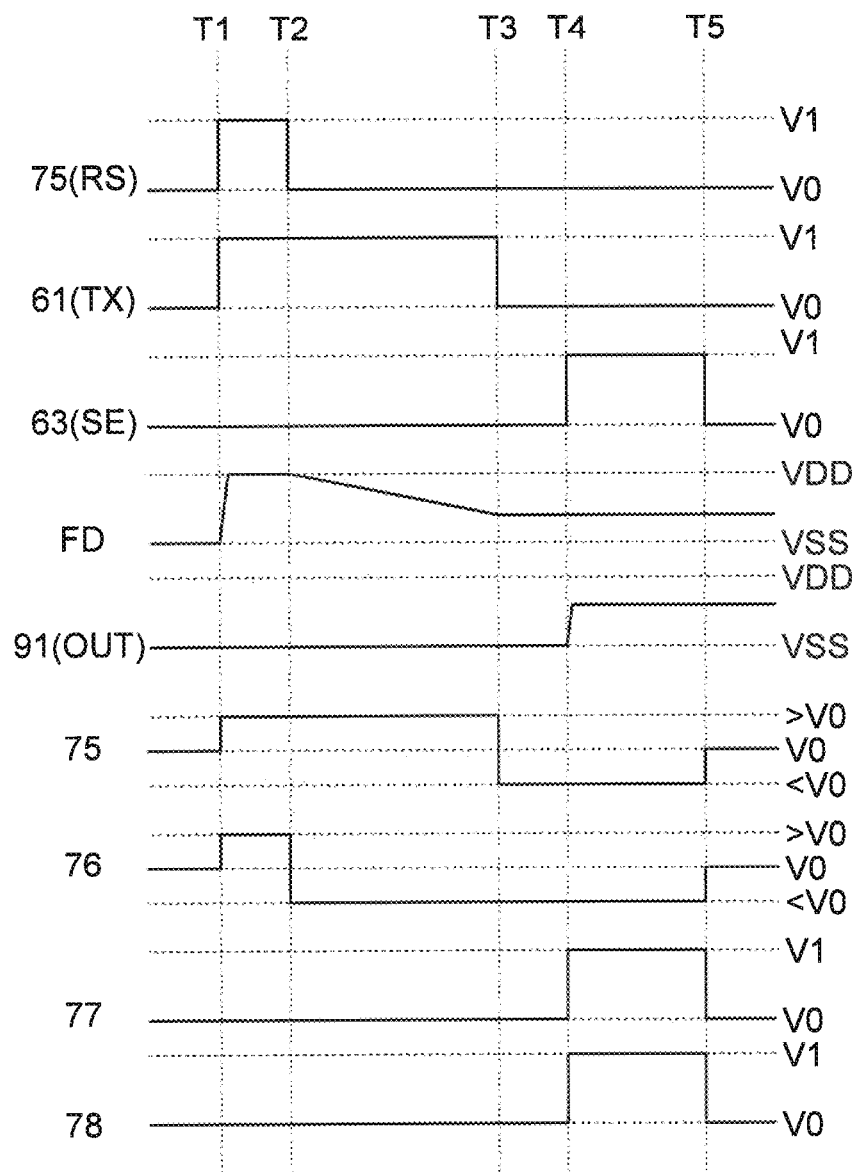
FIG. 22 is a timing chart illustrating operation of an imaging device.

The operation of the pixel in FIG. 21A will be described using a timing chart in FIG. 22. In the timing chart, "V1" can be a potential higher than a reference potential, such as a high power supply potential (VDD). "V0" can be a reference potential (source potential) such as 0 V, a potential GND, and a low power supply potential (VSS).

First, at Time T1, the transistors 41 and 42 are turned on and the node FD is reset to a reset potential (e.g., VDD) when the potentials of the wiring 75 (RS) and the wiring 61 (TX) are set to "V1" (reset operation). At this time, the on-state current of the transistors 41 and 42 is increased when the potentials of the wirings 75 and 76 are set to potentials higher than "V0" (>"V0"), so that the reset operation can be performed immediately.

At Time T2, the transistor 42 is turned off and the reset operation is terminated to start accumulation operation when the potential of the wiring 75 (RS) is set to "V0". At this time, the off-state current of the transistor 42 can be reduced and supply of charge to the node FD by leakage current can be prevented when the potential of the wiring 76 is set to a potential lower than "V0". Alternatively, at Time T2, the potential of the wiring 75 may be "V0".

At Time T3, the transistor 41 is turned off and the potential of the node FD is defined and held (holding operation) when the potential of the wiring 61 (TX) is set to "V0". At this time, the off-state current of the transistor 41 can be reduced and leakage of charge from the node FD by leakage current can be prevented when the potential of the wiring 75 is set to a potential lower than "V0" (<"V0").

At Time T4, the transistor 44 is turned on and the potential of the wiring 91 (OUT1) changes depending on a current flowing through the transistor 43 when the potential of the wiring 63 (SE) is set to "V1" (reading operation). At this time, the on-state current of the transistors 43 and 44 is increased and the potential of the wiring 91 (OUT1) can be defined immediately when the potentials of the wirings 77 and 78 are set to potentials higher than "V0" (>"V0").

At Time 5, the transistor 44 is turned off when the potential of the wiring 63 (SE) is set to "V0", so that the reading operation is completed. Note that the potentials of the wirings 75 and 76 are preferably held lower than "V0" (<"V0") so that the potential of the node FD does not change until the reading operation is completed. Alternatively, the potentials of the wirings 75 and 76 may be changed at the same timing in the above description.

Through the above steps, a signal based on the potential of the node FD can be read. Note that the pixel 20 in FIG. 1A may be operated without controlling the wirings 75 to 78 in the timing chart in FIG. 22. The pixel 20 in FIG. 21B may be operated without controlling the wirings 76 and 78 in the timing chart in FIG. 22.

Figure 23A:
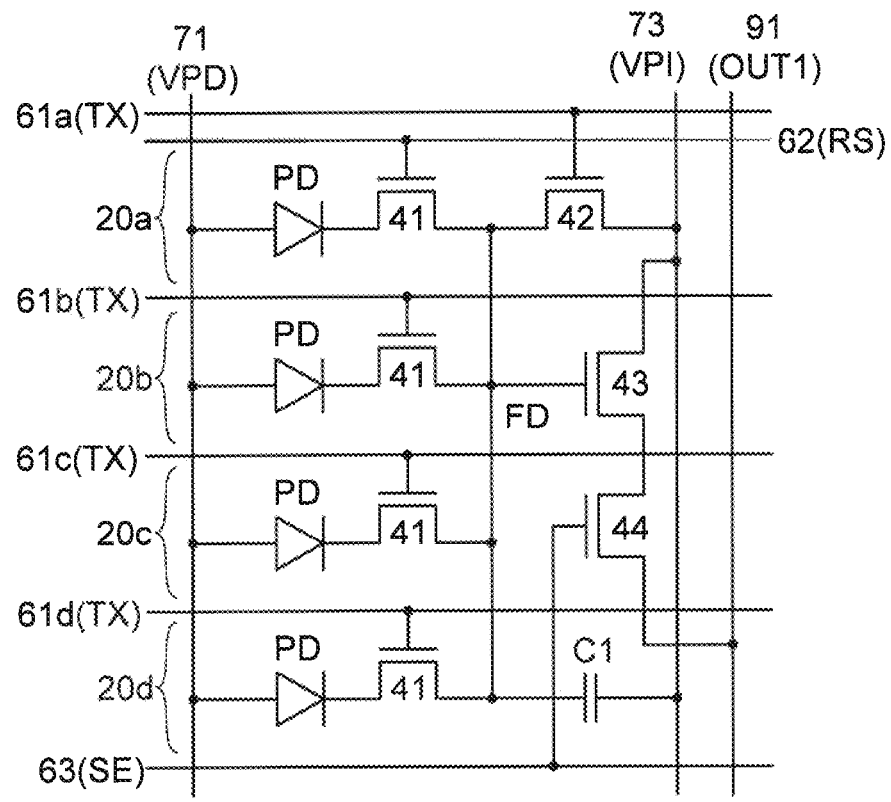
FIGS. 23A and 23B are circuit diagrams each illustrating a pixel.
Figure 23B:
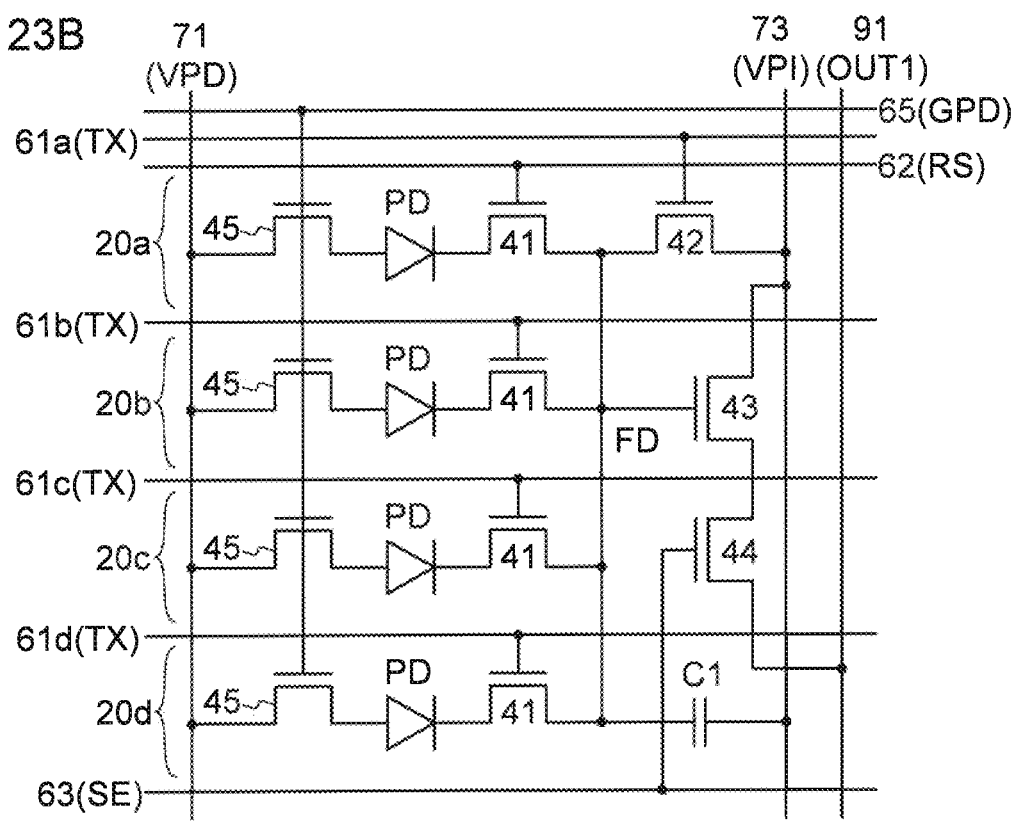

In a pixel circuit of one embodiment of the present invention, transistors may be shared among a plurality of pixels as illustrated in FIGS. 23A and 23B.

FIG. 23A illustrates a pixel in which transistors are shared among a plurality of pixels. In the pixel, pixels 20a to 20d each include the photoelectric conversion element PD and the transistor 41 and share the transistors 42 to 44 and a capacitor C1. The operation of each of the transistors 41 included in the pixels 20a to 20d is controlled by wirings 61a to 61d. With this circuit configuration, reset operation, accumulation operation, holding operation, and reading operation can be sequentially performed by each pixel. This configuration is mainly suitable for imaging using a rolling shutter system.

FIG. 23B illustrates a pixel in which transistors are shared among a plurality of pixels. In the pixel, the pixels 20a to 20d include the photoelectric conversion elements PD, the transistors 41, and the transistors 45 individually and share the transistors 42 to 44 and the capacitor C1. A potential can be held in the cathode of the photoelectric conversion element PD by providing the transistor 45, whose operation is controlled by the potential of wiring 65 (GPD), between the photoelectric conversion element PD and the wiring 71 (VPD). This configuration is suitable for imaging using a global shutter system, in which reset operation, accumulation operation, and holding operation are sequentially performed in all the pixels at the same time and reading operation is performed by each pixel.

In the pixel circuits illustrated in FIGS. 23A and 23B, the plurality of pixels (the pixels 20a to 20d) aligned in the direction in which the wiring 91 (OUT1) extends (hereinafter, referred to as a vertical direction) share the transistors;

however, a plurality of pixels aligned in the direction in which the wiring 63 (SE) extends (hereinafter, referred to as a horizontal direction) may share transistors. Alternatively, a plurality of pixels aligned in the horizontal and vertical directions may share transistors.

Alternatively, the number of pixels which share transistors is not limited to four, and may be two, three, or five or more.

Although the wiring 72 (VRS) and the wiring 73 (VPI) are merged into one wiring and the wiring 72 (VRS) is omitted in a configuration in FIGS. 23A and 23B, the wiring 72 (VRS) may be included. In addition, although the other electrode of the capacitor C1 is connected to the wiring 73 (VPI), the other electrode of the capacitor C1 may be connected to the wiring 71 (VPD).

As illustrated in FIGS. 24A1 and 24B1, the imaging device may be bent. FIG. 24A1 illustrates a state in which the imaging device is bent along dashed-two dotted line Y1-Y2. FIG. 24A2 is a cross-sectional view illustrating a portion indicated by dashed-two dotted line X1-X2 in FIG. 24A1. FIG. 24A3 is a cross-sectional view illustrating a portion indicated by dashed-two dotted line Y1-Y2 in FIG. 24A1.

FIG. 24B1 illustrates a state where the imaging device is bent along dashed-two dotted line X3-X4 and dashed-two dotted line Y3-Y4. FIG. 24B2 is a cross-sectional view illustrating a portion indicated by dashed-two dotted line X3-X4 in FIG. 24B1. FIG. 24B3 is a cross-sectional view illustrating a portion indicated by dashed-two dotted line Y3-Y4 in FIG. 24B1.

The bent imaging device enables the curvature of field and astigmatism to be reduced. Thus, the optical design of lens and the like, which is used in combination with the imaging device, can be facilitated. For example, the number of lenses used for aberration correction can be reduced; accordingly, the size or weight of semiconductor devices including the imaging device can be easily reduced. In addition, the quality of a captured image can be improved.

In this embodiment, one embodiment of the present invention has been described. Other embodiments of the present invention are described in other embodiments. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor. Although an example in which a global shutter system is employed is described as one embodiment of the present invention, one embodiment of the present invention is not limited thereto. Depending on circumstances or conditions, another system such as a rolling shutter system may be employed in one embodiment of the present invention. Alternatively, depending on circumstances or conditions, the global shutter system is not necessarily employed.

This embodiment can be implemented in appropriate combinations with the configurations described in the other embodiments.

Embodiment 2

In this embodiment, an OS transistor that can be used in one embodiment of the present invention will be described with reference to drawings. In the drawings in this embodiment, some components are enlarged, reduced in size, or omitted for easy understanding.

Figure 25A:
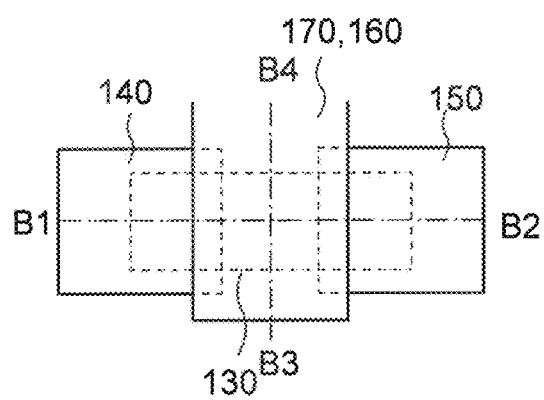
FIGS. 25A to 25F are top views and cross-sectional views illustrating transistors.
Figure 25B:
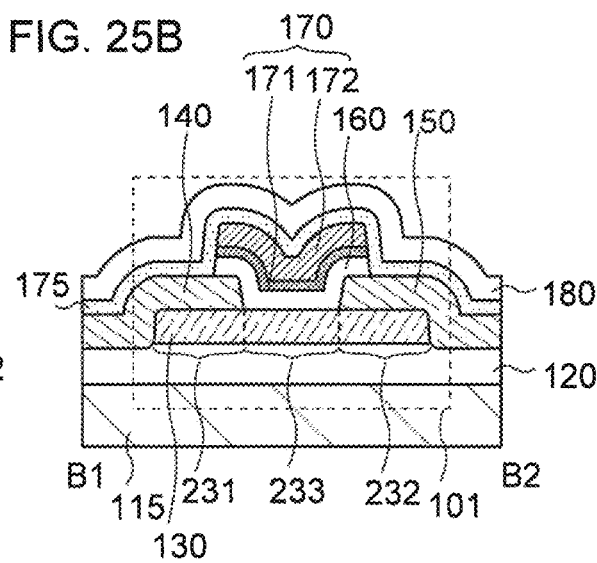
Figure 27A:
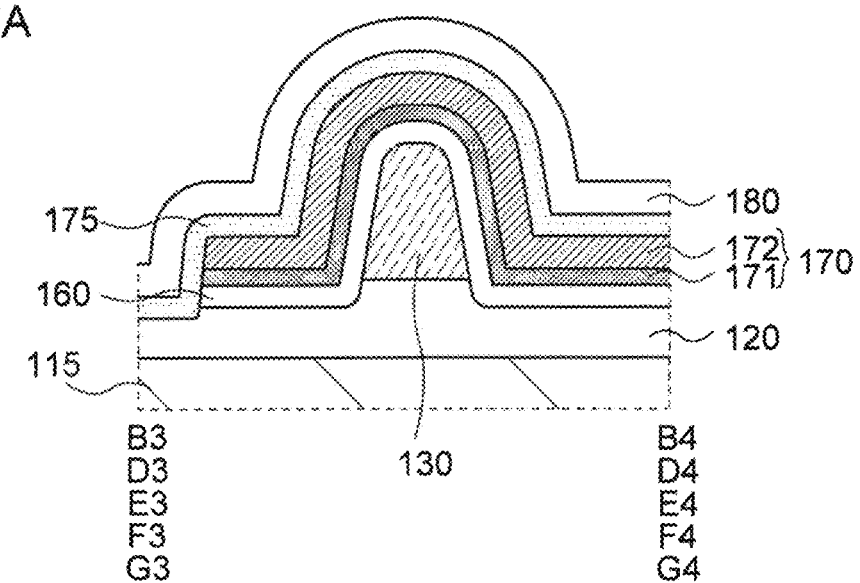
FIGS. 27A to 27D are cross-sectional views of transistors in the channel width direction.

FIGS. 25A and 25B are a top view and a cross-sectional view illustrating a transistor 101 of one embodiment of the present invention. FIG. 25A is the top view, and FIG. 25B illustrates a cross section in the direction of dashed-dotted line B1-B2 in FIG. 25A. A cross section in the direction of dashed-dotted line B3-B4 in FIG. 25A is illustrated in FIG. 27A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

The conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 25B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of opposite polarity is used or when the direction of current flow is changed in a circuit operation, for example Therefore, the terms "source" and "drain" can be interchanged with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same can apply to other transistors described in this embodiment.

Each of the conductive layers 140 and 150 is a single layer in the drawing, but also may be a stack of two or more layers. The same can apply to other transistors described in this embodiment.

Figure 25C:
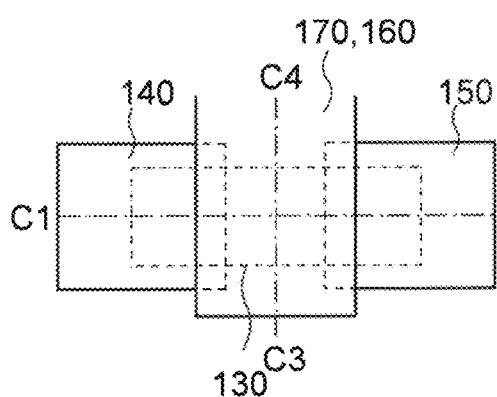
Figure 25D:
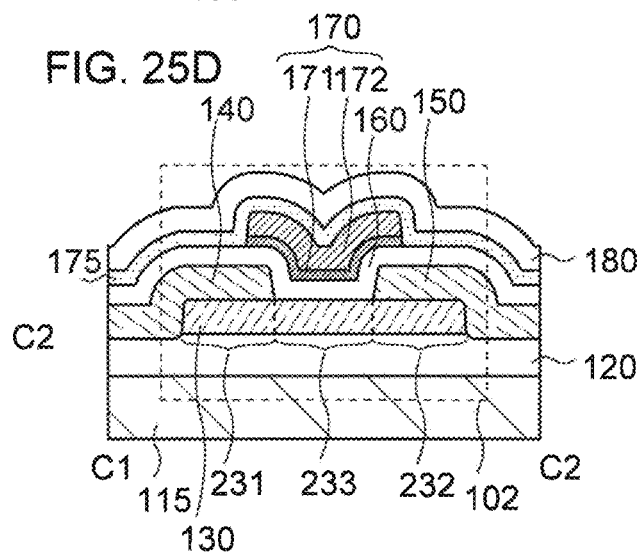
Figure 27B:
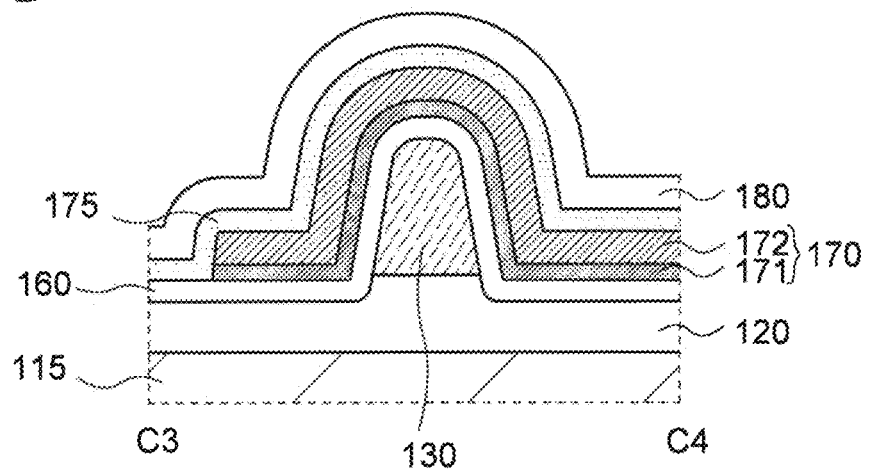

The transistor in one embodiment of the present invention may have a structure illustrated in FIGS. 25C and 25D. FIG. 25C is a top view of a transistor 102. A cross section in the direction of dashed-dotted line C1-C2 in FIG. 25C is illustrated in FIG. 25D. A cross section in the direction of dashed-dotted line C3-C4 in FIG. 25C is illustrated in FIG. 27B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has a feature of a low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

Figure 25E:
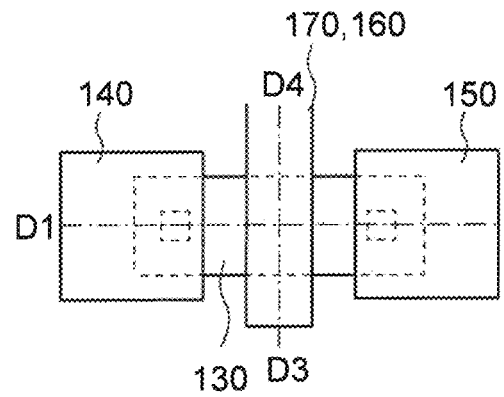
Figure 25F:
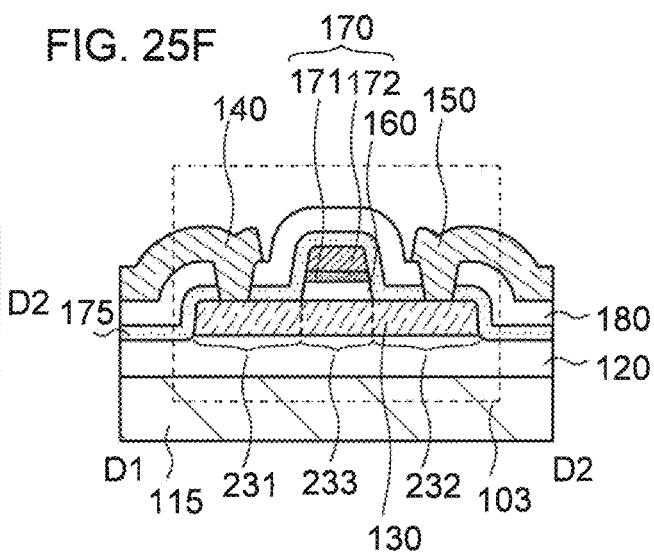

The transistor in one embodiment of the present invention may have a structure illustrated in FIGS. 25E and 25F. FIG. 25E is a top view of a transistor 103. A cross section in the direction of dashed-dotted line D1-D2 in FIG. 25E is illustrated in FIG. 25F. A cross section in the direction of dashed-dotted line D3-D4 in FIG. 25E is illustrated in FIG. 27A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

The conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 25F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 26A:
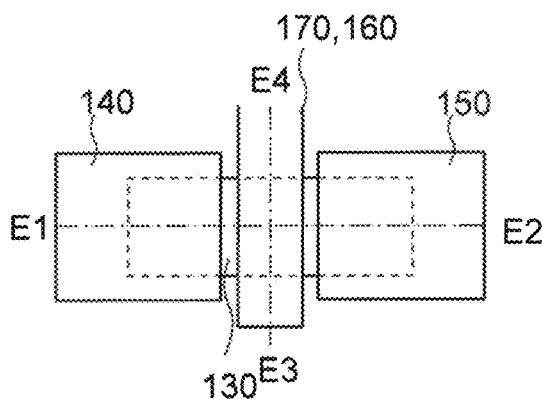
FIGS. 26A to 26F are top views and cross-sectional views illustrating transistors.
Figure 26B:
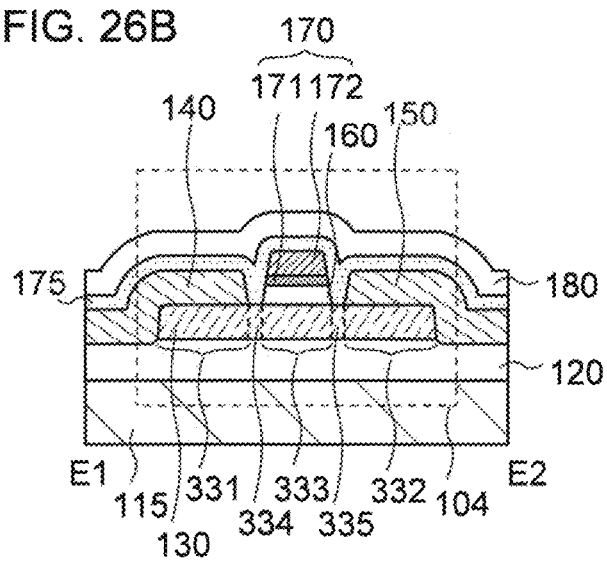

The transistor in one embodiment of the present invention may have a structure illustrated in FIGS. 26A and 26B. FIG. 26A is a top view of a transistor 104. A cross section in the direction of dashed-dotted line E1-E2 in FIG. 26A is illustrated in FIG. 26B. A cross section in the direction of dashed-dotted line E3-E4 in FIG. 26A is illustrated in FIG. 27A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 are in contact with the oxide semiconductor layer 130 so as to cover end portions of the oxide semiconductor layer 130.

In FIG. 26B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 26C:
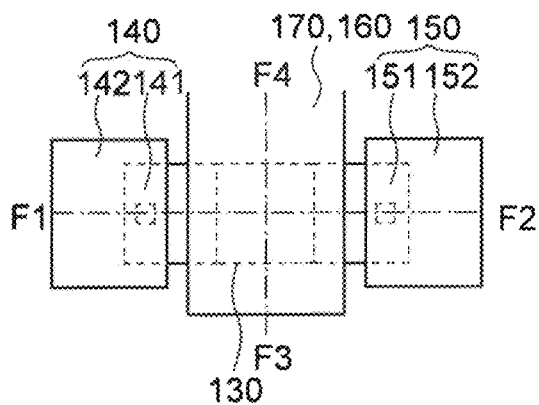
Figure 26D:
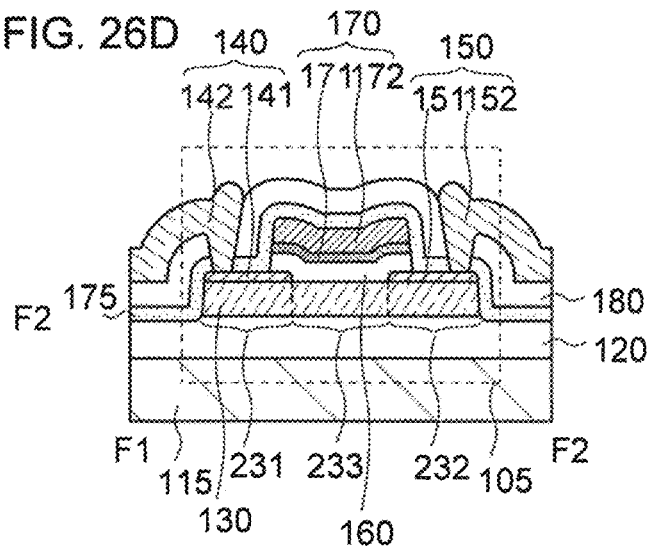

The transistor in one embodiment of the present invention may have a structure illustrated in FIGS. 26C and 26D. FIG. 26C is a top view of a transistor 105. A cross section in the direction of dashed-dotted line F1-F2 in FIG. 26C is illustrated in FIG. 26D. A cross section in the direction of dashed-dotted line F3-F4 in FIG. 26C is illustrated in FIG. 27A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that the openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 26E:
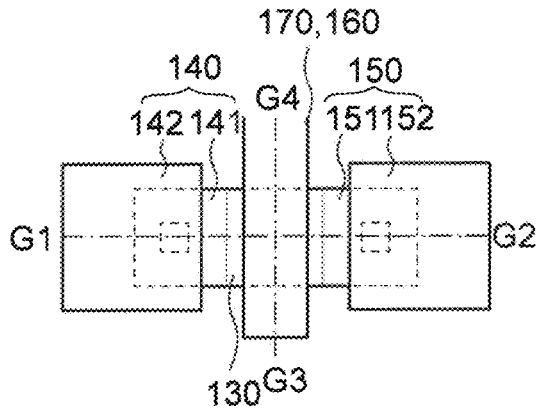
Figure 26F:
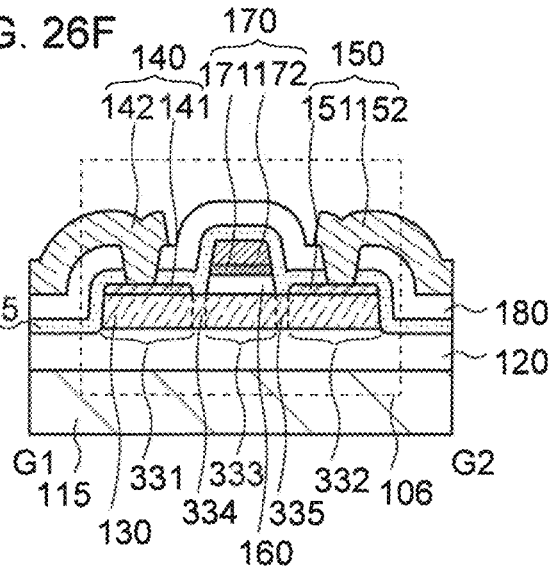

The transistor in one embodiment of the present invention may have a structure illustrated in FIGS. 26E and 26F. FIG. 26E is a top view of a transistor 106. A cross section in the direction of dashed-dotted line G1-G2 in FIG. 26E is illustrated in FIG. 26F. A cross section in the direction of dashed-dotted line G3-G4 in FIG. 26E is illustrated in FIG. 27A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 27C:
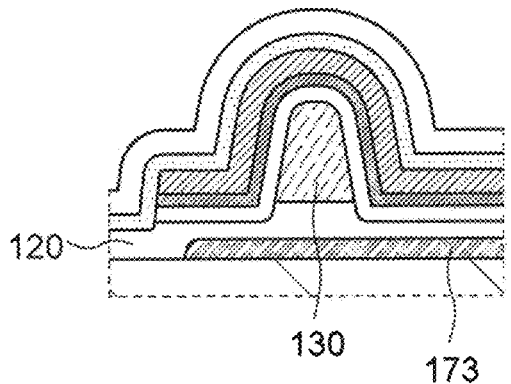
Figure 27D:
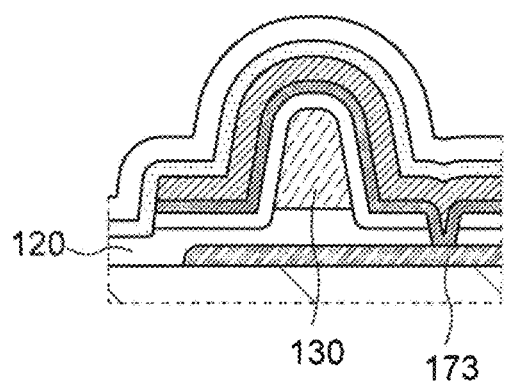
Figure 28A:
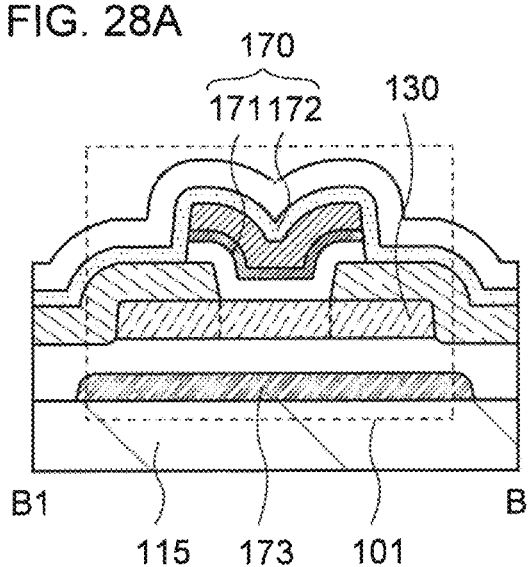
FIGS. 28A to 28F are cross-sectional views of transistors in the channel length direction.
Figure 28B:
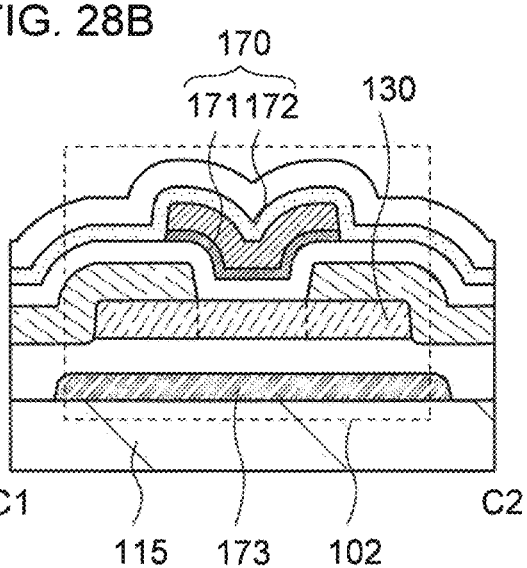
Figure 28C:
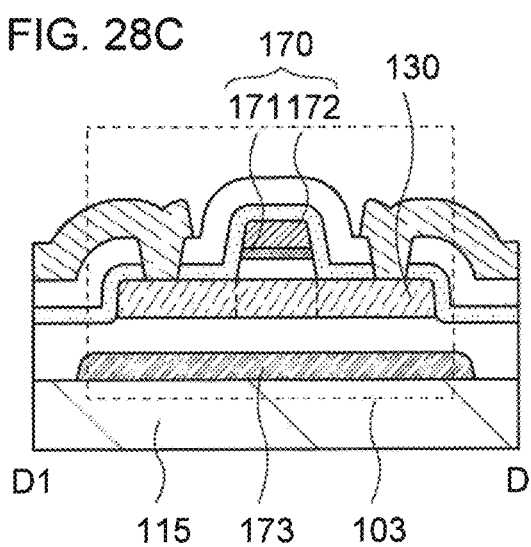
Figure 28D:
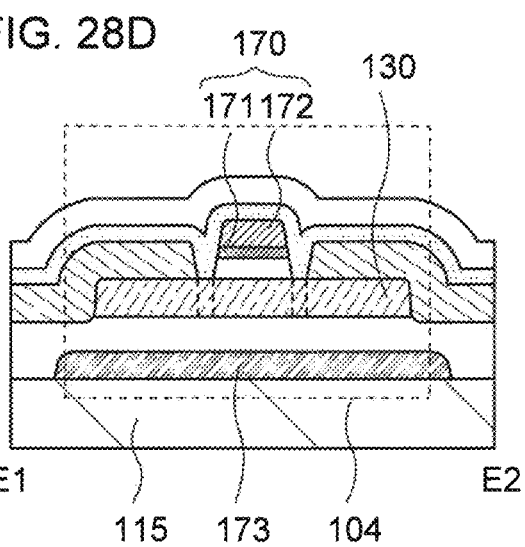
Figure 28E:
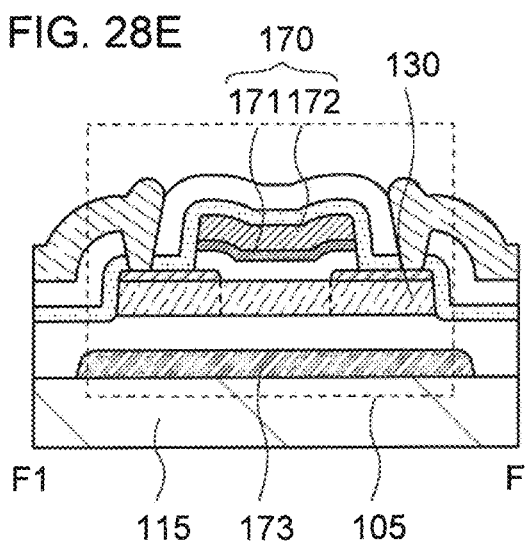
Figure 28F:
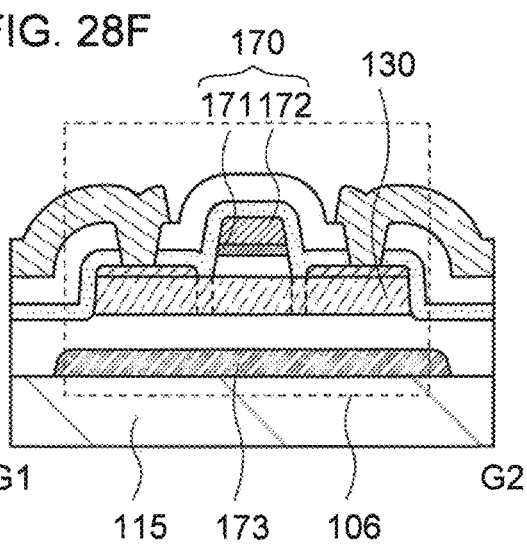

The transistor in one embodiment of the present invention may include the conductive layer 173 between the oxide semiconductor layer 130 and the substrate 115 as illustrated in cross-sectional views in the channel length direction in FIGS. 28A to 28F and cross-sectional views in the channel width direction in FIGS. 27C and 27D. When the conductive layer is used as a second gate electrode layer (back gate), the on-state current can be increased or the threshold voltage can be controlled. In the cross-sectional views in FIGS. 28A to 28F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 27D, the conductive layers 170 and 173 may be electrically connected to each other through a contact hole.

Although the transistors 101 to 106 in FIGS. 25A to 25F and FIGS. 26A to 26F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 29B and 29C or FIGS. 29D and 29E.

Figure 29A:
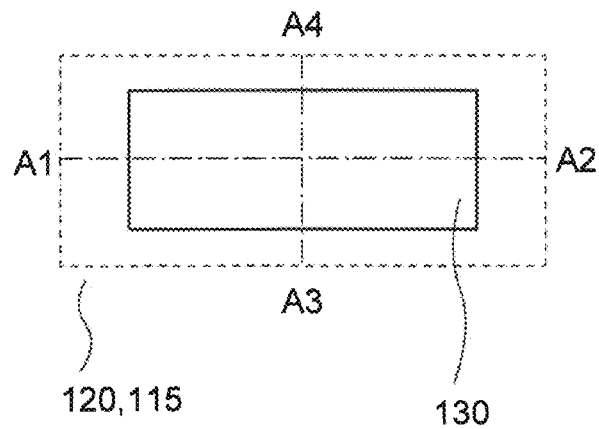
FIGS. 29A to 29E are a top view and cross-sectional views illustrating a semiconductor layer.
Figure 29B:
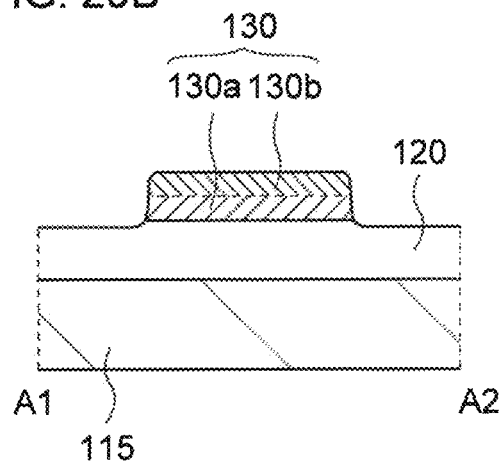
Figure 29D:
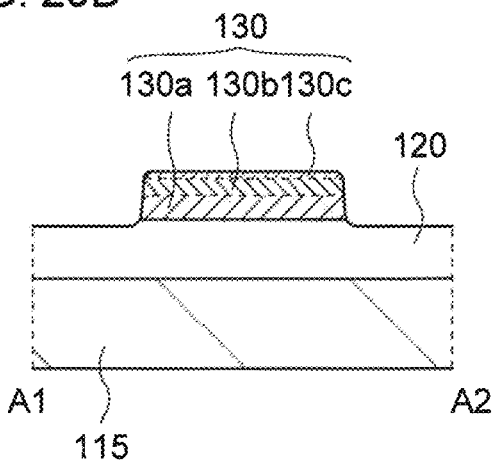
Figure 29C:
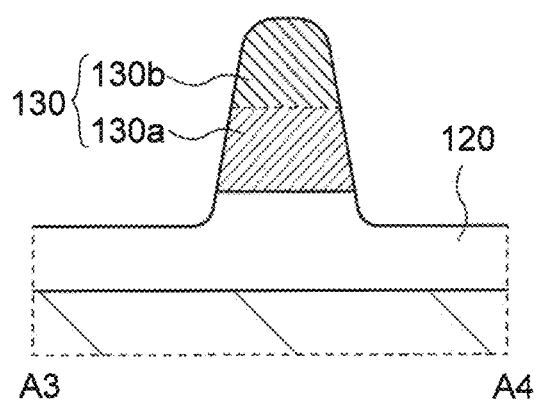
Figure 29E:
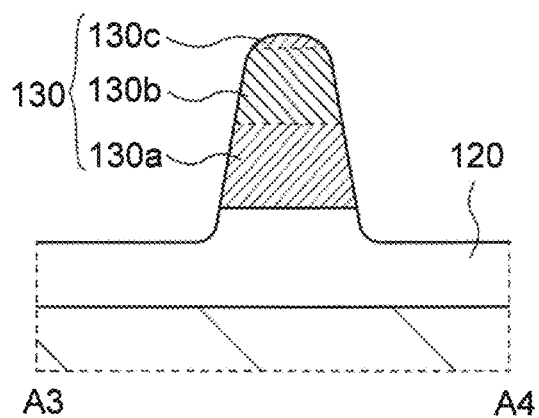

FIG. 29A is a top view of the oxide semiconductor layer 130, and FIGS. 29B and 29C are cross-sectional views of the oxide semiconductor layer 130 with a two-layer structure. FIGS. 29D and 29E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 30A:
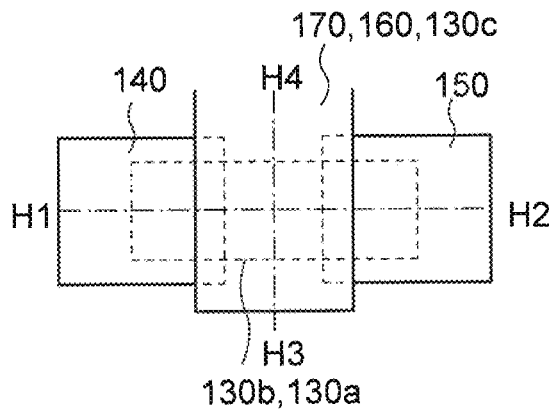
FIGS. 30A to 30F are top views and cross-sectional views illustrating transistors.
Figure 30B:
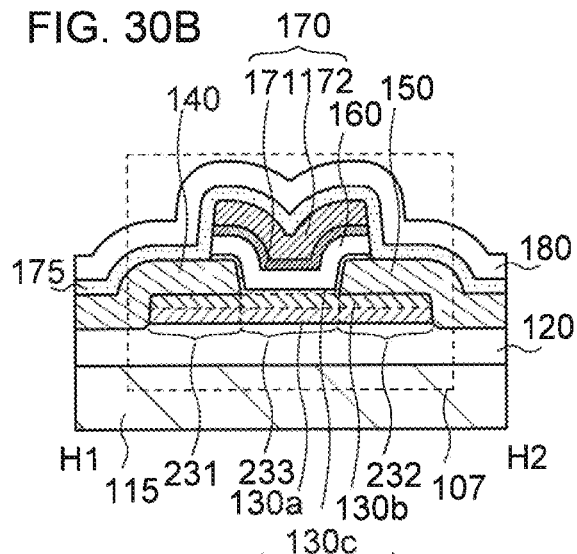
Figure 32A:
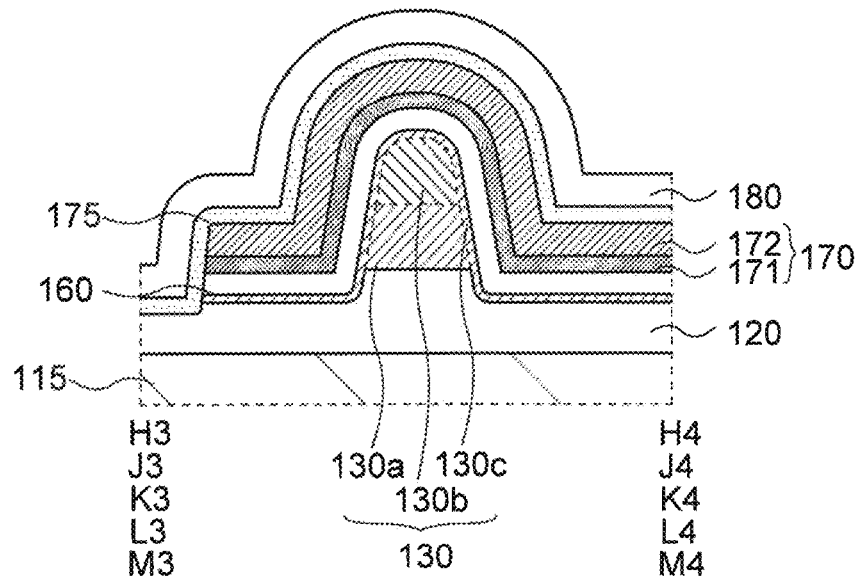
FIGS. 32A to 32D are cross-sectional views of transistors in the channel width direction.

The transistor in one embodiment of the present invention may have a structure illustrated in FIGS. 30A and 30B. FIG. 30A is a top view of a transistor 107. A cross section in the direction of dashed-dotted line H1-H2 in FIG. 30A is illustrated in FIG. 30B. A cross section in the direction of dashed-dotted line H3-H4 in FIG. 30A is illustrated in FIG. 32A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 30C:
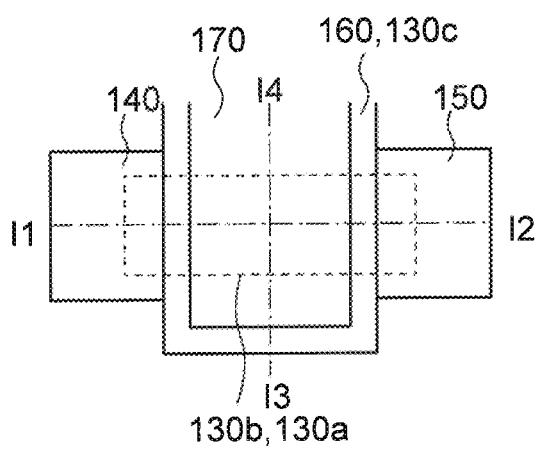
Figure 30D:
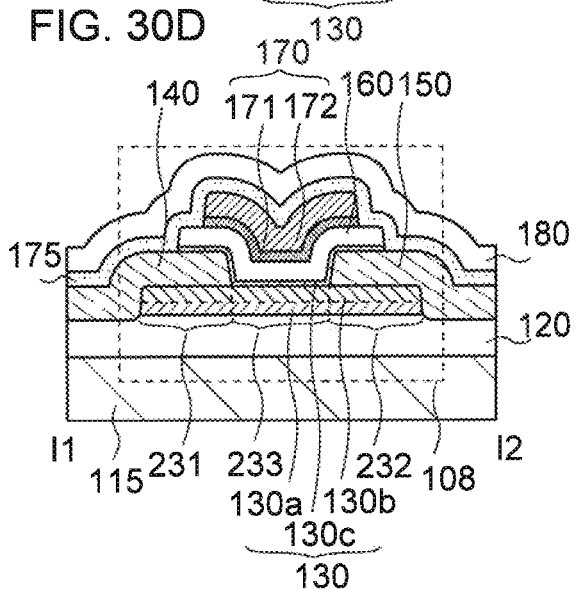
Figure 32B:
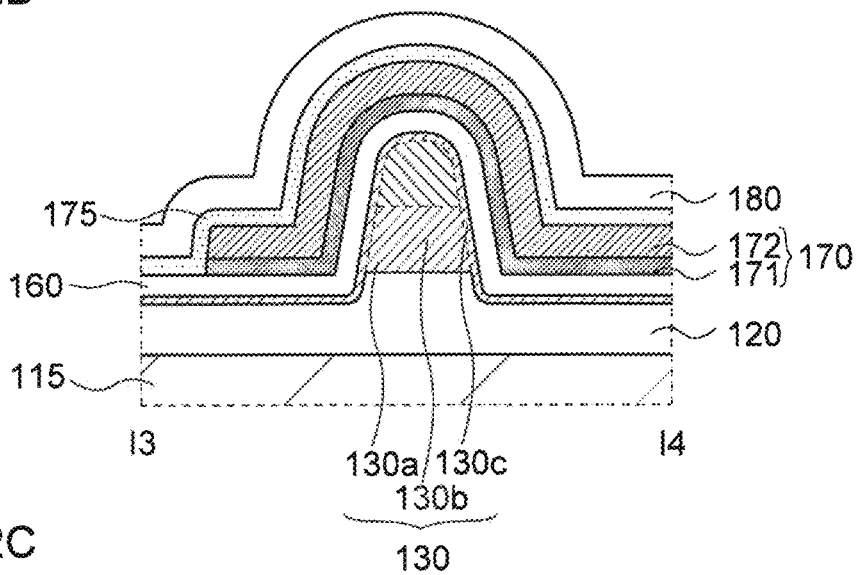

The transistor in one embodiment of the present invention may have a structure illustrated in FIGS. 30C and 30D. FIG. 30C is a top view of a transistor 108. A cross section in the direction of dashed-dotted line I1-I2 in FIG. 30C is illustrated in FIG. 30D. A cross section in the direction of dashed-dotted line I3-I4 in FIG. 30C is illustrated in FIG. 32B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with the end portion of the conductive layer 170.

Figure 30E:
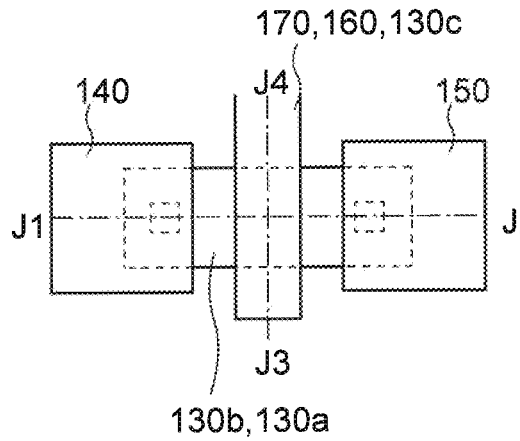
Figure 30F:
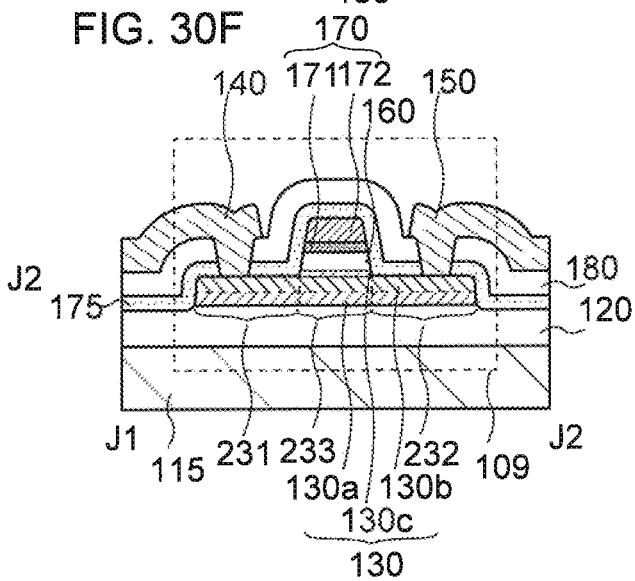

The transistor in one embodiment of the present invention may have a structure illustrated in FIGS. 30E and 30F. FIG. 30E is a top view of a transistor 109. A cross section in the direction of dashed-dotted line J1-J2 in FIG. 30E is illustrated in FIG. 30F. A cross section in the direction of dashed-dotted line J3-J4 in FIG. 30E is illustrated in FIG. 32A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 31A:
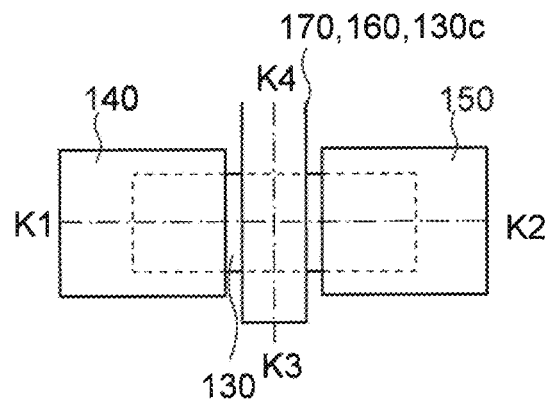
FIGS. 31A to 31F are top views and cross-sectional views illustrating transistors.
Figure 31B:
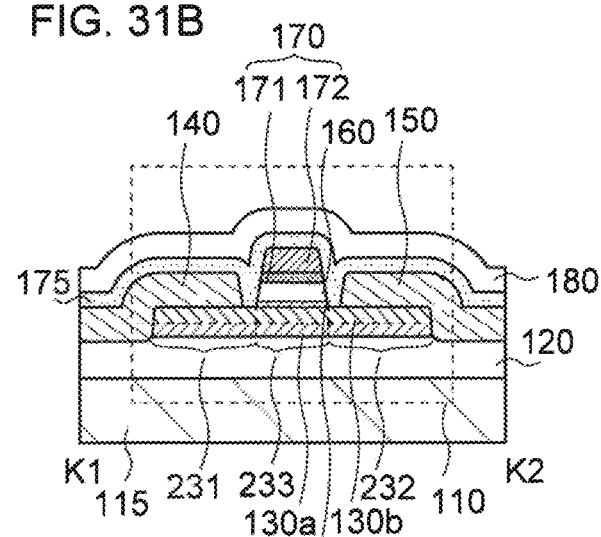

The transistor in one embodiment of the present invention may have a structure illustrated in FIGS. 31A and 31B. FIG. 31A is a top view of a transistor 110. A cross section in the direction of dashed-dotted line K1-K2 in FIG. 31A is illustrated in FIG. 31B. A cross section in the direction of dashed-dotted line K3-K4 in FIG. 31A is illustrated in FIG. 32A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 31C:
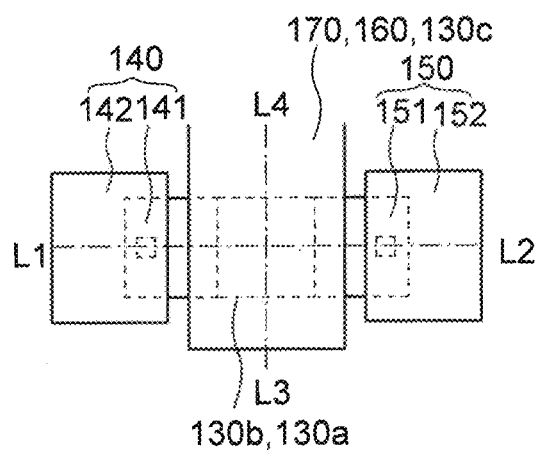
Figure 31D:
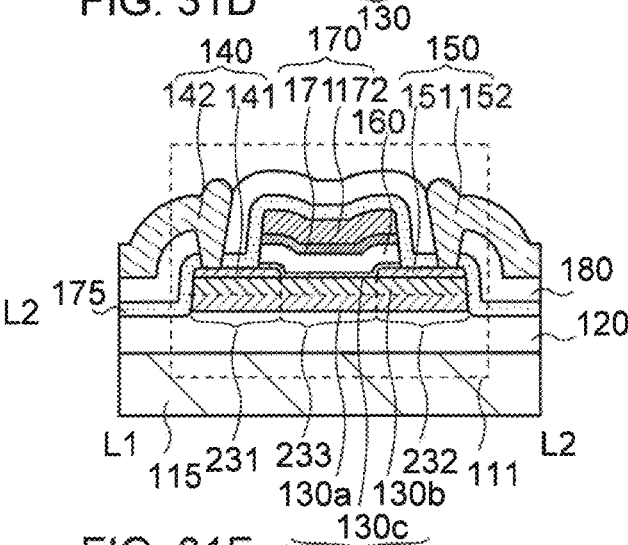

The transistor in one embodiment of the present invention may have a structure illustrated in FIGS. 31C and 31D. FIG. 31C is a top view of a transistor 111. A cross section in the direction of dashed-dotted line L1-L2 in FIG. 31C is illustrated in FIG. 31D. A cross section in the direction of dashed-dotted line L3-L4 in FIG. 31C is illustrated in FIG. 32A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 31E:
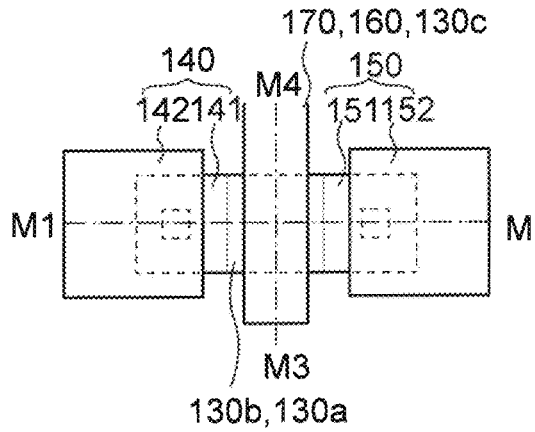
Figure 31F:
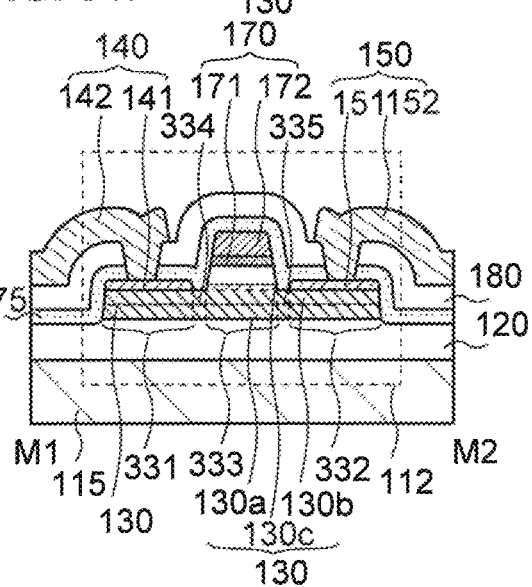

The transistor in one embodiment of the present invention may have a structure illustrated in FIGS. 31E and 31F. FIG. 31E is a top view of a transistor 112. A cross section in the direction of dashed-dotted line M1-M2 in FIG. 31E is illustrated in FIG. 31F. A cross section in the direction of dashed-dotted line M3-M4 in FIG. 31E is illustrated in FIG. 32A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 32C:
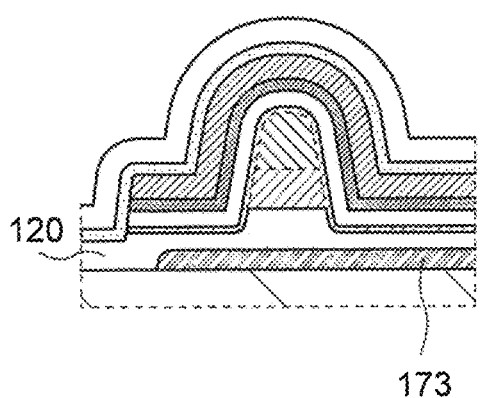
Figure 32D:
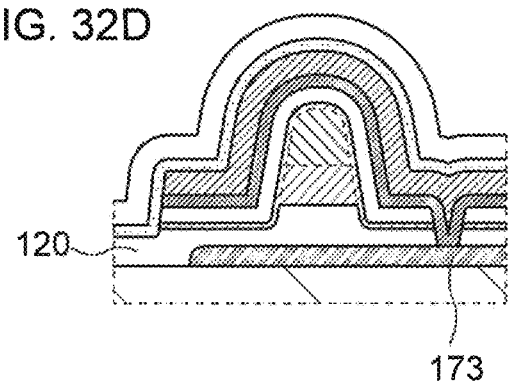
Figure 33A:
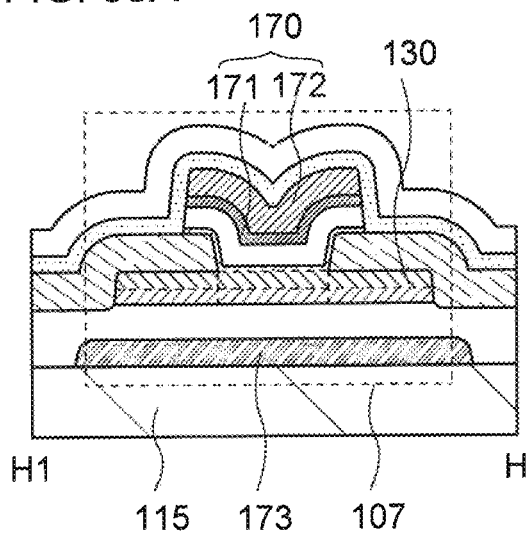
FIGS. 33A to 33F are cross-sectional views of transistors in the channel length direction.
Figure 33B:
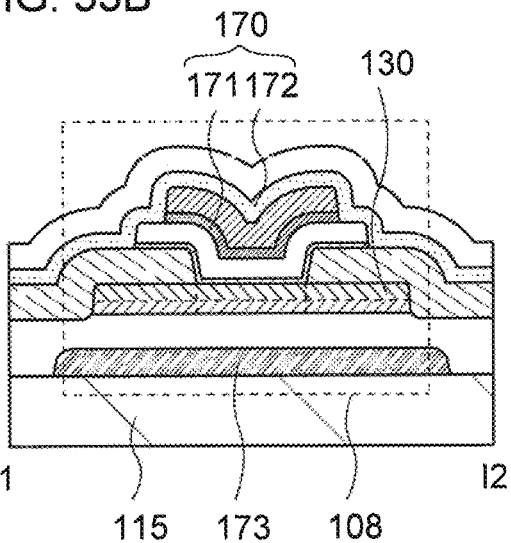
Figure 33C:
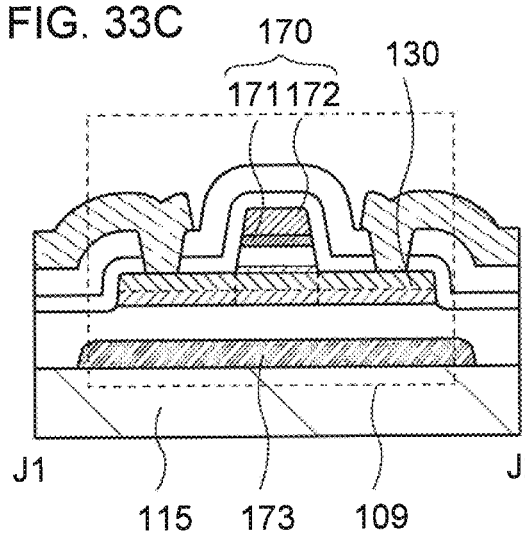
Figure 33D:
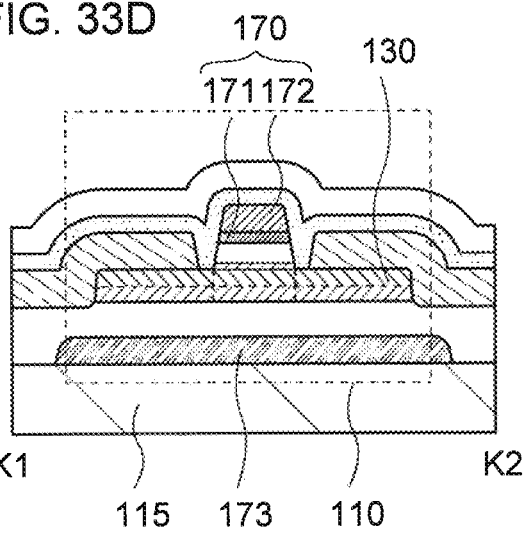
Figure 33E:
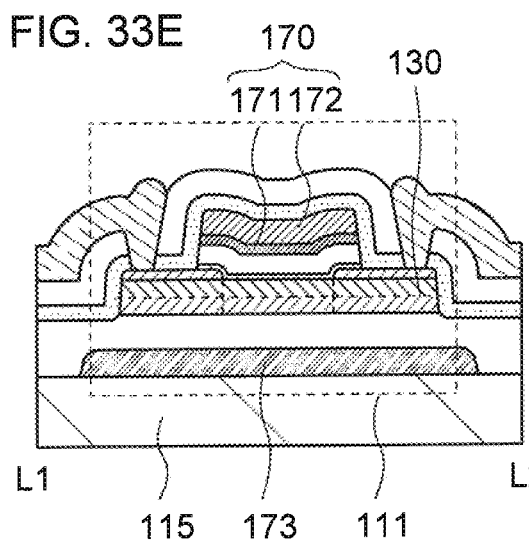
Figure 33F:
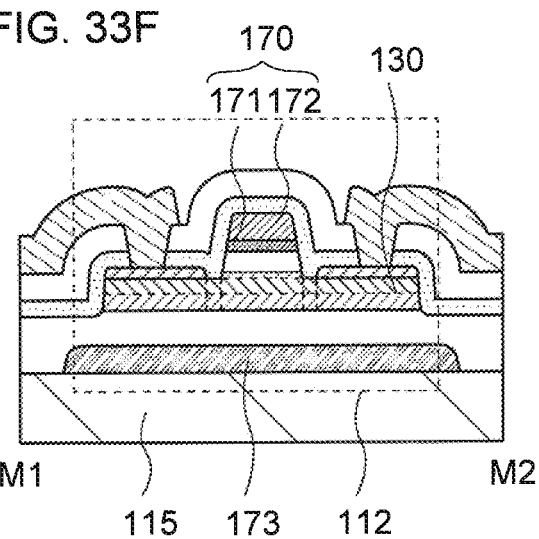

The transistor in one embodiment of the present invention may include the conductive layer 173 between the oxide semiconductor layer 130 and the substrate 115 as illustrated in cross-sectional views in the channel length direction in FIGS. 33A to 33F and cross-sectional views in the channel width direction in FIGS. 32C and 32D. When the conductive layer is used as a second gate electrode layer (back gate), the on-state current can be further increased or the threshold voltage can be controlled. In the cross-sectional views in FIGS. 33A to 33F, the width of the conductive layer 173 may be shorter than that of the oxide semiconductor layer 130. Moreover, the width of the conductive layer 173 may be shorter than that of the conductive layer 170.

Figure 34A:
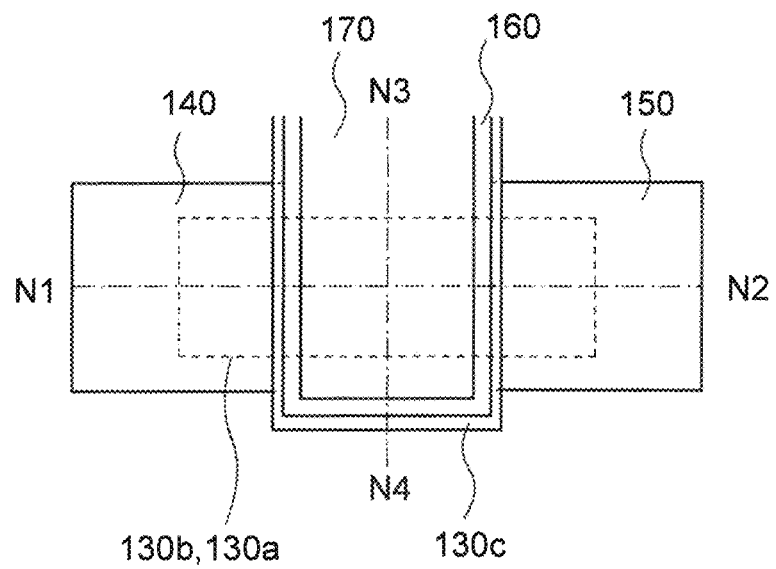
FIGS. 34A and 34B are a top view and a cross-sectional view illustrating a transistor.
Figure 34B:
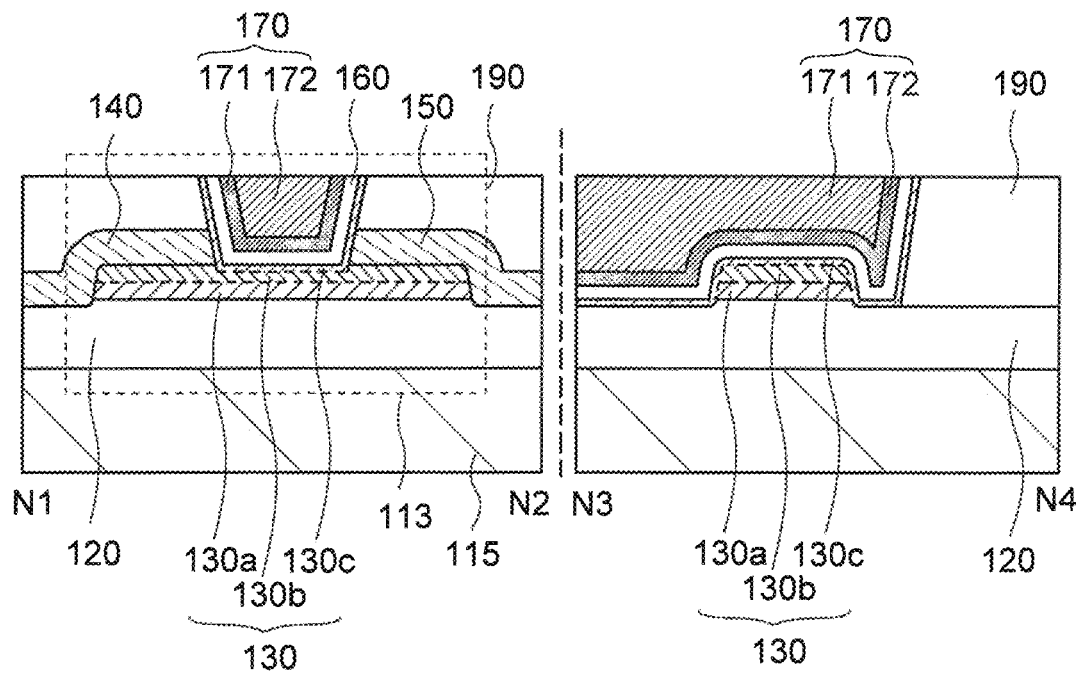

The transistor in one embodiment of the present invention may have a structure illustrated in FIGS. 34A and 34B. FIG. 34A is a top view and FIG. 34B is a cross-sectional view taken along dashed-dotted line N1-N2 and dashed-dotted line N3-N4 in FIG. 34A. Note that for simplification of the drawing, some components are not illustrated in the top view in FIG. 34A.

A transistor 113 illustrated in FIGS. 34A and 34B includes the substrate 115, the insulating layer 120 over the substrate 115, the oxide semiconductor layer 130 (the oxide semiconductor layer 130a, the oxide semiconductor layer 130b, and the oxide semiconductor layer 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130, the insulating layer 160, and the conductive layer 170 are provided in an opening that is provided in an insulating layer 190 over the transistor 113 and reaches the oxide semiconductor layers 130a and 130b and the insulating layer 120.

The transistor 113 has a smaller region in which a conductor serving as a source electrode or a drain electrode overlaps with a conductor serving as a gate electrode than the other transistors described above; thus, the parasitic capacitance in the transistor 113 can be reduced. Therefore, the transistor 113 is preferable as a component of a circuit for which high-speed operation is needed. As illustrated in FIG. 34B, a top surface of the transistor 113 is preferably planarized by a chemical mechanical polishing (CMP) method or the like, but is not necessarily planarized.

Figure 35A:
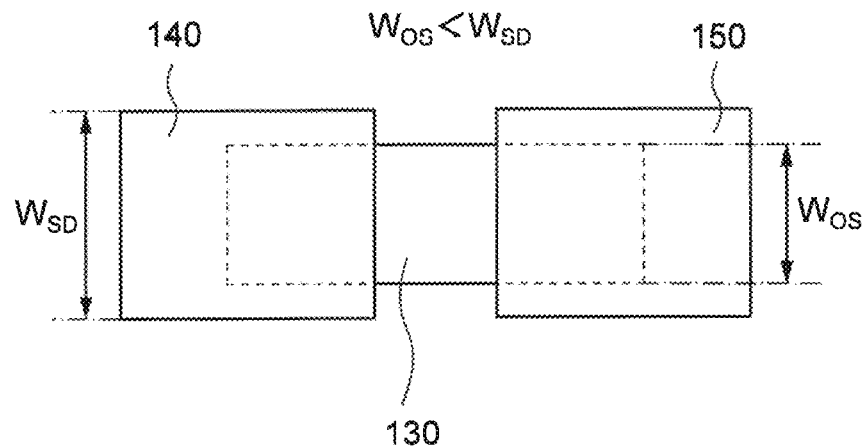
FIGS. 35A to 35C are top views each illustrating a transistor.
Figure 35B:
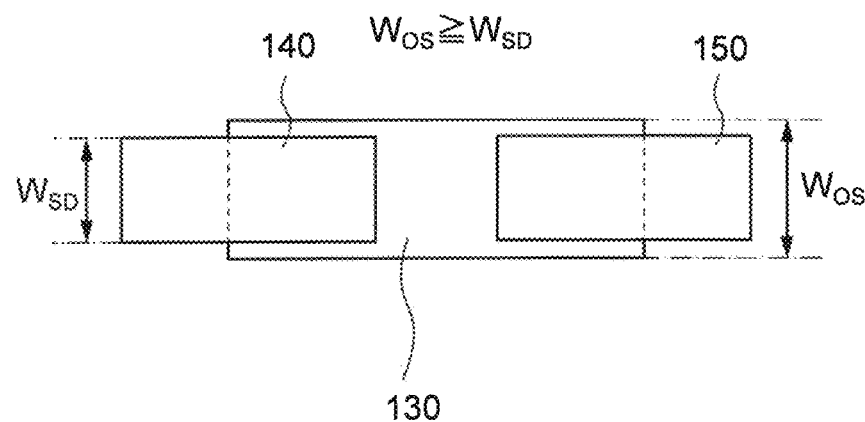
Figure 35C:
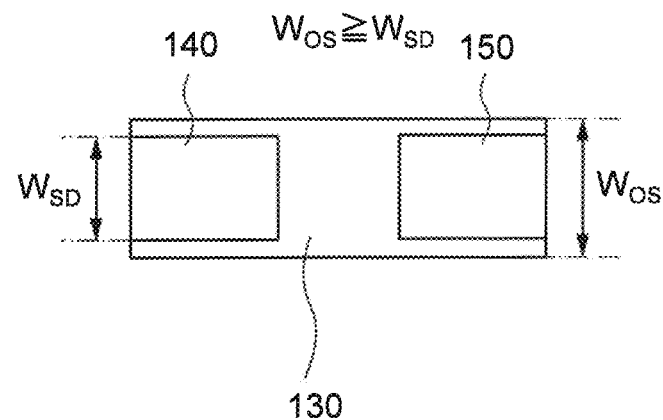

As shown in the top views in FIGS. 35A and 35B (showing only the oxide semiconductor layer 130, the conductive layer 140, and the conductive layer 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS}$ $W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 35C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Thus, increasing the thickness of the oxide semiconductor layer 130b improves the on-state current in some cases.

With the above structure, the electrical characteristics of the transistor can be improved.

The structures described in this embodiment can be used in appropriate combination with any of the structures described in the other embodiments.

Embodiment 3

In this embodiment, components of the transistors described in Embodiment 2 are described in detail.

As the substrate 115, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like may be provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm$^3$ in TDS analysis. In the TDS analysis, the film surface temperature is higher than or equal to 100° C. and lower than or equal to 700° C., or higher than or equal to 100° C. and lower than or equal to 500° C. In the case where the substrate 115 is provided with another device, the insulating layer 120 also has a function of an interlayer insulating film. In that case, the insulating layer 120 is preferably subjected to planarization treatment such as CMP treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

The oxide semiconductor layer 130 can have a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which layers corresponding to the oxide semiconductor layer 130a and the oxide semiconductor layer 130b are sequentially stacked from the insulating layer 120 side is used. In such a case, the oxide semiconductor layers 130a and 130b can be replaced with each other.

For the oxide semiconductor layer 130b, for example, an oxide semiconductor whose electron affinity (an energy difference between a vacuum level and the conduction band minimum) is higher than those of the oxide semiconductor layers 130a and 130c is used.

In such a structure, when an electric field is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer such as Al, Ga, Y, or Sn in addition to In and Zn.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys or conductive nitrides of any of these metal materials can be used. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film Therefore, in a region of the oxide semiconductor film that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack of any of the above materials. The insulating layer 160 may contain La, N, Zr, or the like as an impurity.

An example of a stacked-layer structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide increases in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film that releases ammonia more than nitrogen oxide in TDS; the amount of released ammonia is typically greater than or equal to $1 \times 10^{18}$ cm$^{-3}$ and less than or equal to $5 \times 10^{19}$ cm$^{-3}$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the conductive layer 170, an oxide conductive layer of an In—Ga—Zn oxide, zinc oxide, indium oxide, tin oxide, indium tin oxide, or the like may be used.

As the insulating layer 175, a silicon nitride film, an aluminum nitride film, or the like containing hydrogen can be used. In the transistors 103, 104, 106, 109, 110, and 112 described in Embodiment 2, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120.

The insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, that miniaturization of a transistor tends to cause deterioration of electrical characteristics of the transistor. For example, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in on-state current.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source gas that is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide)hafnium) are used.

For example, in the case where an aluminum oxide film is formed by a deposition apparatus using ALD, two kinds of gases, i.e., $H_2O$ as an oxidizer and a source gas that is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with the adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O layer is formed by a deposition apparatus using ALD, an $In(CH_3)_3$ gas and an $O_3$ gas) are sequentially introduced to form an In—O layer, a $Ga(CH_3)_3$ gas and an $O_3$ gas) are sequentially introduced to form a Ga—O layer, and then a $Zn(CH_3)_2$ gas and an $O_3$ gas) are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas that is obtained by bubbling with an inert gas such as Ar may be used instead of an $O_3$ gas), it is preferable to use an $O_3$ gas), which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 4

In this embodiment, the material of an oxide semiconductor that can be used for one embodiment of the present invention will be described.

An oxide semiconductor preferably contains at least indium or zinc. In particular, indium and zinc are preferably contained. In addition, aluminum, gallium, yttrium, tin, or the like is preferably contained as an element M. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained as an element M.

Here, the case where an oxide semiconductor contains indium, an element M, and zinc will be considered.

First, preferred ranges of the atomic ratio of indium, the element M, and zinc contained in an oxide semiconductor according to the present invention will be described with reference to FIGS. 36A, 36B, and 36C. Note that the proportion of oxygen atoms is not shown. The terms of the atomic ratio of indium, the element M, and zinc contained in the oxide semiconductor are denoted by [In], [M], and [Zn], respectively.

Figure 36A:
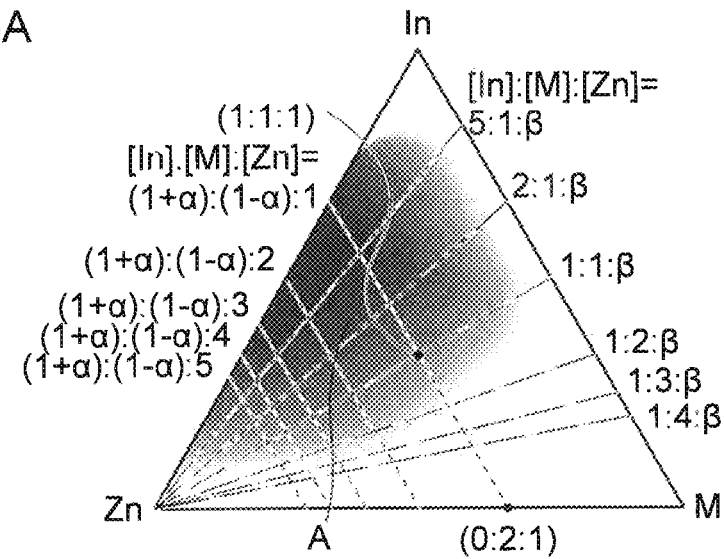
FIGS. 36A to 36C each illustrate the range of the atomic ratio of an oxide semiconductor.
Figure 36B:
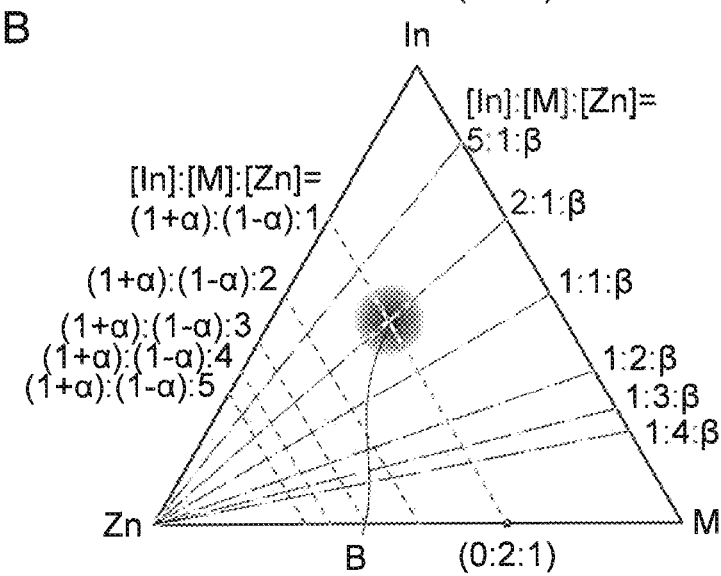
Figure 36C:
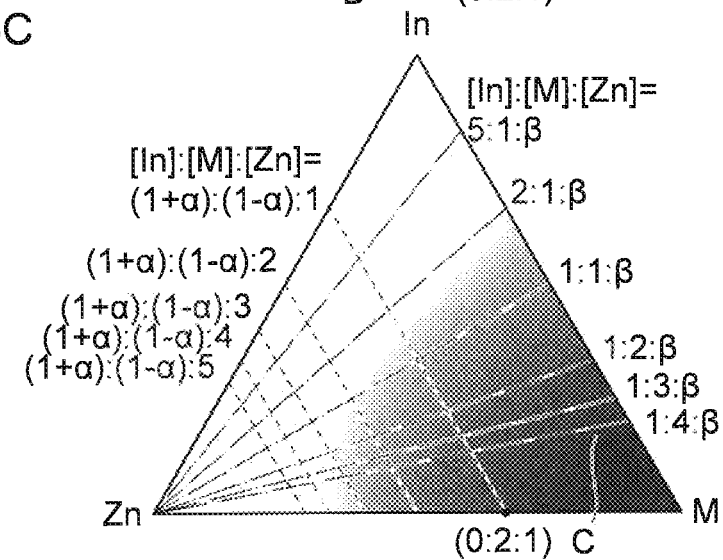

In FIGS. 36A to 36C, broken lines indicate a line where the atomic ratio [In]:[M]:[Zn] is $(1+\alpha):(1-\alpha): 1$, where $-1 \leq \alpha \leq 1$, a line where the atomic ratio [In]:[M]:[Zn] is $(1+\alpha):(1-\alpha): 2$, a line where the atomic ratio [In]:[M]:[Zn] is $(1+\alpha):(1-\alpha): 3$, a line where the atomic ratio [In]:[M]:[Zn] is $(1+\alpha):(1-\alpha): 4$, and a line where the atomic ratio [In]:[M]:[Zn] is $(1+\alpha):(1-\alpha): 5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

The oxide semiconductor illustrated in FIGS. 36A to 36C with an atomic ratio of [In]:[M]:[Zn]=0:2:1 or an atomic ratio which is in the neighborhood is likely to have a spinel crystal structure.

FIGS. 36A and 36B show examples of the preferred ranges of the atomic ratio of indium, the element M, and zinc contained in an oxide semiconductor of one embodiment of the present invention.

Figure 37:
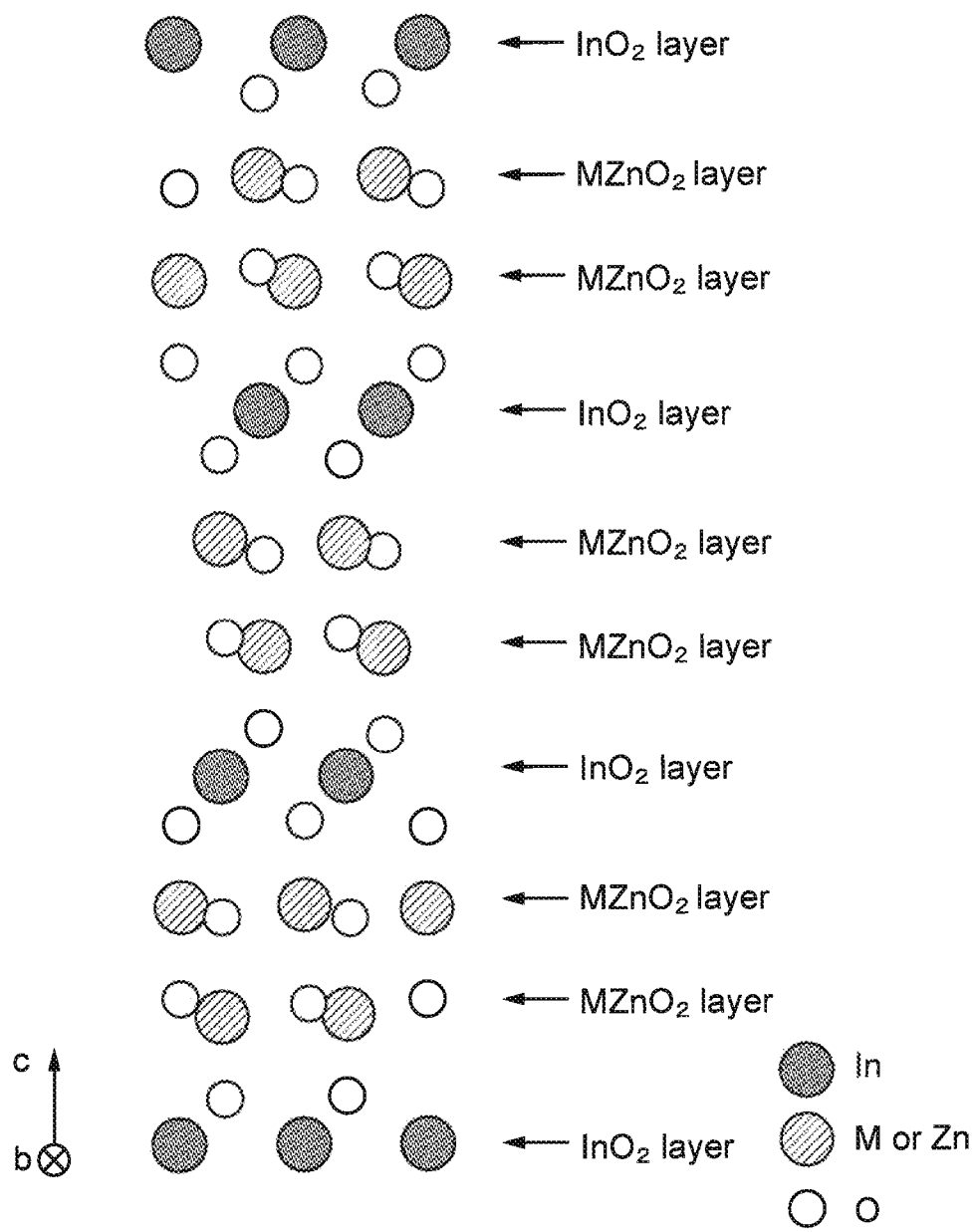
FIG. 37 illustrates a crystal structure of $InMZnO_4$.

FIG. 37 shows an example of the crystal structure of $InMZnO_4$ whose atomic ratio [In]:[M]:[Zn] is 1:1:1. Note that FIG. 37 illustrates the crystal structure of $InMZnO_4$ observed from a direction parallel to a b-axis. Note that a metal element in a layer that contains M, Zn, and oxygen (hereinafter, referred to as an "(M,Zn) layer") in FIG. 37 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter, referred to as an In layer) for every two (M,Zn) layers that contain the element M, zinc, and oxygen, as illustrated in FIG. 37.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:M:[Zn] that is close to 0:2:1, two phases of a spinel crystal structure and a layered crystal structure are likely to exist. In addition, with an atomic ratio [In]:M:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn] =0:1:0 and the vicinity thereof (e.g., a region C in FIG. 36C), insulation performance becomes better.

Accordingly, an oxide semiconductor of one embodiment of the present invention preferably has an atomic ratio represented by a region A in FIG. 36A. With the atomic ratio, a layered structure with high carrier mobility and a few grain boundaries is easily obtained.

A region B in FIG. 36B represents an atomic ratio of [In]:[M]:[Zn]=4:2:3 to 4.1 and the vicinity thereof. The vicinity includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that conditions where a layered structure of an oxide semiconductor is formed are not uniquely determined by the atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}/cm^3$, preferably lower than $1\times10^{11}/cm^3$, more preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources and thus can have a low carrier density. A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, the transistor whose channel region is formed in the oxide semiconductor having a high density of trap states has unstable electrical characteristics in some cases.

In order to obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel, silicon, and the like are given.

Here, the influence of impurities in the oxide semiconductor will be described.

When silicon or carbon that is one of Group 14 elements is contained in the oxide semiconductor, defect states are formed. Thus, the oxide semiconductor is formed to have a region where the concentration of silicon or carbon (measured by secondary ion mass spectrometry (SIMS)) is controlled to be lower than or equal to $2\times10^{18}$ atoms/$cm^3$, preferably lower than or equal to $2\times10^{17}$ atoms/$cm^3$ in the oxide semiconductor or the vicinity of an interface between the oxide semiconductor and a layer in contact therewith.

When the oxide semiconductor contains alkali metal or alkaline earth metal, defect states are formed and carriers are generated, in some cases. Thus, a transistor including an oxide semiconductor which contains alkali metal or alkaline earth metal is likely to be normally on. Therefore, it is preferable to reduce the concentration of alkali metal or alkaline earth metal of the oxide semiconductor. Specifically, the oxide semiconductor is formed to have a region where the concentration of alkali metal or alkaline earth metal measured by SIMS is controlled to be lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the oxide semiconductor is formed to have a region where the concentration of nitrogen measured by SIMS is controlled to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still more preferably lower than or equal to $5\times10^{17}$ atoms/cm$^3$, specifically.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on. Accordingly, it is preferable that hydrogen in the oxide semiconductor be reduced as much as possible. Specifically, the oxide semiconductor is formed to have a region where the concentration of hydrogen measured by SIMS is controlled to be lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel formation region in a transistor, the transistor can have stable electrical characteristics. A transistor in which the above highly purified oxide semiconductor is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

Next, the case where the oxide semiconductor has a two-layer structure or a three-layer structure will be described. A band diagram of insulators that are in contact with a stacked structure of an oxide semiconductor S1, an oxide semiconductor S2, and an oxide semiconductor S3 and a band diagram of insulators that are in contact with a stacked structure of the oxide semiconductor S2 and the oxide semiconductor S3 are described with reference to FIG. 38. Note that the oxide semiconductor S1, the oxide semiconductor S2, and the oxide semiconductor S3 correspond to the oxide semiconductor layer 130a, the oxide semiconductor layer 130b, and the oxide semiconductor layer 130c, respectively.

Figure 38A:
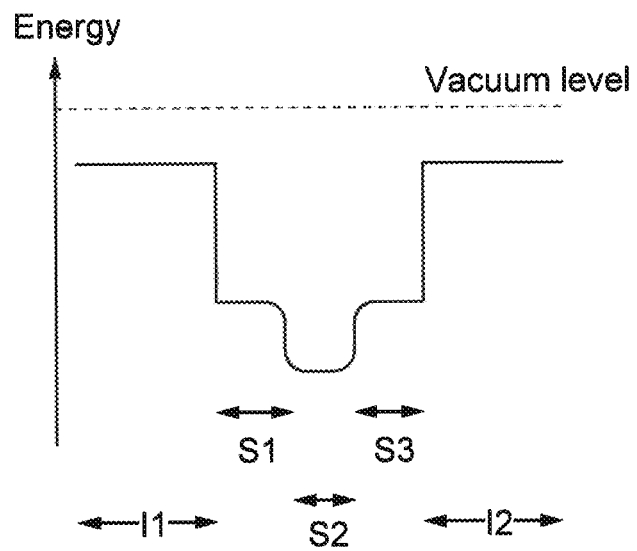
FIGS. 38A and 38B are each a band diagram of a stacked structure of an oxide semiconductor.
Figure 38B:
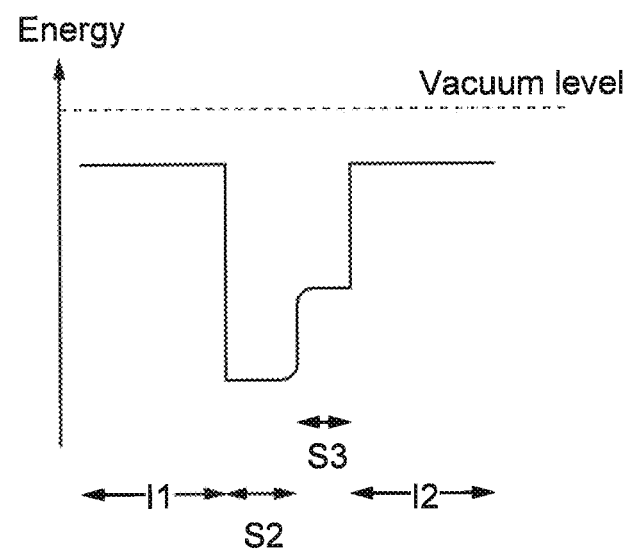

FIG. 38A is an example of a band diagram of a stacked structure of an insulator I1, the oxide semiconductor S1, the oxide semiconductor S2, the oxide semiconductor S3, and an insulator I2 in a film thickness direction. FIG. 38B is an example of a band diagram of a stacked structure of the insulator I1, the oxide semiconductor S2, the oxide semiconductor S3, and the insulator I2 in a film thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductors S1 and S3 is closer to the vacuum level than that of the oxide semiconductor S2. Typically, a difference in energy level between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, the electron affinity of the oxide semiconductor S2 is higher than the electron affinity of each of the oxide semiconductors S1 and S3, and the difference between the electron affinity of each of the oxide semiconductors S1 and S3 and the electron affinity of the oxide semiconductor S2 is greater than or equal to 0.15 eV or greater than or equal to 0.5 eV, and less than or equal to 2 eV or less than or equal to 1 eV, preferably.

As illustrated in FIGS. 38A and 38B, the conduction band minimum of each of the oxide semiconductors S1 to S3 is gradually varied. In other words, the energy level of the conduction band minimum is continuously varied or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 36C can be used as the oxide semiconductors S1 and S3.

In the case where an oxide semiconductor with the atomic ratio represented by the region A is used as the oxide semiconductor S2, it is particularly preferable to use an oxide semiconductor with an atomic ratio where [M]/[In] is greater than or equal to 1, preferably greater than or equal to 2 as each of the oxide semiconductors S1 and S3. In addition, it is suitable to use an oxide semiconductor with sufficiently high insulation performance and an atomic ratio where [M]/([Zn]+k[In]) is greater than or equal to 1 as the oxide semiconductor S3.

The structure described in this embodiment can be used in appropriate combination with the structure described in any of the other embodiments.

Embodiment 5

The structure of an oxide semiconductor that can be used for one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle formed between two straight lines is greater than or equal to 85° and less than or equal to 95°.

In this specification, trigonal and rhombohedral crystal systems are included in a hexagonal crystal system.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 39A:
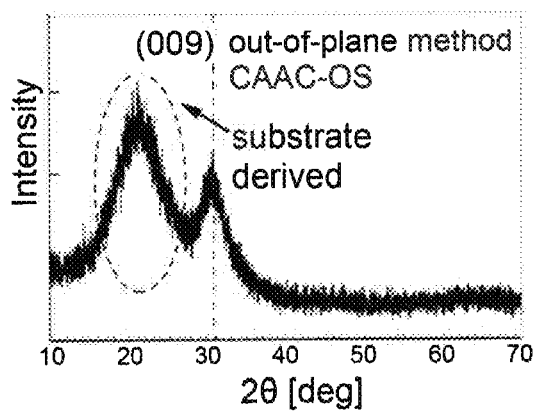
FIGS. 39A to 39E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an InGaZnO$_4$ crystal that is classified into the space group R-3m is analyzed by an out-of-plane method, a peak appears at a diffraction angle (2θ) of around 31° as illustrated in FIG. 39A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Figure 39B:
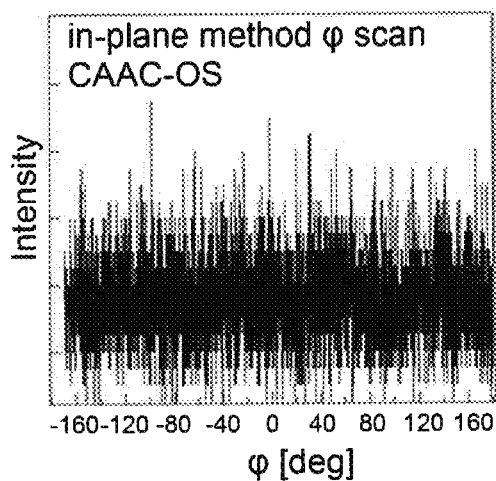
Figure 39C:
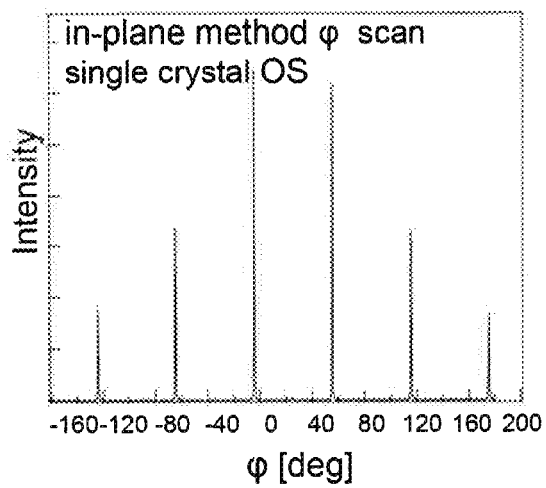

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as illustrated in FIG. 39B, a peak is not clearly observed. In contrast, in the case where single crystal InGaZnO$_4$ is subjected to φ scan with 2θ fixed at around 56°, as illustrated in FIG. 39C, six peaks which are derived from crystal planes equivalent to the (110) plane are observed. Accordingly, the structural analysis using XRD shows that the directions of a-axes and b-axes are irregularly oriented in the CAAC-OS.

Figure 39D:
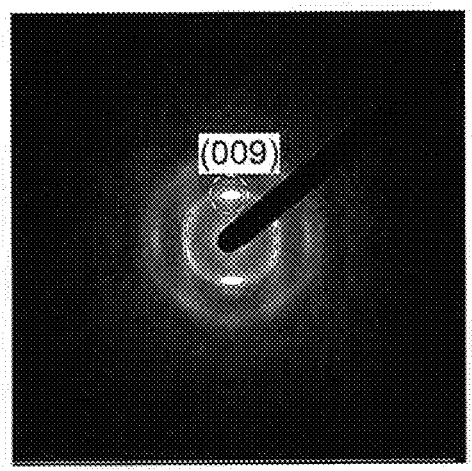
Figure 39E:
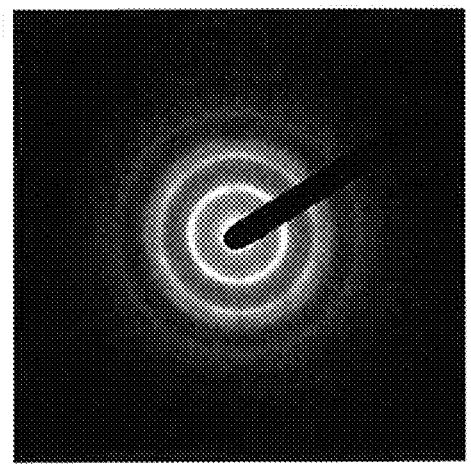

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) illustrated in FIG. 39D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 39E shows a diffraction pattern obtained in such a manner that an electron beam with a probe diameter of 300 nm is incident on the same sample in a direction perpendicular to the sample surface. As illustrated in FIG. 39E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 39E is considered to be derived from the (010) plane, the (100) plane, and the like of the InGaZnO$_4$ crystal. The second ring in FIG. 39E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 40A:
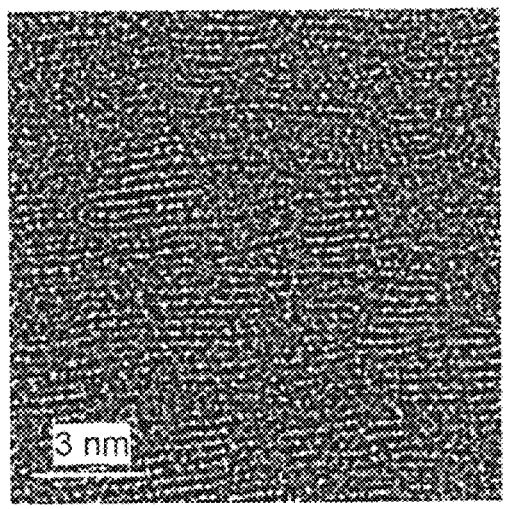
FIGS. 40A to 40E show a cross-sectional TEM image and plan-view TEM images of a CAAC-OS and images obtained through analysis thereof.

FIG. 40A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 40A shows pellets in which metal atoms are arranged in a layered manner. FIG. 40A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 40B:
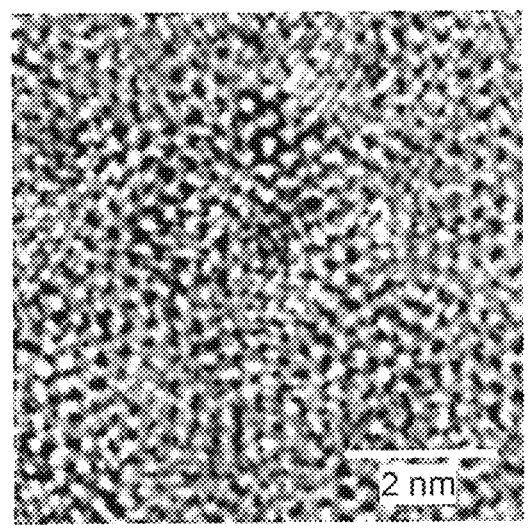
Figure 40C:
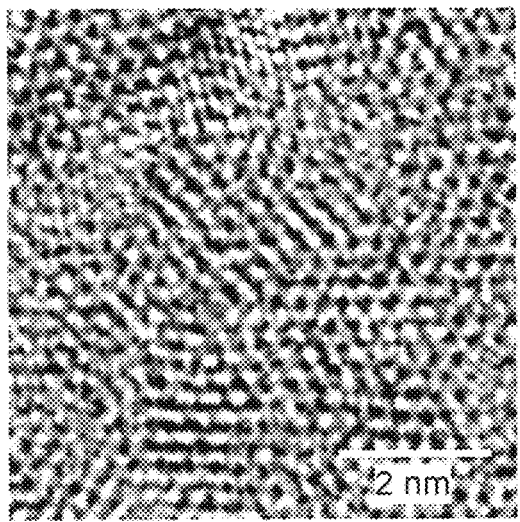
Figure 40D:
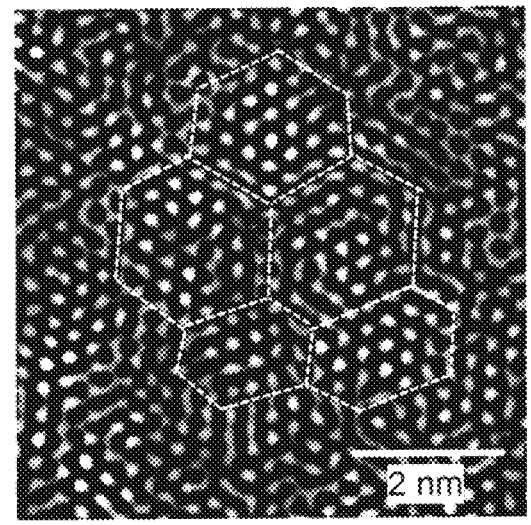
Figure 40E:
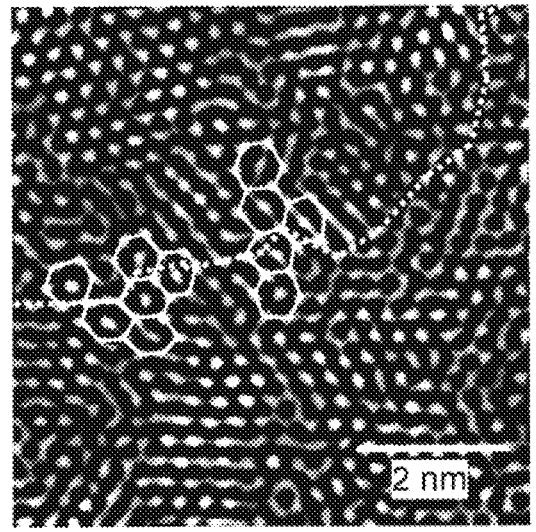

FIGS. 40B and 40C show Cs-corrected high-resolution TEM images of a plane of the CAAC-OS observed from a direction substantially perpendicular to the sample surface. FIGS. 40D and 40E are images obtained through image processing of FIGS. 40B and 40C.

The method of image processing is as follows. The image in FIG. 40B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 40D, a portion where a lattice arrangement is broken is shown by a dashed lines. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 40E, a dotted line denotes a boundary between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 41A:
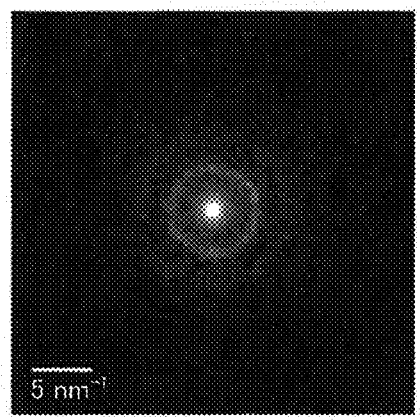
FIGS. 41A to 41D show electron diffraction patterns and a cross-sectional TEM image of an nc-OS.
Figure 41B:
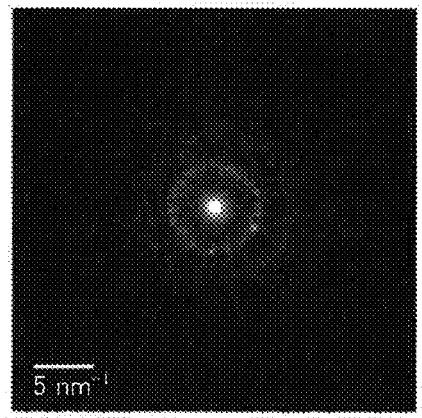

For example, when an electron beam with a probe diameter of 50 nm is incident on a 34-nm-thick region of a thinned nc-OS including an $InGaZnO_4$ crystal in a direction parallel to the formation surface, a ring-shaped diffraction pattern (nanobeam electron diffraction pattern) illustrated in FIG. 41A is observed. FIG. 41B shows a diffraction pattern obtained when an electron beam with a probe diameter of 1 nm is incident on the same sample. As illustrated in FIG. 41B, a plurality of spots are observed in a ring-like region. In other words, ordering in an nc-OS is not observed with an electron beam with a probe diameter of 50 nm but is observed with an electron beam with a probe diameter of 1 nm.

Figure 41C:
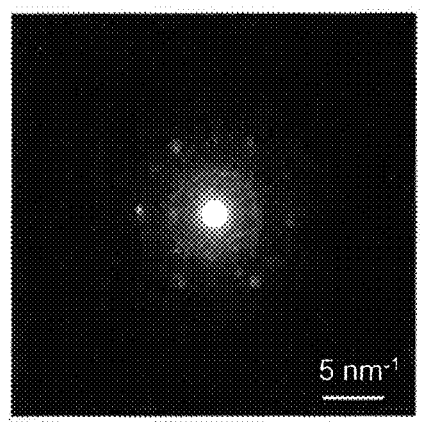

Furthermore, an electron diffraction pattern in which spots are arranged in an approximately regular hexagonal shape is observed in some cases as illustrated in FIG. 41C when an electron beam with a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 41D:
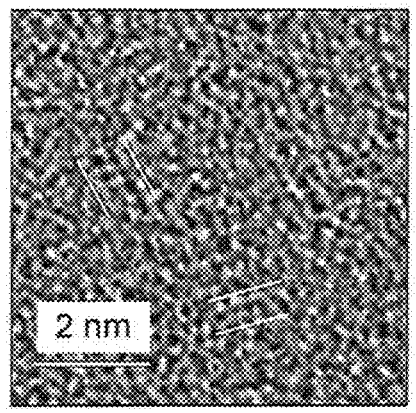

FIG. 41D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 41D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary cannot clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS is an oxide semiconductor having a structure intermediate between those of the nc-OS and the amorphous oxide semiconductor.

Figure 42A:
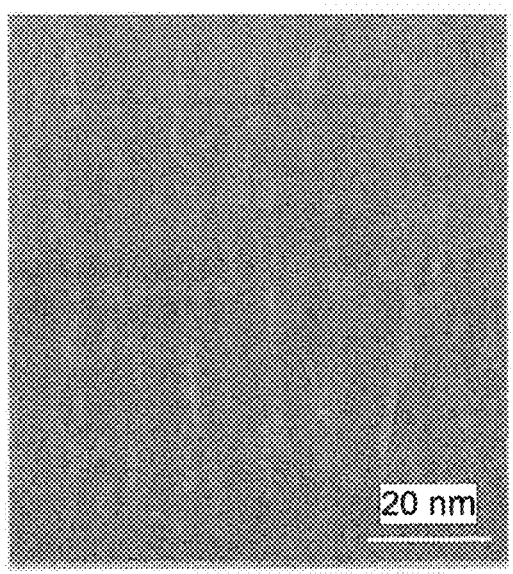
FIGS. 42A and 42B show cross-sectional TEM images of an a-like OS.
Figure 42B:
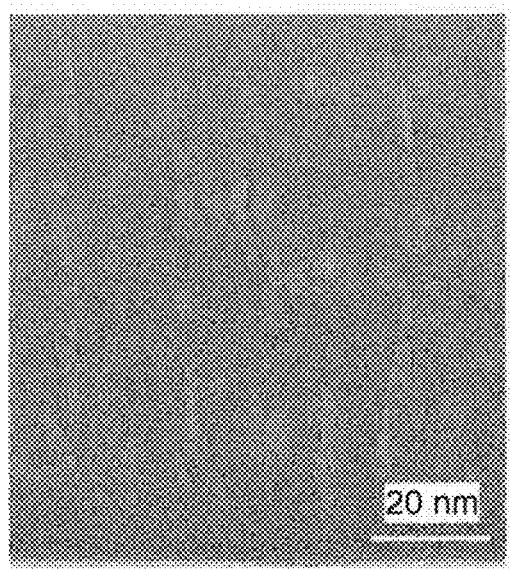

FIGS. 42A and 42B are high-resolution cross-sectional TEM images of an a-like OS. FIG. 42A is the high-resolution cross-sectional TEM image of the a-like OS at the start of electron irradiation. FIG. 42B is the high-resolution cross-sectional TEM image of a-like OS after electron ($e^-$) irradiation at $4.3 \times 10^8$ $e^-/nm^2$. FIGS. 42A and 42B show that stripe-like bright regions extending vertically are observed in the a-like OS from the start of electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The spacing between these adjacent layers is equivalent to the lattice spacing on the (009) plane (also referred to as d value). The value is calculated to 0.29 nm from crystal structure analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 43:
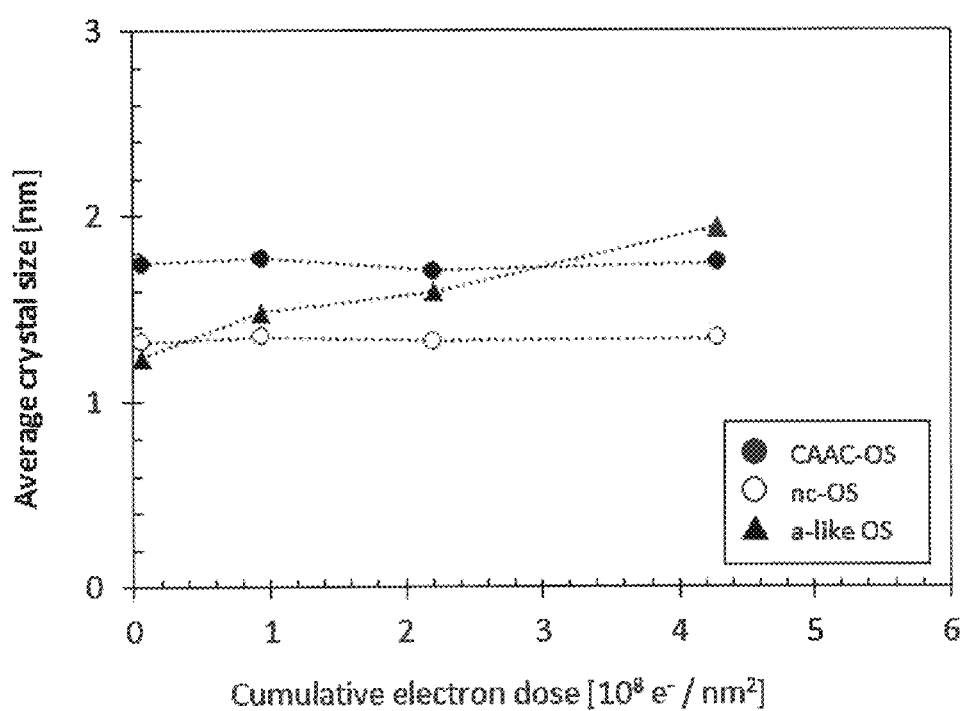
FIG. 43 shows changes in crystal parts of In—Ga—Zn oxides induced by electron irradiation.

FIG. 43 shows a change in the average size of crystal parts (at 22 to 30 points) in each sample. Note that the crystal part size corresponds to the length of a lattice fringe. FIG. 42 indicates that the crystal part size in the a-like OS increases with an increase in the cumulative electron dose in obtaining TEM images, for example. As illustrated in FIG. 42, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As illustrated in FIG. 42, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of the irradiation region was 230 nm.

In this manner, growth of the crystal part in the a-like OS is induced by electron irradiation in some cases. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy ($V_O$) and impurities in the oxide semiconductor.

As the amount of oxygen vacancy in the oxide semiconductor increases, the density of defect states increases when hydrogen is bonded to the oxygen vacancy (this state is also referred to as $V_OH$). The density of defect states also increases with an increase in the amount of impurity in the oxide semiconductor. Hence, the carrier density of an oxide semiconductor can be controlled by controlling the density of defect states in the oxide semiconductor.

Here, a transistor using the oxide semiconductor in a channel region will be considered.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^{-3}$, and further preferably lower than $1 \times 10^{10}$ cm$^{-3}$, and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^{5}$ cm$^{-3}$ and lower than $1 \times 10^{18}$ cm$^{-3}$, further preferably higher than or equal to $1 \times 10^{7}$ cm$^{-3}$ and lower than or equal to $1 \times 10^{17}$ cm$^{-3}$, still further preferably higher than or equal to $1 \times 10^{9}$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

The structure described in this embodiment can be used in appropriate combination with the structure described in any of the other embodiments.

Embodiment 6

In this embodiment, examples of a package and a camera module each including an image sensor chip are described. For the image sensor chip, the structure of an imaging device of one embodiment of the present invention can be used.

Figure 44A:
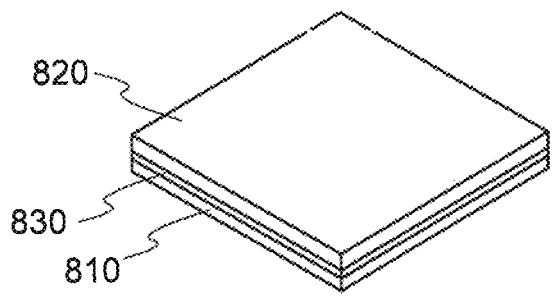
FIGS. 44A to 44D are perspective views and a cross-sectional view illustrating a package including an imaging device.

FIG. 44A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 44B:
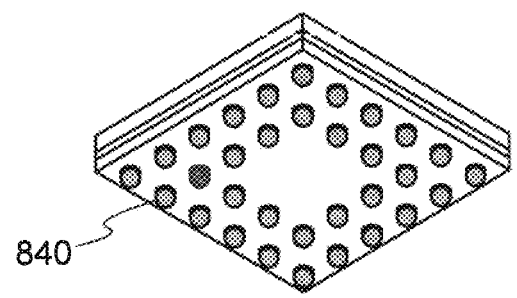

FIG. 44B is an external perspective view showing the bottom surface side of the package. On the bottom surface of the package, a ball grid array (BGA) including solder balls as bumps 840 is formed. Although the BGA is employed here, a land grid array (LGA), a pin grid array (PGA), or the like may be alternatively employed.

Figure 44C:
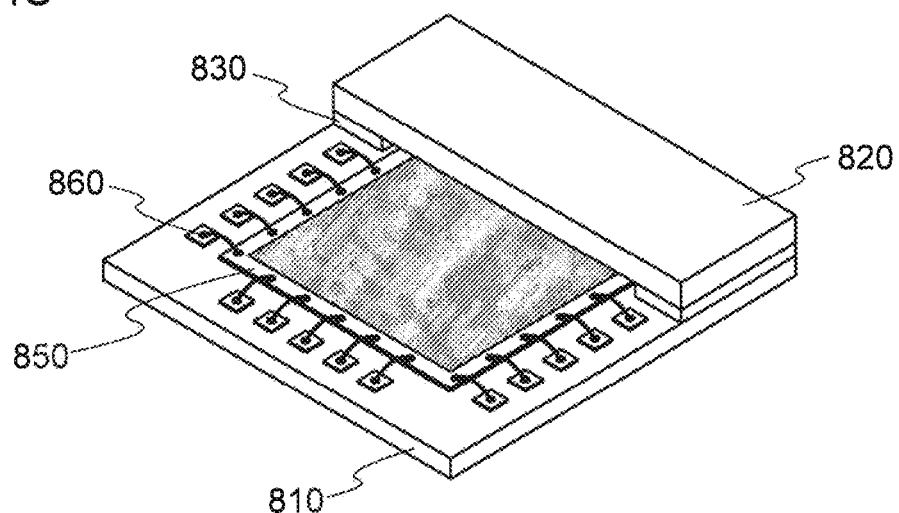
Figure 44D:
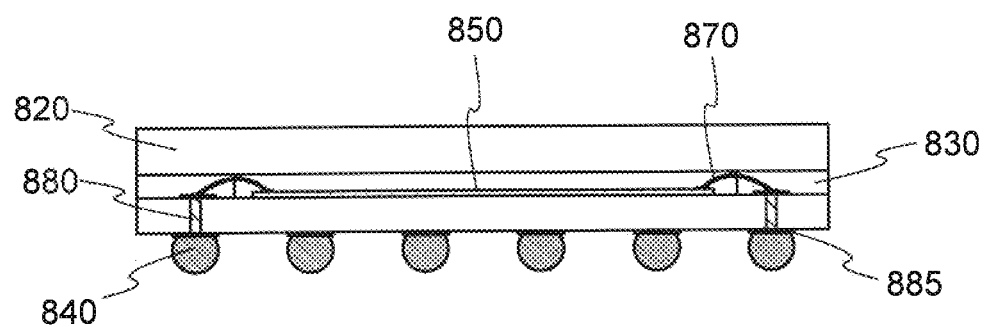

FIG. 44C is a perspective view of the package, in which the cover glass 820 and the adhesive 830 are partly illustrated. FIG. 44D is a cross-sectional view of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

Figure 45A:
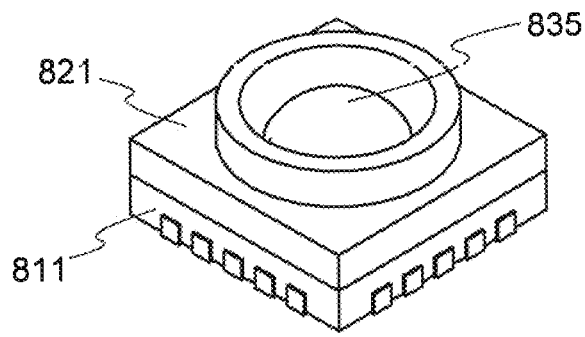
FIGS. 45A to 45D are perspective views and a cross-sectional view illustrating a package including an imaging device.

FIG. 45A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

Figure 45B:
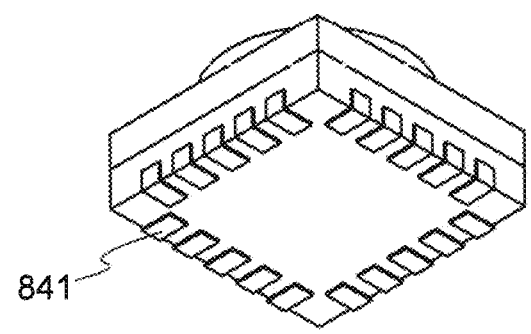

FIG. 45B is an external perspective view showing the bottom surface side of the camera module. On the bottom surface and four side surfaces of the package substrate 811, mounting lands 841 are provided; this structure can be called a quad flat no-lead package (QFN). Although QFN is employed here, a quad flat package (QFP), the above BGA, or the like may be alternatively employed.

Figure 45C:
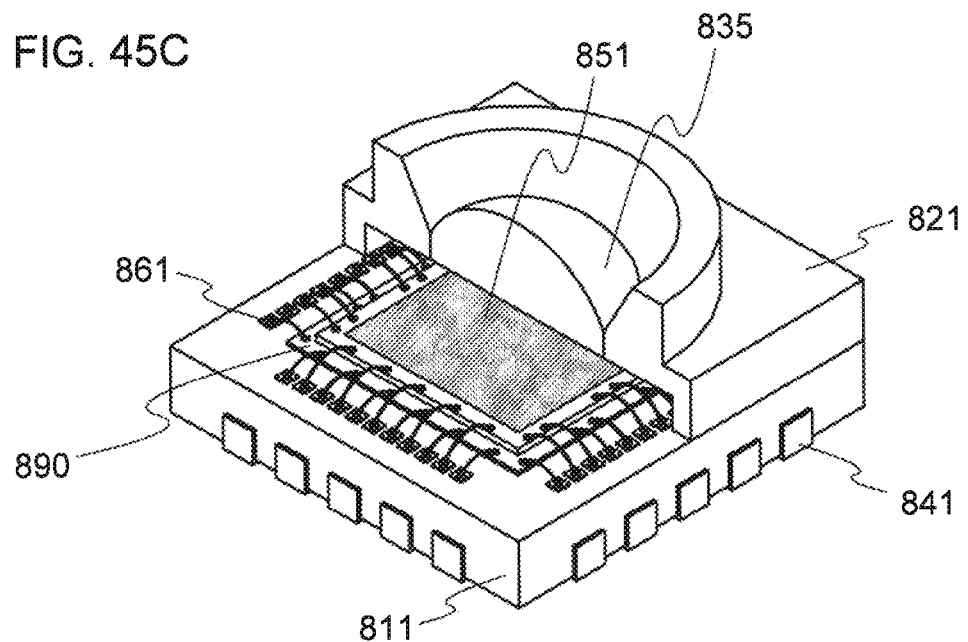
Figure 45D:
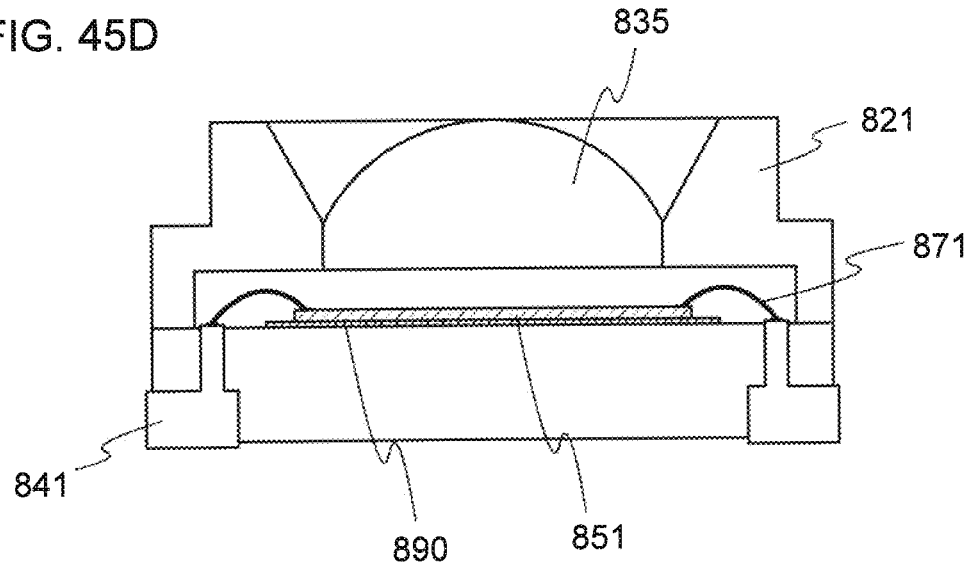

FIG. 45C is a perspective view of the module, in which the lens cover 821 and the lens 835 are partly illustrated. FIG. 45D is a cross-sectional view of the camera module. The lands 841 are partly used as electrode pads 861. The electrode pads 861 are electrically connected to electrodes of the image sensor chip 851 and the IC chip 890 through wires 871.

The image sensor chip can be easily mounted on the package having the above structure, and can be incorporated into a variety of semiconductor devices and electronic devices.

The structures described in this embodiment can be used in appropriate combination with any of the structures described in the other embodiments.

Embodiment 7

Examples of an electronic device that can use the imaging device according to one embodiment of the present invention, a display device, and a semiconductor device including both of them include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 46A to 46F illustrate specific examples of these electronic devices.

Figure 46A:
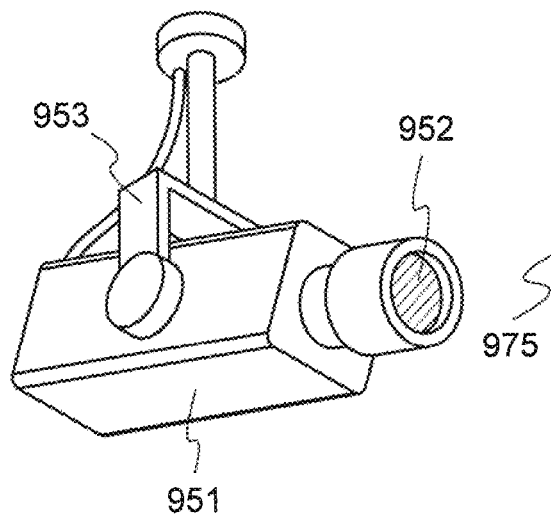
FIGS. 46A to 46F illustrate electronic devices.

FIG. 46A illustrates a monitoring camera, which includes a housing 951, a lens 952, a support portion 953, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 46B:
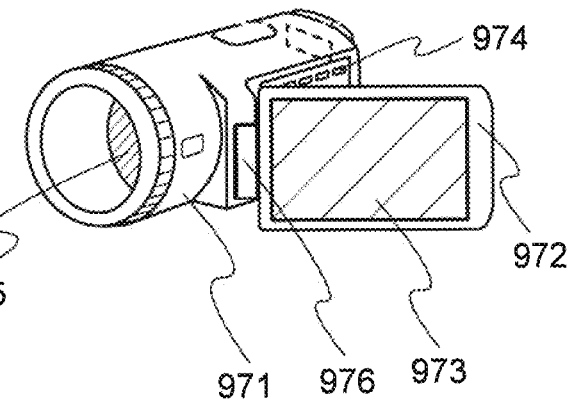

FIG. 46B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The imaging device of one embodiment of the present invention can be included as a component for obtaining an image in the video camera.

Figure 46C:
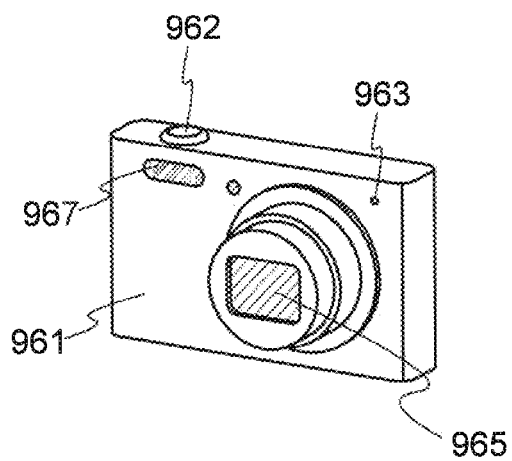

FIG. 46C illustrates a digital camera, which includes a housing 961, a shutter button 962, a microphone 963, a light-emitting portion 967, a lens 965, and the like. The imaging device of one embodiment of the present invention can be included as a component for obtaining an image in the digital camera.

Figure 46D:
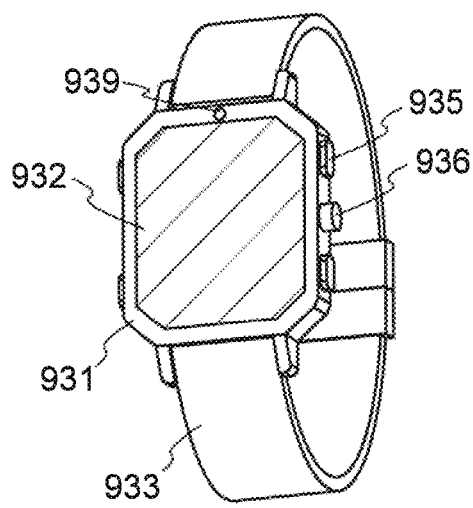

FIG. 46D illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 46E:
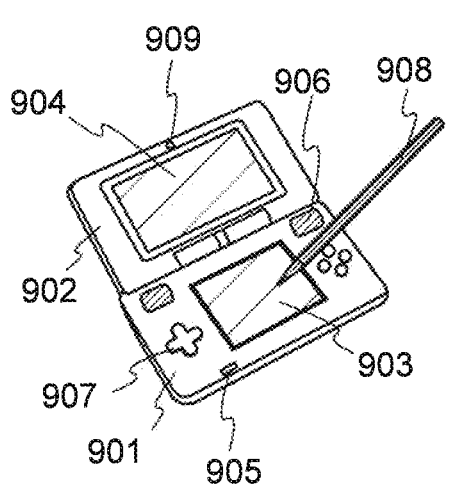

FIG. 46E illustrates a portable game machine, which includes housings 901 and 902, display portions 903 and 904, a microphone 905, speakers 906, an operation key 907, a stylus 908, a camera 909, and the like. Although the portable game machine in FIG. 46E has the two display portions 903 and 904, the number of display portions included in a portable game machine is not limited to this. The imaging device of one embodiment of the present invention can be included as one component for obtaining an image in the portable game machine.

Figure 46F:
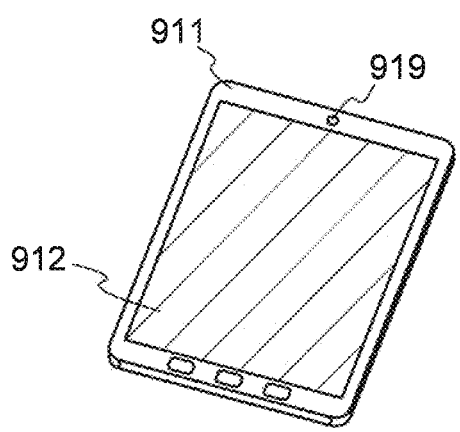

FIG. 46F illustrates a portable data terminal, which includes a housing 911, a display portion 912, a camera 919, and the like. A touch panel function of the display portion 912 enables input and output of information. The imaging device of one embodiment of the present invention can be included as one component for obtaining an image in the portable data terminal.

This embodiment can be combined with any of the other embodiments in this specification as appropriate.

This application is based on Japanese Patent Application serial No. 2015-256138 filed with Japan Patent Office on Dec. 28, 2015 and Japanese Patent Application serial No. 2016-171454 filed with Japan Patent Office on Sep. 2, 2016, the entire contents of which are hereby incorporated by reference.

What is claimed is:

1. An imaging device comprising:
a first metal part and a second metal part in contact with each other, the second metal part provided below the first metal part;
a plurality of first transistors provided over the first metal part;
a photoelectric conversion element provided over the plurality of first transistors; and
a second transistor provided below the second metal part,
wherein the photoelectric conversion element is formed in a semiconductor substrate,
wherein a p-type region of the photoelectric conversion element is electrically connected to a conductive layer below the semiconductor substrate,
wherein a light-blocking layer provided over the semiconductor substrate overlaps a region where the p-type region is in electrical contact with the conductive layer,
wherein one of the plurality of first transistors shares a source or drain region of another of the plurality of first transistors,
wherein the source or drain region overlaps a joint region between the first metal part and the second metal part,
wherein the source or drain region serves as a floating diffusion (FD) node,
wherein a gate of at least one of the plurality of first transistors is electrically connected to a first wiring,
wherein an anode of the photoelectric conversion element is provided to face a light-receiving surface, and includes a depressed area, and
wherein the anode of the photoelectric conversion element is electrically connected to a second wiring provided on a same layer as the first wiring through the depressed area.

2. The imaging device according to claim 1, wherein current characteristics of the second transistor is different from current characteristics of the plurality of first transistors.

3. The imaging device according to claim 1, wherein the first metal part is a same metal element as the second metal part.

4. The imaging device according to claim 1, wherein an off-state current per channel width of the plurality of first transistors is lower than an off-state current per channel width of the second transistor.

5. An imaging device comprising:
a first metal part and a second metal part in contact with each other, the second metal part provided below the first metal part;
a plurality of first transistors provided over the first metal part;
a photoelectric conversion element provided over the first metal part; and
a second transistor provided below the second metal part,
wherein the photoelectric conversion element is formed in a semiconductor substrate,
wherein a p-type region of the photoelectric conversion element is electrically connected to a conductive layer below the semiconductor substrate,
wherein a light-blocking layer provided over the semiconductor substrate overlaps a region where the p-type region is in electrical contact with the conductive layer,
wherein one of the plurality of first transistors shares a source or drain region of another of the plurality of first transistors,
wherein the source or drain region overlaps a joint region between the first metal part and the second metal part,
wherein the source or drain region serves as a floating diffusion (FD) node,
wherein a gate of at least one of the plurality of first transistors is electrically connected to a first wiring,
wherein an anode of the photoelectric conversion element is provided to face a light-receiving surface, and includes a depressed area, and
wherein the anode of the photoelectric conversion element is electrically connected to a second wiring provided on a same layer as the first wiring through the depressed area.

6. The imaging device according to claim 5, wherein current characteristics of the second transistor is different from current characteristics of the plurality of first transistors.

7. The imaging device according to claim 5, wherein the first metal part is a same metal element as the second metal part.

8. The imaging device according to claim 5, wherein an off-state current per channel width of the plurality of first transistors is lower than an off-state current per channel width of the second transistor.

* * * * *